(12) United States Patent
Shionoiri

(10) Patent No.: US 10,186,311 B2
(45) Date of Patent: Jan. 22, 2019

(54) SEMICONDUCTOR DEVICE OR ELECTRONIC COMPONENT INCLUDING THE SAME

(71) Applicant: Semiconductor Energy Laboratory Co., Ltd., Atsugi-shi, Kanagawa-ken (JP)

(72) Inventor: Yutaka Shionoiri, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 247 days.

(21) Appl. No.: 15/145,989

(22) Filed: May 4, 2016

(65) Prior Publication Data

US 2016/0329336 A1 Nov. 10, 2016

(30) Foreign Application Priority Data

May 7, 2015 (JP) ................................. 2015-094637

(51) Int. Cl.
*H01L 27/00* (2006.01)
*G11C 11/4093* (2006.01)
(Continued)

(52) U.S. Cl.
CPC .......... *G11C 11/4093* (2013.01); *G11C 5/025* (2013.01); *G11C 11/4094* (2013.01);
(Continued)

(58) Field of Classification Search
CPC . G11C 11/4093; G11C 5/025; G11C 11/4094; G11C 11/4096; G11C 11/4097;
(Continued)

(56) References Cited

U.S. PATENT DOCUMENTS 5,856,938 A * 1/1999 Kasai ................... G11C 11/565
257/E27.084
7,605,410 B2 * 10/2009 Takano ................. B82Y 10/00
257/213

(Continued)

FOREIGN PATENT DOCUMENTS

| JP | 09-282891 A | 10/1997 |
| JP | 2013-008431 A | 1/2013 |
| JP | 2013-008936 A | 1/2013 |

OTHER PUBLICATIONS

Tatsunori Murotani et al.; "TP 4.6: A 4-Level Storage 4Gb DRAM"; ISSCC 97 (Digest of Technical Papers. IEEE International Solid-State Circuits Conference; pp. 74-75; Feb. 6, 1997.

*Primary Examiner* — Mounir Amer
*Assistant Examiner* — Alexander Belousov
(74) *Attorney, Agent, or Firm* — Fish & Richardson P.C.

(57) ABSTRACT

A semiconductor device includes a memory cell, a buffer circuit, a switch, first to p-th switch circuits, and first to p-th capacitors (p is an integer of 2 or more). The first to p-th switch circuits each include first to third terminals. The memory cell is electrically connected to a first electrode of the first capacitor and an input terminal of the buffer circuit through the switch. A second electrode of an i-th capacitor is electrically connected to a first terminal of an i-th switch circuit and a first electrode of an (i+1)th capacitor (i is an integer of 1 to (p−1)). A second electrode of the p-th capacitor is electrically connected to a first terminal of the p-th switch circuit. An output terminal of the buffer circuit is electrically connected to a second terminal of each of the first to p-th switch circuits. A third terminal of each of the first to p-th switch circuits is electrically connected to a wiring supplying a low-level potential.

20 Claims, 31 Drawing Sheets

(51) Int. Cl.
    *H01L 27/108*     (2006.01)
    *G11C 11/4096*     (2006.01)
    *G11C 5/02*     (2006.01)
    *G11C 11/4094*     (2006.01)
    *G11C 11/4097*     (2006.01)
    *G11C 11/56*     (2006.01)
    *H01L 29/66*     (2006.01)

(52) U.S. Cl.
    CPC ...... *G11C 11/4096* (2013.01); *G11C 11/4097* (2013.01); *G11C 11/565* (2013.01); *H01L 27/10814* (2013.01); *H01L 27/10897* (2013.01); *H01L 29/66742* (2013.01)

(58) Field of Classification Search
    CPC ............. G11C 11/565; H01L 27/10814; H01L 27/10897; H01L 29/66742
    See application file for complete search history.

(56) References Cited

U.S. PATENT DOCUMENTS

| | | | |
|---|---|---|---|
| 8,531,870 B2 * | 9/2013 | Koyama | G11C 11/405 365/104 |
| 8,642,987 B2 | 2/2014 | Takano et al. | |
| 8,654,567 B2 * | 2/2014 | Saito | G11C 11/404 365/149 |
| 8,923,036 B2 | 12/2014 | Saito | |
| 8,976,571 B2 * | 3/2015 | Kamata | G11C 11/4076 365/149 |
| 9,147,684 B2 | 9/2015 | Saito | |
| 2005/0047266 A1 * | 3/2005 | Shionoiri | G11C 7/1078 365/104 |
| 2012/0281469 A1 * | 11/2012 | Tomatsu | H01L 27/1156 365/182 |
| 2012/0292613 A1 * | 11/2012 | Shionoiri | H01L 21/84 257/43 |
| 2015/0294693 A1 * | 10/2015 | Onuki | G11C 5/025 365/51 |
| 2015/0364607 A1 | 12/2015 | Saito | |
| 2016/0329336 A1 * | 11/2016 | Shionoiri | G11C 5/025 |
| 2016/0336057 A1 * | 11/2016 | Onuki | G11C 11/409 |
| 2016/0351243 A1 * | 12/2016 | Ishizu | H01L 27/1255 |
| 2017/0186473 A1 * | 6/2017 | Ikeda | G11C 11/4074 |
| 2017/0302271 A1 * | 10/2017 | Kato | G11C 7/06 |
| 2018/0005668 A1 * | 1/2018 | Shionoiri | G11O 5/06 |

\* cited by examiner

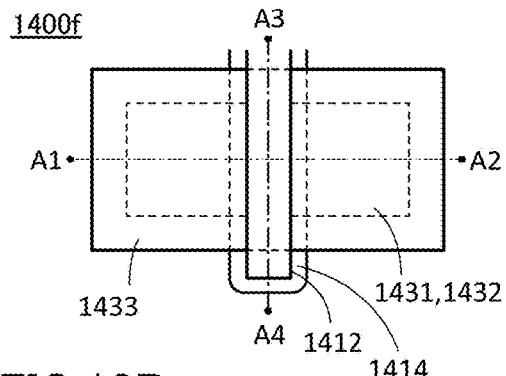
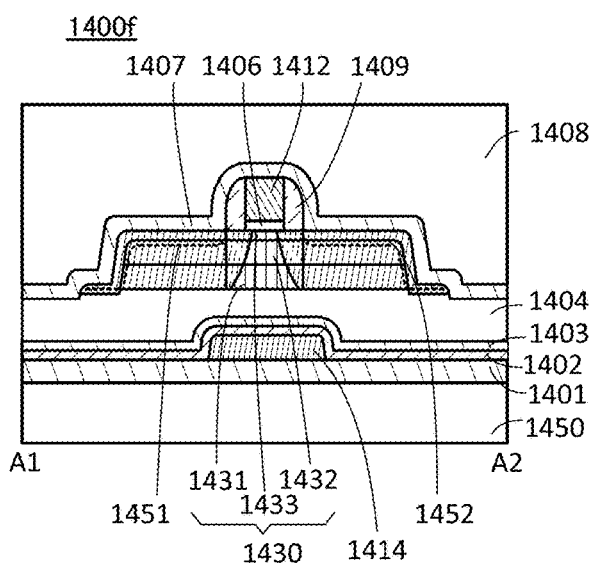
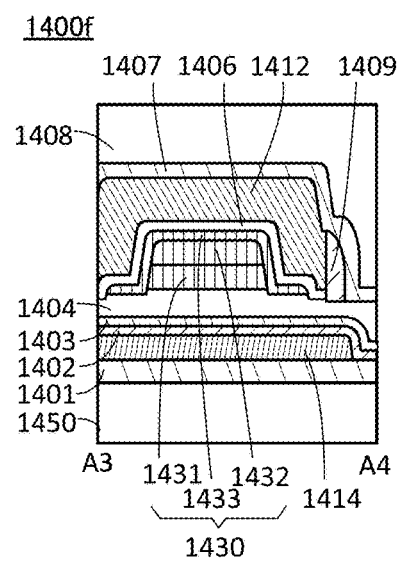
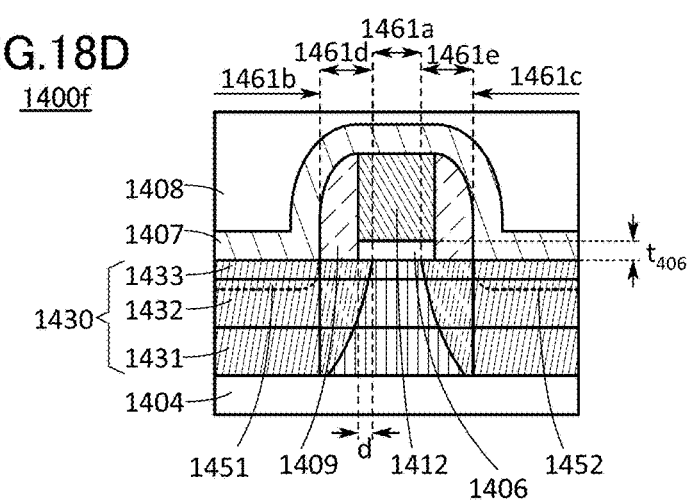

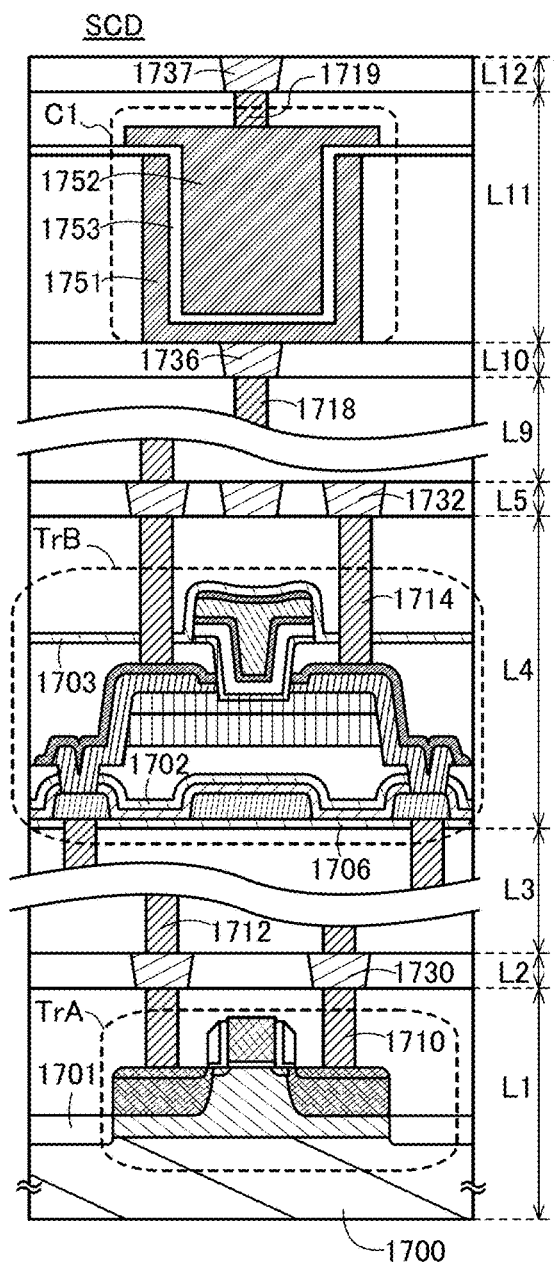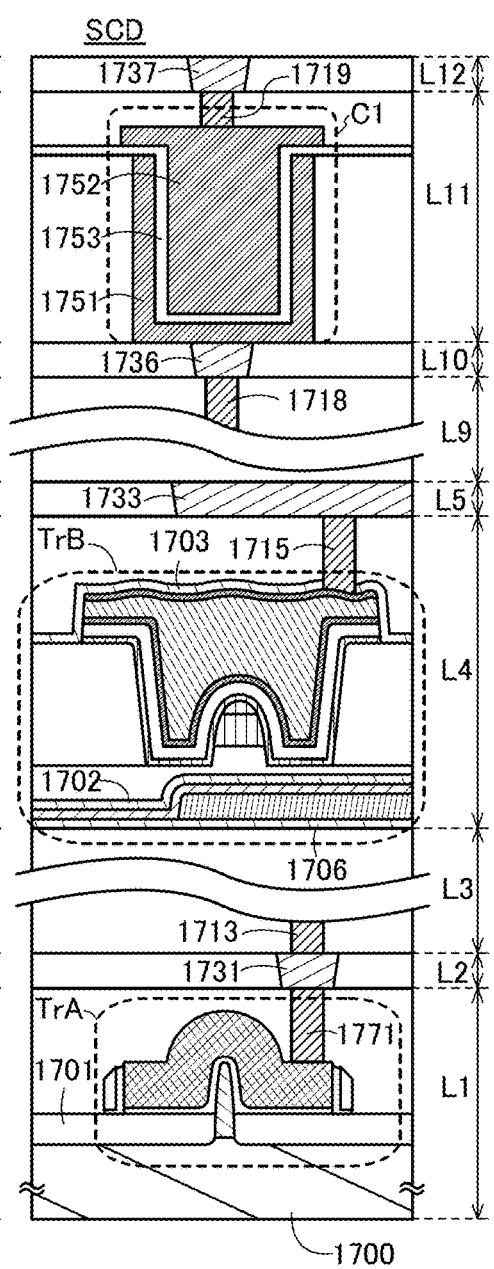

SEMICONDUCTOR DEVICE OR ELECTRONIC COMPONENT INCLUDING THE SAME

BACKGROUND OF THE INVENTION

1. Field of the Invention

One embodiment of the present invention relates to a semiconductor device or an electronic component including the semiconductor device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

2. Description of the Related Art

In recent years, semiconductor devices such as central processing units (CPUs), memories, and sensors have been used in various electronic devices, e.g., personal computers, smart phones, and digital cameras, and improvement thereof has been promoted for the sake of miniaturization, lower power consumption, and any other objective.

In particular, with a reduction in the size of electronic devices, semiconductor devices in the electronic devices have seen a need for miniaturization. In memory devices, for example, a memory cell employs a three-dimensional structure (stacked structure), or processes multilevel data.

REFERENCES

Patent Documents

[Patent Document 1] Japanese Published Patent Application No. 2013-8431
[Patent Document 2] Japanese Published Patent Application No. 2013-8936

Non-Patent Document

[Non-Patent Document 1] T. Murotani, I. Naritake, T. Matano, T. Ohsuki, N. Kasai, H. Koga, K. Koyama, K. Nakajima, H. Yamaguchi, H. Watanabe, and T. Okuda, "A 4-level storage 4 Gb DRAM", Digest of Technical Papers. 43rd ISSCC, pp. 74-75.

SUMMARY OF THE INVENTION

A multilevel memory cell refers to a memory cell capable of processing three- or more-level data. For example, in a memory cell capable of processing four-level data, the amount of data to be processed is twice as large as that in a two-level memory cell, reducing the effective area of the memory cell to half.

To achieve a multilevel memory device, unlike in a two-level memory device, a high-level potential, a low-level potential, and another potential need to be handled. For example, a three-level memory device needs to handle potentials of three levels: a high level, a middle level, and a low level. For another example, an eight-level memory device needs to handle a high-level potential, a low-level potential, and six other potentials between the low-level potential and the high-level potential. An increased number of potentials to be handled reduces the difference between potentials of data to be written or read. Therefore, the potential that is handled in writing and reading operations should be maintained without any change.

The potential varies with some factors: for example, a maintained potential sometimes varies because of a leakage current in a memory cell; and the parasitic capacitance of a wiring sometimes causes a potential change in data writing and reading.

A multilevel dynamic random access memory (DRAM) is considered below. As for the multilevel DRAM, a device structure (see Patent Document 1) and a driving method (see Patent Document 2) have been disclosed. In addition, a reading operation has also been reported (see Non-Patent Document 1).

In general, the reading operation of a DRAM includes the step of discharging a memory cell to read data (destructive read) and the step of charging the memory cell to refresh stored data. At this time, the capacitance (including parasitic capacitance or the like) of a wiring connected to the memory cell might cause a difference between the stored data in the reading step and that in the refreshing step. The multilevel DRAM particularly has a narrow range of potentials indicating information; a smaller difference in potentials is more likely to cause a difference between the stored data in the reading step and that in the refreshing step.

In the case where a DRAM is used as a cache memory in a system, an instruction stored in the DRAM is lost when read out. Hence, the same instruction needs to be restored in the DRAM from a lower-order memory in the case of being read again. This leads to a decrease in system speed in some cases.

An object of one embodiment of the present invention is to provide a novel semiconductor device. Another object of one embodiment of the present invention is to provide a module including the novel semiconductor device. Another object of one embodiment of the present invention is to provide an electronic device using the module including the novel semiconductor device. Another object of one embodiment of the present invention is to provide a novel memory device, a novel module, a novel electronic device, a novel system, and the like.

An object of one embodiment of the present invention is to provide a miniaturized semiconductor device, or an electronic component including the semiconductor device. Another object of one embodiment of the present invention is to provide a semiconductor device capable of maintaining stored data without any change, or an electronic component including the semiconductor device. Another object of one embodiment of the present invention is to provide a semiconductor device with low power consumption, or an electronic component including the semiconductor device.

Note that the objects of one embodiment of the present invention are not limited to those listed above. The above objects do not exclude the existence of other objects. The other objects are the ones that are not described above and will be described below. The other objects will be apparent from and can be derived from the description of the specification, the drawings, and the like by those skilled in the art. One embodiment of the present invention solves at least one of the above objects and the other objects. One embodiment of the present invention need not solve all the above objects and the other objects.

(1) One embodiment of the present invention is a semiconductor device including a memory cell, a circuit, and a first wiring. The circuit includes a buffer circuit, a first switch, first to p-th switch circuits, and first to p-th capacitors (p is an integer of 2 or more). The first to p-th switch circuits each include first to third terminals, a second switch, and a third switch. The first terminal is electrically connected to the second terminal through the second switch in each of the first to p-th switch circuits. The first terminal is electrically connected to the third terminal through the third switch in each of the first to p-th switch circuits. A first electrode of the first capacitor is electrically connected to the memory cell. An input terminal of the buffer circuit is electrically connected to the memory cell through the first switch. A second electrode of an i-th capacitor is electrically connected to the first terminal of an i-th switch circuit and a first electrode of an (i+1)th capacitor (i is an integer of 1 to (p−1)). A second electrode of the p-th capacitor is electrically connected to the first terminal of the p-th switch circuit. An output terminal of the buffer circuit is electrically connected to the second terminal of each of the first to p-th switch circuits. The third terminal of each of the first to p-th switch circuits is electrically connected to the first wiring supplying a low-level potential.

(2) Another embodiment of the present invention is the semiconductor device according to (1), in which the memory cell is above the buffer circuit and the first to third switches.

(3) Another embodiment of the present invention is the semiconductor device according to (1) or (2), in which the memory cell includes a first transistor, and a channel formation region of the first transistor includes an oxide semiconductor.

(4) Another embodiment of the present invention is the semiconductor device according to any one of (1) to (3), in which the first to third switches each include a second transistor, and a channel formation region of the second transistor includes silicon.

(5) Another embodiment of the present invention is the semiconductor device according to any one of (1) to (3), in which the first to third switches each include a second transistor, and a channel formation region of the second transistor includes an oxide semiconductor.

(6) Another embodiment of the present invention is the semiconductor device according to (1) or (2), in which the memory cell includes a first transistor, the first to third switches each include a second transistor, and a channel formation region of each of the first and second transistors includes silicon.

(7) Another embodiment of the present invention is the semiconductor device according to any one of (1) to (6), in which the circuit includes a (p+1)th capacitor, and the input terminal of the buffer circuit is electrically connected to a first electrode of the (p+1)th capacitor.

(8) Another embodiment of the present invention is the semiconductor device according to (7), wherein the (p+1)th capacitor is above the first to third switches.

(9) Another embodiment of the present invention is the semiconductor device according to any one of (1) to (8), in which the memory cell includes a storage capacitor, and the first to p-th capacitors and the storage capacitor are above the first to third switches.

(10) Another embodiment of the present invention is an electronic component including the semiconductor device according to any one of (1) to (9) and a processor core.

According to one embodiment of the present invention, a novel semiconductor device can be provided. According to another embodiment of the present invention, a module including the novel semiconductor device can be provided. According to another embodiment of the present invention, an electronic device using the module including the novel semiconductor device can be provided. According to another embodiment of the present invention, a novel memory device, a novel module, a novel electronic device, a novel system, and the like can be provided.

According to one embodiment of the present invention, a miniaturized semiconductor device, or an electronic component including the semiconductor device can be provided. According to another embodiment of the present invention, a semiconductor device capable of maintaining stored data without any change, or an electronic component including the semiconductor device can be provided. According to another embodiment of the present invention, a semiconductor device with low power consumption, or an electronic component including the semiconductor device can be provided.

Note that the effects of one embodiment of the present invention are not limited to those listed above. The above effects do not exclude the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Hence, one embodiment of the present invention does not have the above effects in some cases.

BRIEF DESCRIPTION OF THE DRAWINGS

In the accompanying drawings:

FIGS. 18A to 18D are a top view and cross-sectional views showing a structure example of a transistor;

FIGS. 21A and 21B are cross-sectional views showing a structure example of a memory cell;

DETAILED DESCRIPTION OF THE INVENTION

In this specification, an oxide semiconductor is referred to as an OS in some cases. Thus, a transistor including an oxide semiconductor in a channel formation region is referred to as an OS transistor in some cases.

Embodiment 1

Structure and operation examples of the disclosed invention will be described in this embodiment.
<Structure Example 1>

Figure 1:
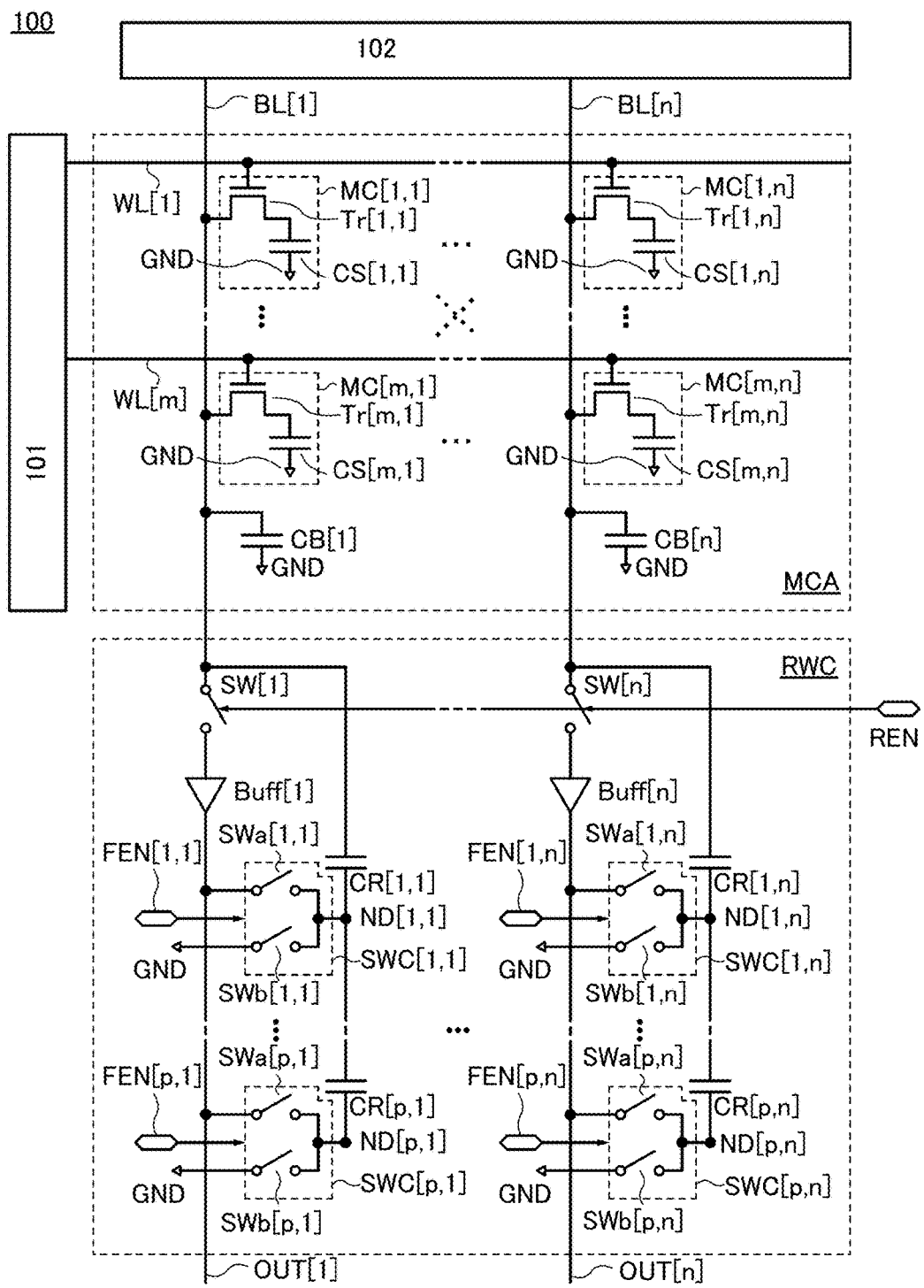
FIG. 1 is a circuit diagram showing an example of a semiconductor device.

FIG. 1 shows a structure example of a semiconductor device of one embodiment of the present invention. A semiconductor device 100 includes a memory cell array MCA, a row decoder 101 and a column decoder 102 which select a memory cell in the memory cell array MCA, wirings WL[1] to WL[m], wirings BL[1] to BL[n], wirings OUT[1] to OUT[n], and a read and write-back circuit RWC (m is an integer of 1 or more and n is an integer of 1 or more).

First, structures of the memory cell array MCA and its peripheral circuits are described.

The memory cell array MCA is electrically connected to the row decoder 101 through the wirings WL[1] to WL[m], and electrically connected to the column decoder 102 through the wirings BL[1] to BL[n].

The memory cell array MCA includes memory cells MC[1,1] to MC[m,n]. Specifically, m×n memory cells MC[i,j] are provided in a matrix of n columns and m rows (i is an integer of 1 to m and j is an integer of 1 to n). Note that in FIG. 1, the memory cell MC[1,1], the memory cell MC[m,1], the memory cell MC[1,n], and the memory cell MC[m,n] are only shown and the other memory cells are omitted.

The memory cell MC[i,j] includes a transistor Tr[i,j] and a capacitor CS[i,j]. One of a source and a drain of the transistor Tr[i,j] is electrically connected to a first terminal of the capacitor CS[i,j], the other of the source and the drain of the transistor Tr[i,j] is electrically connected to a wiring BL[j], a gate of the transistor Tr[i,j] is electrically connected to a wiring WL[i], and a second terminal of the capacitor CS[i,j] is electrically connected to a wiring GND supplying a potential $V_{GND}$. Note that in FIG. 1, a transistor Tr[1,1], a transistor Tr[m,1], a transistor Tr[1,n], a transistor Tr[m,n], a capacitor CS[1,1], a capacitor CS[m,1], a capacitor CS[1,n], and a capacitor CS[m,n] are only shown and the other transistors and capacitors are omitted.

It is assumed that parasitic capacitance exists on the wirings BL[1] to BL[n]. In FIG. 1, the whole parasitic capacitance of the wiring BL[j] is denoted as a capacitor CB[j]. That is, capacitors CB[1] to CB[n] represent the parasitic capacitances of the wirings BL[1] to BL[n], respectively. Note that in FIG. 1, a first terminal of a capacitor CB[j] is electrically connected to a wiring BL[j], and a second terminal of the capacitor CB[j] is electrically connected to the wiring GND; however, the connection structure is not limited to this in this specification. In some circuit structures, a circuit element or a wiring of the semiconductor device 100 serves as the second terminal of the capacitor CB[j].

The row decoder 101 is a circuit for supplying a low-level or high-level potential to the wirings WL[1] to WL[m] to select a row of memory cells in which data writing or reading is performed.

The column decoder 102 is a circuit for supplying analog data (potential), through the wirings BL[1] to BL[m], to a column of memory cells in which data writing is performed. Although not shown, a precharge circuit is incorporated in or connected to the column decoder 102. The precharge circuit precharges a potential to the wiring BL[j] connected to the memory cells from which data is to be read. A structure of the column decoder connected to the precharge circuit or the like will be described in Embodiment 2.

Next, a connection structure of the read and write-back circuit RWC is described.

The read and write-back circuit RWC includes switches SW[1] to SW[n], buffer circuits Buff[1] to Buff[n], capacitors CR[1,1] to CR[p,n], and switch circuits SWC[1,1] to SWC[p,n] (p is an integer of 1 or more).

A switch circuit SWC[k,j] (k is an integer of 1 to p) includes a switch SWa[k,j] and a switch SWb[k,j]. A first terminal of the switch SWa[k,j] and a first terminal of the switch SWb[k,j] are electrically connected to a first terminal of the switch circuit SWC[k,j], a second terminal of the switch SWa[k,j] is electrically connected to a second terminal of the switch circuit SWC[k,j], and a second terminal of the switch SWb[k,j] is electrically connected to a third terminal of the switch circuit SWC[k,j]. The third terminal of the switch circuit SWC[k,j] is electrically connected to the wiring GND. A node ND[k,j] is on the first terminal side of the switch circuit SWC[k,j]. Note that in FIG. 1, the switch circuit SWC[1,1], a switch circuit SWC[p,1], a switch circuit SWC[1,n], and the switch circuit SWC[p,n] are only shown and the other switch circuits are omitted. Also in FIG. 1, a switch SWa[1,1], a switch SWa[p,1], a switch SWa[1,n], a switch SWa[p,n], a switch SWb[1,1], a switch SWb[p,1], a switch SWb[1,n], and a switch SWb[p,n] are only shown and the other switches are omitted. Furthermore, a node ND[1,1], a node ND[p,1], a node ND[1,n], and a node ND[p,n] are only shown in FIG. 1 and the other nodes are omitted.

Signals FEN[1,1] to FEN[p,n] are supplied to the switch circuits SWC[1,1] to SWC[p,n], respectively. A signal FEN[k,j] controls the on/off of a switch in the switch circuit SWC[k,j]. That is, the on/off of the switch SWa[k,j] and the switch SWb[k,j] is controlled by the signal FEN[k,j].

An input terminal of a buffer circuit Buff[j] is electrically connected to the wiring BL[j] through a switch SW[j], and an output terminal of the buffer circuit Buff[j] is electrically connected to the second terminals of the switch circuits SWC[1,j] to SWC[p,j] and a wiring OUT[j].

A signal REN is supplied to the switches SW[1] to SW[n]. The signal REN controls the on/off of the switches SW[1] to SW[n].

A first terminal of a capacitor CR[1,j] is electrically connected to the wiring BL[j]. A second terminal of a capacitor CR[h,j] (h is an integer of 1 to (p−1)) is electrically connected to a first terminal of a switch circuit SWC[h,j] and a first terminal of a capacitor CR[h+1,j]. A second terminal of a capacitor CR[p,j] is electrically connected to a first terminal of a switch circuit SWC[p,j].

<Operation Example 1>

An operation example is described below.

Figure 2:
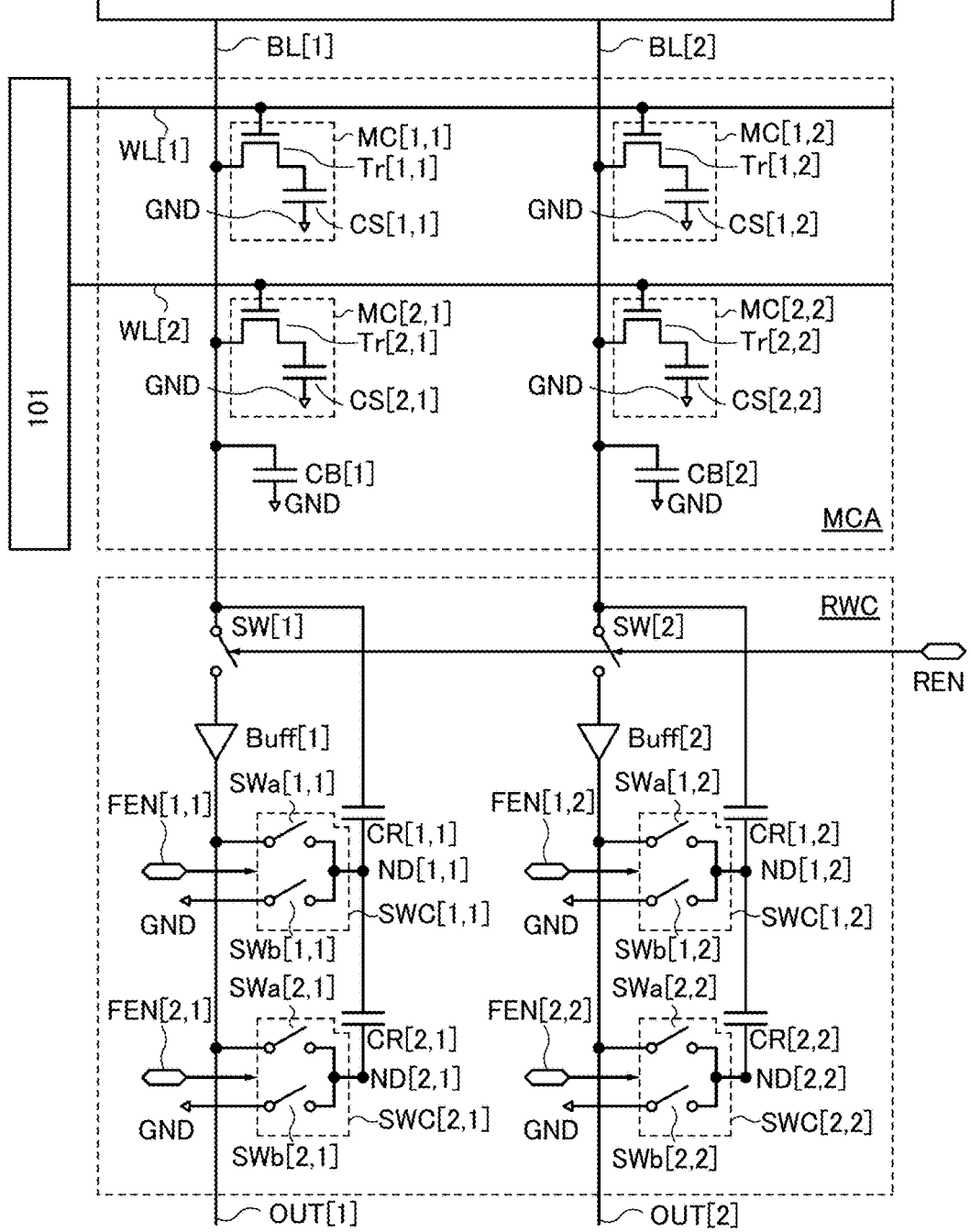
FIG. 2 is a circuit diagram showing an example of a semiconductor device.

Note that for the sake of simplicity, description is made on the operation of a semiconductor device 110 in FIG. 2, which is different from the semiconductor device 100 in FIG. 1 in that m=2, n=2, and p=2.

Figure 3A:
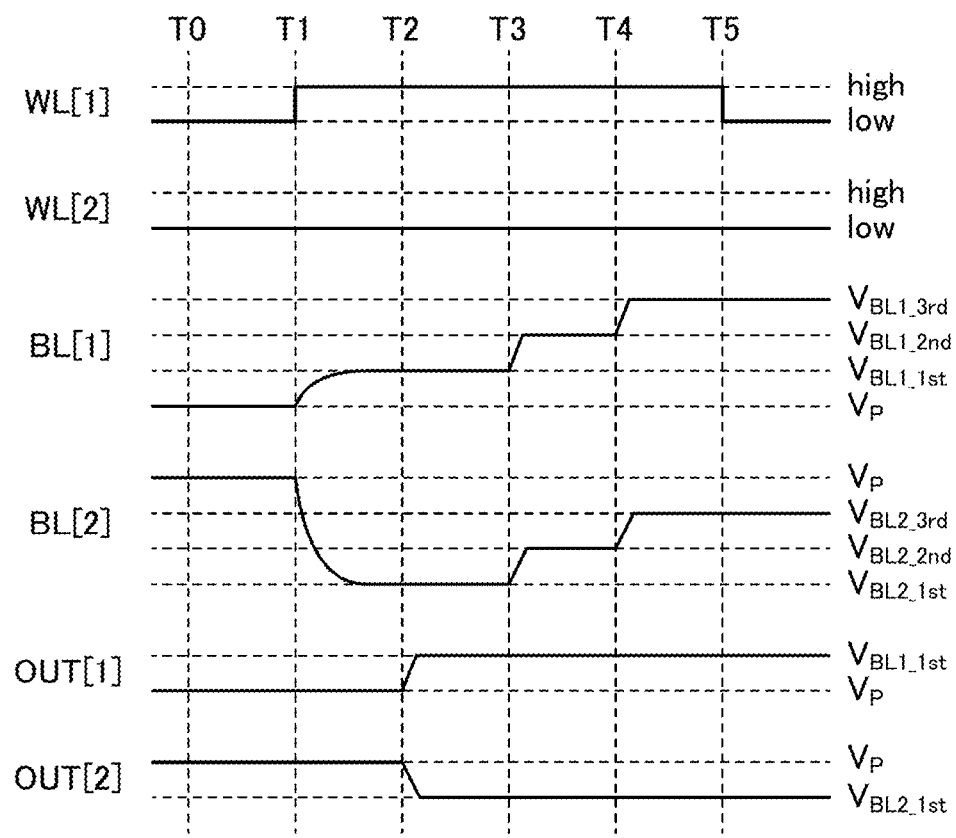
FIGS. 3A and 3B are timing charts showing operation examples of the semiconductor device in FIG. 2.

FIG. 3A is a timing chart showing an operation example of the semiconductor device 110.

A potential $V_{MC[1,1]}$ is held in the memory cell MC[1,1] in advance, and a potential $V_{MC[1,2]}=0$ is held in a memory cell MC[1,2] in advance. Data is read from and rewritten to these memory cells MC[1,1] and MC[1,2]. Note that the potential $V_{GND}$ is, for example, 0 V.

Note that in general, a potential (voltage) is a relative value and is determined by the amount relative to a certain potential. Therefore, even the expression such as "ground" or "GND" does not necessarily mean a potential of 0 V. For example, the "ground potential" or "GND" is defined using the lowest potential in a circuit as a reference in some cases, and defined using an intermediate potential in a circuit as a reference in other cases. In those cases, a positive potential and a negative potential are determined in accordance with the reference potential.

Before Time T0, the wiring BL[1] and a wiring BL[2] are precharged to a potential $V_P$. After the precharge, the wirings BL[1] and BL[2] are brought into a floating state.

At Time T0, the switch SW[1] and a switch SW[2] are off, the switch SWa[1,1], a switch SWa[2,1], a switch SWa[1,2], and a switch SWa[2,2] are off, and the switch SWb[1,1], a switch SWb[2,1], a switch SWb[1,2], and a switch SWb[2,2] are on.

In other words, the potentials of the node ND[1,1], a node ND[1,2], a node ND[2,1], and a node ND[2,2] are all $V_{GND}$.

At Time T1, a high-level potential is applied to a wiring WL[1]. Then, the transistor Tr[1,1] and a transistor Tr[1,2] are turned on, so that charge held in the memory cell MC[1,1] flows to the wiring BL[1] and charge held in the memory cell MC[1,2] flows to the wiring BL[2]. Here, the charge is distributed between the memory cell MC[1,1] and the wiring BL[1], and the charge is distributed between the memory cell MC[1,2] and the wiring BL[2].

A potential $V_{BL1\_1st}$ of the wiring BL[1] and a potential $V_{BL2\_1st}$ of the wiring BL[2] are represented by the following formulae (f1) and (f2), respectively, where $C_S$ is the capacitance of the capacitor CS[1,1] or a capacitor CS[1,2] and $C_B$ is the capacitance of the capacitor CB[1] or a capacitor CB[2].

$$V_{BL1\_1st}=(V_{MC[1,1]}\times C_S+V_P\times C_B)/(C_S+C_B) \quad (f1)$$

$$V_{BL2\_1st}=(V_P\times C_B)/(C_S+C_B) \quad (f2)$$

At Time T2, the switches SW[1] and SW[2] are turned on by the signal REN. Then, the potentials of the wiring BL[1] and the wiring BL[2] are applied to input terminals of the buffer circuit Buff[1] and the buffer circuit Buff[2], respectively. In other words, the potential $V_{BL1\_1st}$ of the formula (f1) is output to the wiring OUT[1] and the potential $V_{BL2\_1st}$ of the formula (f2) is output to a wiring OUT[2]. Consequently, the potentials held in the memory cells MC[1,1] and MC[1,2] can be read as analog data.

Then, from Time T2 to Time T3, the switches SW[1] and SW[2] are turned off by the signal REN.

At Time T3, the switches SWa[1,1], SWa[1,2], SWb[2,1], and SWb[2,2] are turned on and the switches SWa[2,1], SWa[2,2], SWb[1,1], and SWb[1,2] are turned off. Accordingly, the node ND[1,1] has the potential $V_{BL1\_1st}$ of the formula (f1) and the node ND[1,2] has the potential $V_{BL2\_1st}$ of the formula (f2).

As a result, the potential of the wiring BL[1] is increased from the potential $V_{BL1\_1st}$ of the formula (f1) to a potential $V_{BL1\_2nd}$ of the following formula (f3) by capacitive coupling through the capacitor CR[1,1]. Also, the potential of the wiring BL[2] is increased from the potential $V_{BL2\_1st}$ of the formula (f2) to a potential $V_{BL2\_2nd}$ of the following formula (f4) by capacitive coupling through the capacitor CR[1,2].

$$V_{BL1\_2nd}=2(V_{MC[1,1]}\times C_S+V_P\times C_B)/(C_S+C_B) \quad (f3)$$

$$V_{BL2\_2nd}=2(V_P\times C_B)/(C_S+C_B) \quad (f4)$$

At Time T4, the switches SWa[2,1] and SWa[2,2] are turned on and the switches SWa[1,1], SWa[1,2], SWb[1,1], SWb[1,2], SWb[2,1], and SWb[2,2] are turned off. Accordingly, the potential of the node ND[2,1] is increased to $V_{BL1\_1st}$ of the formula (f1) and the potential of the node ND[2,2] is increased to $V_{BL2\_1st}$ of the formula (f2).

Furthermore, the potential of the node ND[1,1] is increased by the potential of the formula (f1) by capacitive coupling through the capacitor CR[2,1]. Also, the potential of the node ND[1,2] is increased by the potential of the formula (f2) by capacitive coupling through the capacitor CR[2,2].

As a result, the potential of the wiring BL[1] is increased from the potential $V_{BL1\_2nd}$ of the formula (f3) to a potential $V_{BL1\_3rd}$ of the following formula (f5) by capacitive coupling through the capacitor CR[1,1]. Also, the potential of the wiring BL[2] is increased from the potential $V_{BL2\_2nd}$ of the formula (f4) to a potential $V_{BL2\_3rd}$ of the following formula (f6) by capacitive coupling through the capacitor CR[1,2].

$$V_{BL1\_3rd}=3(V_{MC[1,1]}\times C_S+V_P\times C_B)/(C_S+C_B) \quad (f5)$$

$$V_{BL2\_3rd}=3(V_P\times C_B)/(C_S+C_B) \quad (f6)$$

Here, the precharged potential $V_P$ is assumed to be 0. In the case where the potential held in the memory cell MC[1,1] is that of the formula (f5), the substitution of $V_{BL1}=V_{MC[1,1]}$ in the formula (f5) results in the following formula (f7). Also, the substitution of $V_P=0$ in the formula (f6) results in the following formula (f8). That is, the potential of the wiring BL[2] is equal to the potential $V_{MC[1,2]}=0$, which is the potential initially held in the memory cell MC[1,2].

$$C_B=2C_S \quad (f7)$$

$$V_{BL2}=0 \quad (f8)$$

Figure 3B:
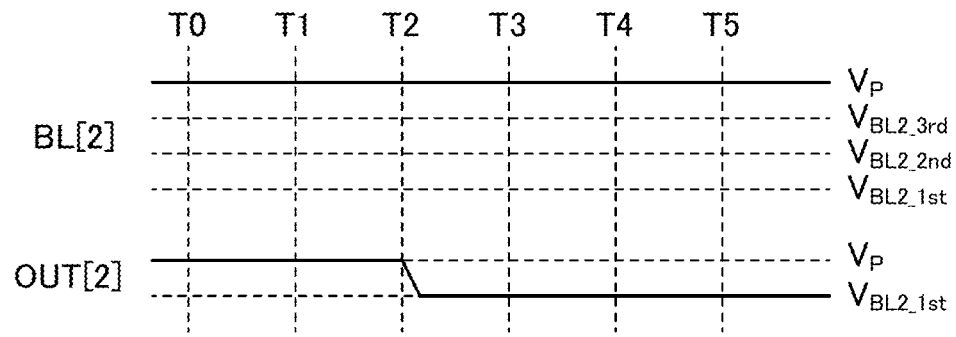

FIG. 3B is a timing chart of the wiring BL[2] and the wiring OUT[2] with $V_P=0$. As shown by the substitution of $V_P=0$ in the formulae (f2), (f4), and (f6), the potentials of the wiring BL[2] and the wiring OUT[2] are constant in the case where $V_P=0$.

In the case where the semiconductor device 110 satisfies the formula (f7), from Time T4 to Time T5, the charge held in the wiring BL[1] flows to the memory cell MC[1,1] and the charge held in the wiring BL[2] flows to the memory cell MC[1,2]. In other words, the potential $V_{MC[1,1]}=V_{BL1}$ is written to the memory cell MC[1,1] and the potential $V_P=0$ is written to the memory cell MC[1,2]. Finally, at Time T5, a low-level potential is applied to the wiring WL[1] so that the transistors Tr[1,1] and Tr[1,2] are turned off, whereby the potentials of the memory cells MC[1,1] and MC[1,2] are maintained.

In the above operation, data is rewritten in two steps from Time T1 to Time T5; thus, data identical to the analog data that has been read destructively from a memory cell can be rewritten to the memory cell.

In the case where the semiconductor device 110 does not satisfy the formula (f7), the structure of the read and write-back circuit RWC is changed to have the same effect. For example, the semiconductor device 110 does not satisfy the formula (f7) but satisfies the formula (f9) below.

$$C_B=3C_S \tag{f9}$$

In that case, to have the same effect, the switch circuit SWC, the capacitor CR, and the control signal FEN are provided on the output terminal side of the buffer circuit Buff[j] in each column in the read and write-back circuit RWC. Specifically, the structure of the semiconductor device 100 in FIG. 1 is changed to satisfy m=2, n=2, and p=3. As a result, data is rewritten in three steps, whereby a correct potential can be rewritten to a memory cell from which data has been read destructively.

That is, data is rewritten in p steps in the semiconductor device 100 satisfying the following formula (f10), so that a correct potential can be rewritten to a memory cell from which data has been read destructively.

$$C_B=pC_S \tag{f10}$$

<Structure Modification Example>

As one embodiment of the present invention, Structure example 1 and Operation example 1 have been described above. Another structure example is described below.

<<Switch>>

In Structure example 1, the switches SW[1] to SW[n], the switches SWa[1,1] to SWa[p,n], and the switches SWb[1,1] to SWb[p,n] are used. As these switches, electrical switches, mechanical switches, microelectromechanical systems (MEMS) elements, and the like can be used. For example, transistors are preferably used as the electrical switches.

<<Transistor>>

All the switches and buffer circuits constituting the read and write-back circuit RWC preferably include transistors made of the same material. The transistors preferably include, for example, silicon in channel formation regions. Further preferably, the transistors only have either p-type or n-type conductivity. The use of the same type of transistors in the read and write-back circuit RWC results in lower manufacturing costs of the semiconductor device 100.

Alternatively, the read and write-back circuit RWC may be constituted by OS transistors instead of the transistors including silicon in the channel formation regions.

In addition, all the transistors Tr[i,j] included in the memory cells MC[i,j] are preferably made of the same material. Further preferably, the transistors Tr[i,j] are, for example, OS transistors. The use of the same type of transistors in the memory cell array MCA results in lower manufacturing costs of the semiconductor device 100. Moreover, the memory cells MC[i,j] including the OS transistors, which have an extremely low off-state current, prevent data degradation due to a leakage current in the semiconductor device 100. In addition, unlike in conventional DRAMs, power supply for preventing data degradation is not necessary because of no data degradation, resulting in a reduced power consumption.

<<Stack>>

Figure 4:
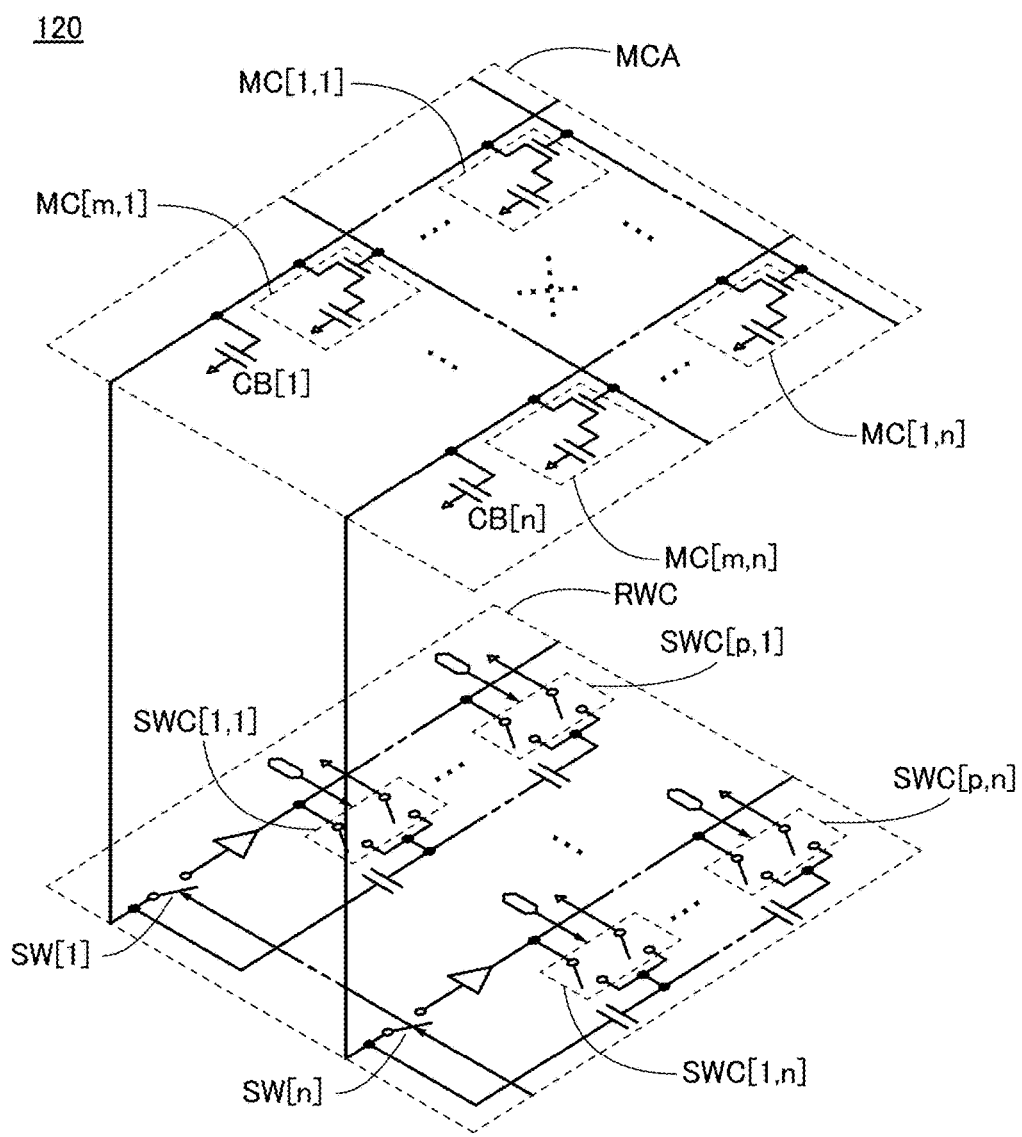
FIG. 4 is a circuit diagram schematically showing a structure example of a semiconductor device.

The semiconductor device 100 may have a stack of circuits. FIG. 4 shows the semiconductor device 100 having a stacked structure. In a semiconductor device 120, the memory cell array MCA is above the read and write-back circuit RWC.

As described above, preferably, the read and write-back circuit RWC includes transistors including silicon in channel formation regions, and the transistor Tr[i,j] in the memory cell MC[i,j] is an OS transistor. Alternatively, the read and write-back circuit RWC may include OS transistors.

Figure 5:
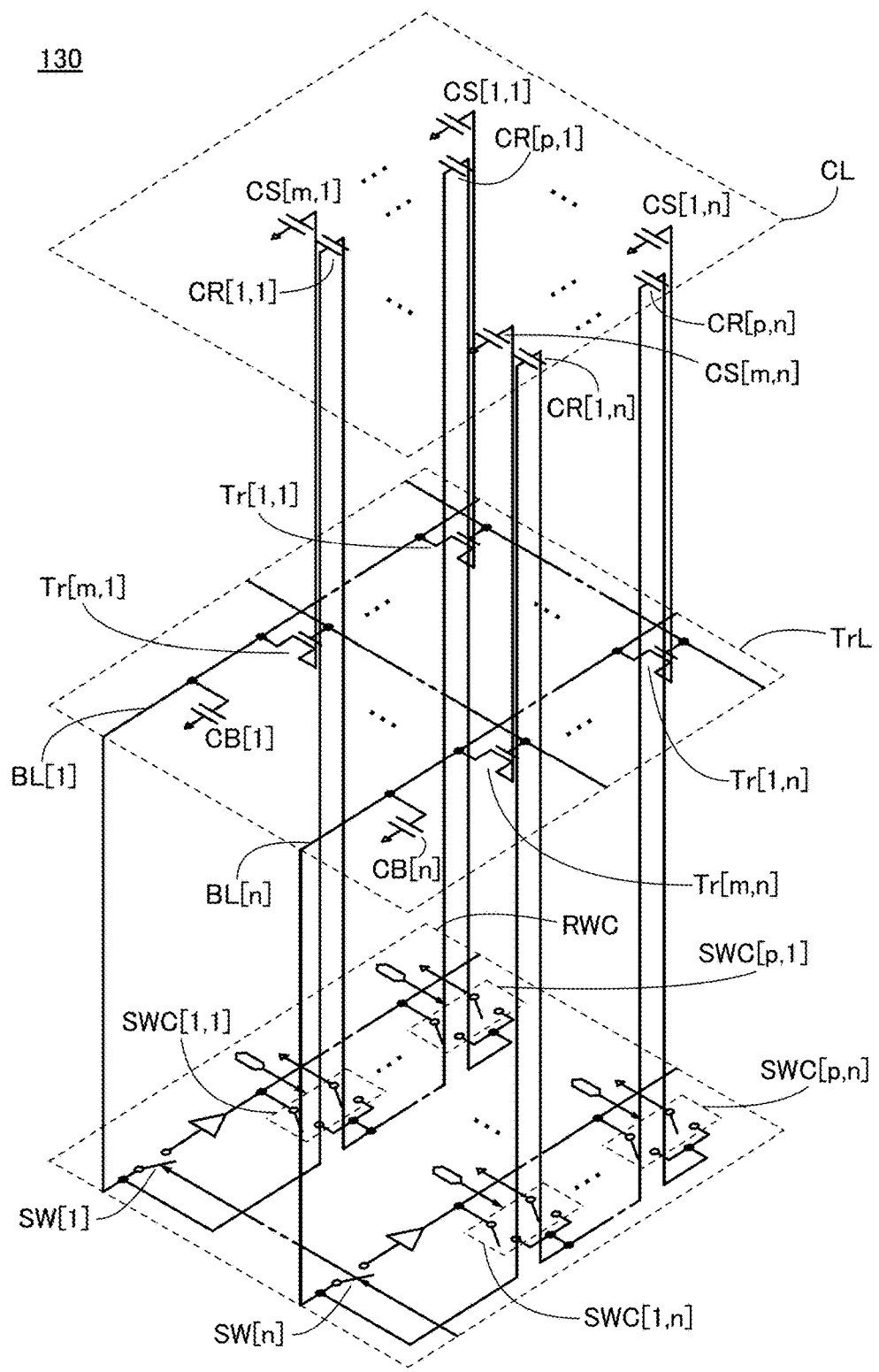
FIG. 5 is a circuit diagram schematically showing a structure example of a semiconductor device.

The semiconductor device 120 includes capacitors in both layers of the memory cell array MCA and the read and write-back circuit RWC; however, one embodiment of the present invention is not limited to this structure. For example, as shown in FIG. 5, a layer TrL and a layer CL may be provided above the read and write-back circuit RWC and all the capacitors in the semiconductor device 120 may be provided in the layer CL. A semiconductor device 130 includes the layer TrL and the layer CL. The layer TrL includes the transistors Tr[1,1] to Tr[m,n]. The layer CL includes the capacitors CS[1,1] to CS[m,n] and the capacitors CR[1,1] to CR[p,n]. Note that the capacitors CB[1] to CB[n] represent the parasitic capacitances of the wirings BL[1] to BL[n], respectively, and therefore are shown in the memory cell array MCA. As shown in FIG. 5, the layer CL is preferably above the transistors Tr[1,1] to Tr[m,n]. Such a stacked structure contributes to a reduction in the circuit area of the semiconductor device.

Figure 6:
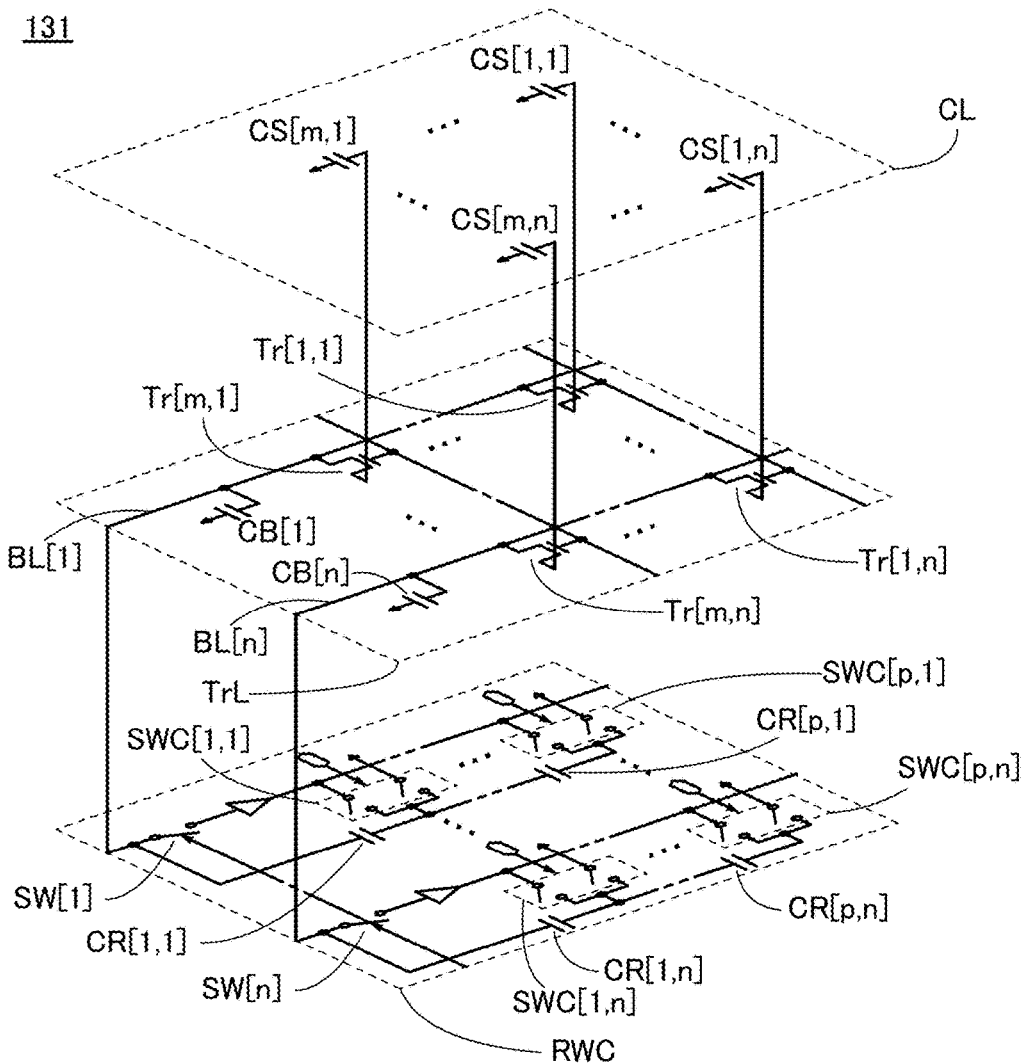
FIG. 6 is a circuit diagram schematically showing a structure example of a semiconductor device.

When there is no contact between the layer CL and the read and write-back circuit RWC, the circuit area of the semiconductor device can be further reduced. For example, as shown in FIG. 6, the layer TrL and the layer CL may be provided above the read and write-back circuit RWC, and the transistors Tr[1,1] to Tr[m,n] and the capacitors CS[1,1] to CS[m,n] in the memory cell array MCA of the semiconductor device 120 may be provided separately on the layer TrL and the layer CL. A semiconductor device 131 includes the layer TrL and the layer CL, the layer TrL includes the transistors Tr[1,1] to Tr[m,n], and the layer CL includes the capacitors CS[1,1] to CS[m,n]. The layer CL is preferably above the transistors Tr[1,1] to Tr[m,n] as shown in FIG. 6. Such a stacked structure results in a smaller circuit area than that in the semiconductor device 130.

Figure 7:
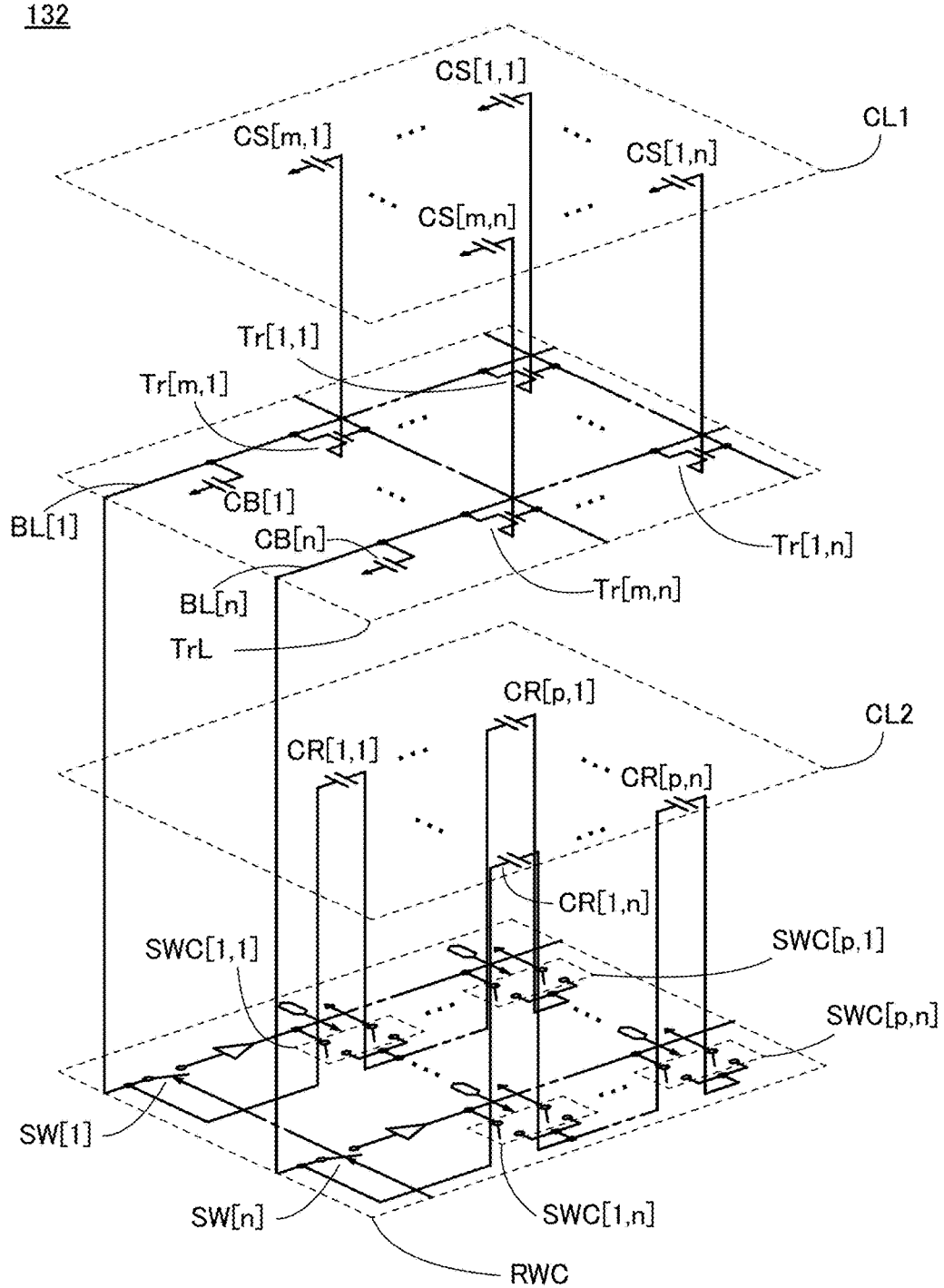
FIG. 7 is a circuit diagram schematically showing a structure example of a semiconductor device.

Alternatively, for example, the layer TrL, a layer CL1, and a layer CL2 may be provided above the read and write-back circuit RWC as shown in FIG. 7. A semiconductor device 132 includes the layer TrL, the layer CL1, and the layer CL2; the layer TrL includes the transistors Tr[1,1] to Tr[m,n]; the layer CL1 includes the capacitors CS[1,1] to CS[m,n]; and the layer CL2 includes the capacitors CR[1,1] to CR[p,n]. Preferably, the layer CL1 is above the layer TrL and the layer CL2 is above the read and write-back circuit RWC as shown in FIG. 7. Such a stacked structure results in a smaller circuit area than that in the semiconductor device 130 and the semiconductor device 131.

Note that one embodiment of the present invention is not limited to the stacking order of the read and write-back circuit RWC, the memory cell array MCA, and the layer CL (or the layer CL1 and layer CL2) in the semiconductor devices 130 to 132. The stacking order of the read and write-back circuit RWC, the memory cell array MCA, and the layer CL may be changed as appropriate depending on the case or circumstances.

Note that the stacked structure will also be described in Embodiment 5.

<<Sample and Hold Circuit>>

Figure 8:
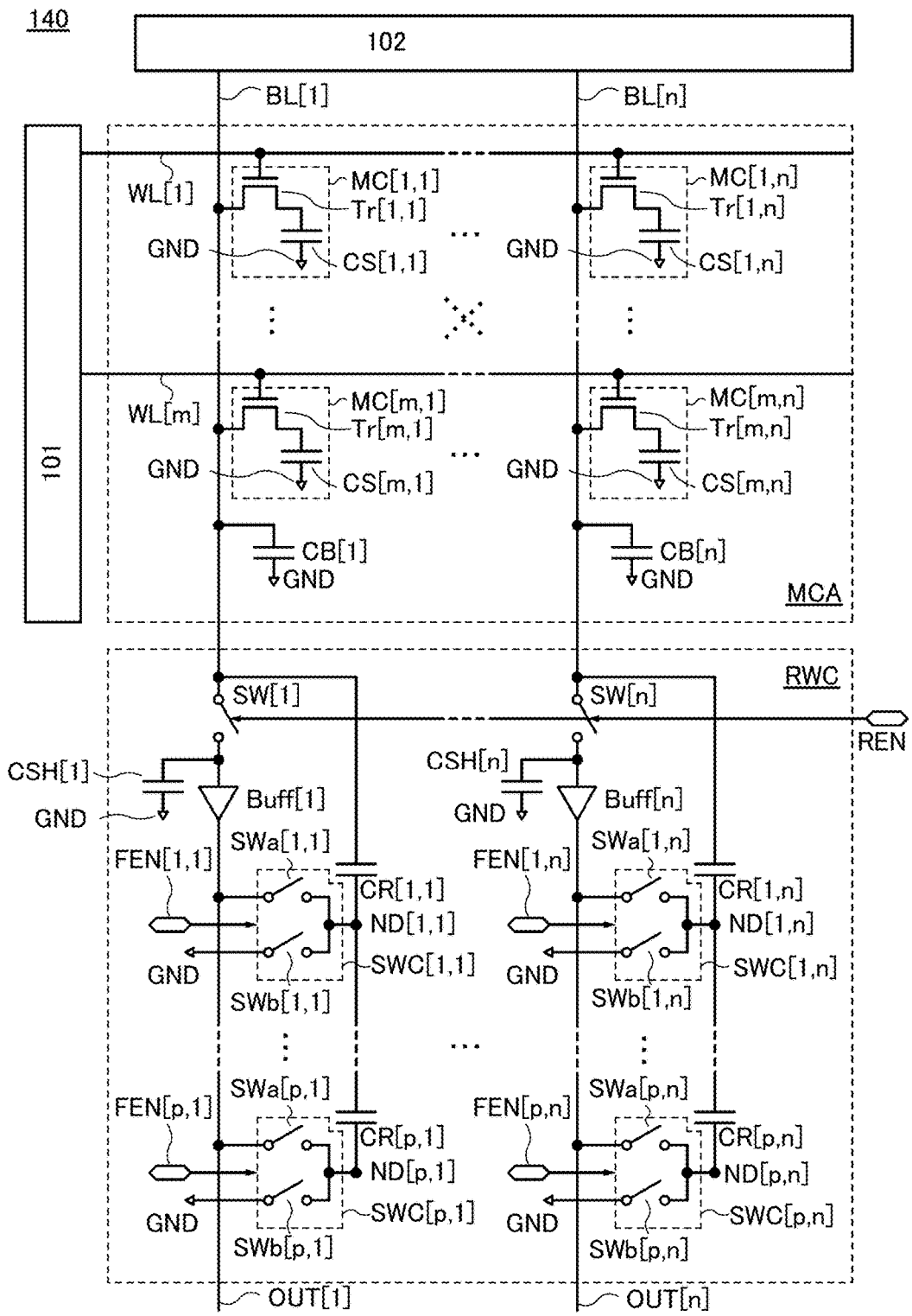
FIG. 8 is a circuit diagram schematically showing a structure example of a semiconductor device.

In the semiconductor device 100, the read and write-back circuit RWC may be provided with a sample and hold circuit. FIG. 8 shows a semiconductor device 140 including a sample and hold circuit. The input terminals of the buffer circuits Buff[1] to Buff[n] are electrically connected to respective first terminals of capacitors CSH[1] to CSH[n], and second terminals of the capacitors CSH[1] to CSH[n] are electrically connected to the wiring GND.

The capacitors CSH[1] to CSH[n] allow the potentials of the input terminals of the buffer circuits Buff[1] to Buff[n] to be maintained. Specifically, even when the switch SW[j] is turned off after the potential of the wiring BL[j] is input to the buffer circuit Buff[j], the potential of the wiring BL[j] is held in a capacitor CSH[j], which prevents a decrease in the potential of the input terminal of the buffer circuit Buff[j]. That is, the potential of the wiring BL[j] can be output from the output terminal of the buffer circuit Buff[j] without a decrease.

Note that the capacitor CSH[j] is not necessarily provided in the case where the input terminal of the buffer circuit Buff[j] has a large parasitic capacitance.

Because the capacitor is provided on the input terminal side of the buffer circuit Buff[j], the potential of the wiring BL[j] decreases in some cases after charge is held in the capacitor CSH[j]. Accordingly, the number of data rewriting by the read and write-back circuit RWC in the semiconductor device 140 is sometimes larger than that in the case where the capacitor CSH[j] is not provided; thus, the number of the switch circuits SWa and the capacitors CR needs to increase depending on the situation.

In this embodiment, one embodiment of the present invention has been described. Other embodiments of the present invention will be described in other embodiments. Note that one embodiment of the present invention is not limited thereto. In other words, various embodiments of the invention are described in this embodiment and the other embodiments, and one embodiment of the present invention is not limited to a particular embodiment. For example, one embodiment of the present invention shows, but is not limited to, an example in which a channel formation region, a source region, a drain region, or the like of a transistor includes an oxide semiconductor. Depending on the circumstances or case, a variety of semiconductors may be used for transistors in one embodiment of the present invention, the channel formation regions of the transistors, the source and drain regions of the transistors, and the like. Depending on the circumstances or case, transistors in one embodiment of the present invention, the channel formation regions of the transistors, the source and drain regions of the transistors, and the like may include, for example, at least one of silicon, germanium, silicon germanium, silicon carbide, gallium arsenide, aluminum gallium arsenide, indium phosphide, gallium nitride, and an organic semiconductor. Depending on the circumstances or case, transistors in one embodiment of the present invention, the channel formation regions of the transistors, the source and drain regions of the transistors, and the like do not necessarily include an oxide semiconductor.

Note that this embodiment can be combined with any of the other embodiments in this specification as appropriate.

Embodiment 2

A configuration example of a memory device of one embodiment of the present invention will be described.

Figure 9:
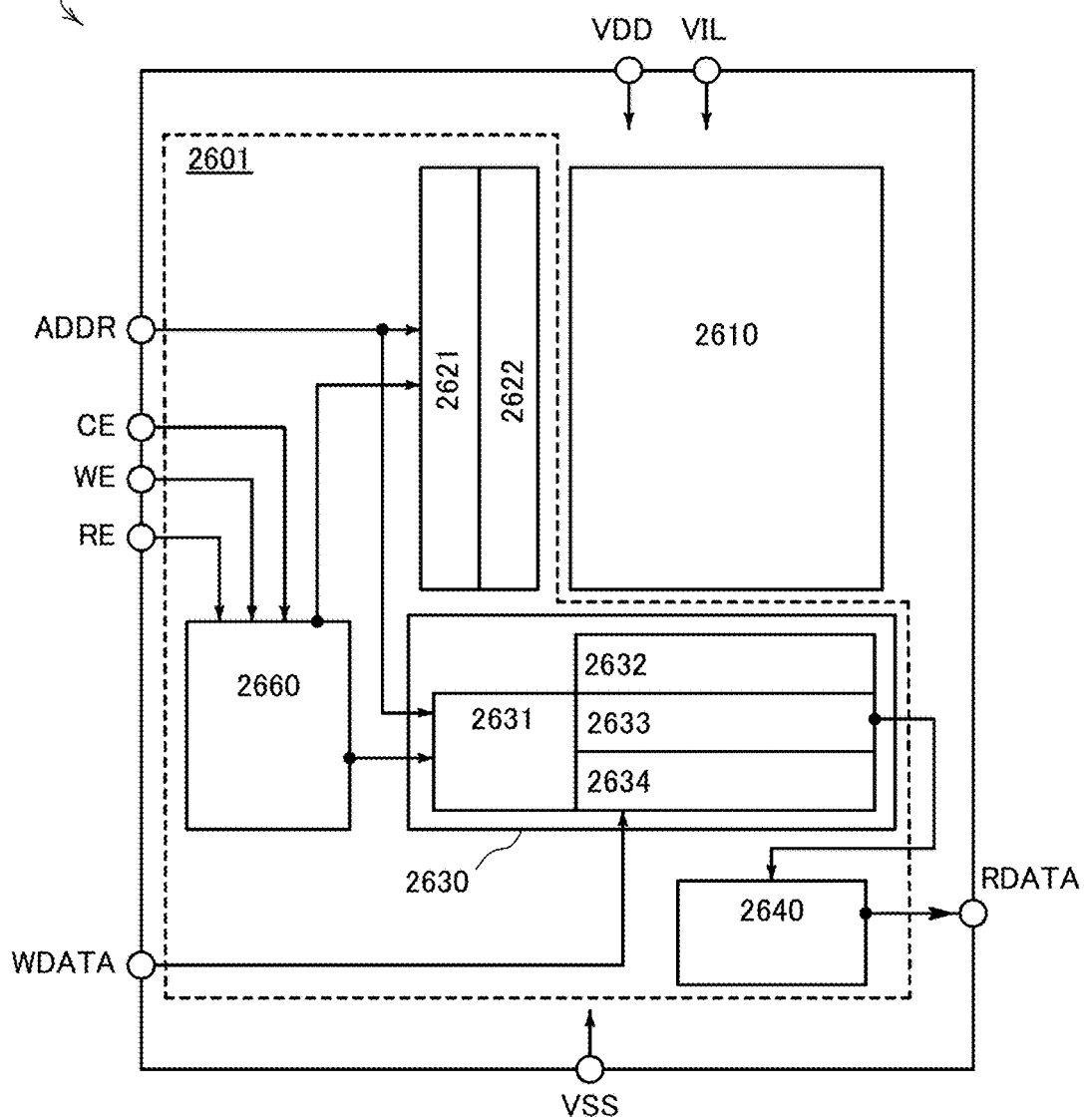
FIG. 9 is a block diagram showing an example of a memory device.

FIG. 9 illustrates a configuration example of a memory device. A memory device 2600 includes a peripheral circuit 2601 and a memory cell array 2610. The peripheral circuit 2601 includes a row decoder 2621, a word line driver circuit 2622, a bit line driver circuit 2630, an output circuit 2640, and a control logic circuit 2660.

The bit line driver circuit 2630 includes a column decoder 2631, a precharge circuit 2632, a sense amplifier 2633, and a write circuit 2634. The precharge circuit 2632 has a function of precharging the wirings BL[1] to BL[n] (not shown in FIG. 9) described in the above embodiment. The sense amplifier 2633 has a function of amplifying a data signal input from the wirings BL[1] to BL[n]. The amplified data signal is output as a digital data signal RDATA from the memory device 2600 through the output circuit 2640.

As power source voltages, a low power source voltage (VSS), a high power source voltage (VDD) for the peripheral circuit 2601, and a high power source voltage (VIL) for the memory cell array 2610 are supplied to the memory device 2600 from the outside.

Control signals CE, WE, and RE, an address signal ADDR, and a data signal WDATA are input to the memory device 2600 from the outside. The address signal ADDR is input to the row decoder 2621 and the column decoder 2631, and the data signal WDATA is input to the write circuit 2634.

The control logic circuit 2660 processes the signals (CE, WE, RE) input from the outside, and generates control signals for the row decoder 2621 and the column decoder 2631. CE, WE, and RE are a chip enable signal, a write enable signal, and a read enable signal, respectively. Signals processed by the control logic circuit 2660 are not limited to those listed above, and other control signals may be input as necessary.

Note that whether each of the aforementioned circuits or signals is provided can be determined as appropriate and as needed.

When a p-channel Si transistor and a transistor including a channel formation region using an oxide semiconductor (preferably an oxide containing In, Ga, and Zn) described later in Embodiment 4 are used in the memory device 2600, the memory device 2600 can be reduced in size. In addition, the memory device 2600 can be reduced in power consumption. Furthermore, the memory device 2600 can be increased in operation speed. In particular, by using only a p-channel transistor as the Si-transistor, manufacturing costs can be reduced.

Note that the configuration of this embodiment is not limited to that shown in FIG. 9. For example, when applied to Embodiment 1, the configuration may be changed as appropriate so that, for example, the read and write-back circuit RWC is provided under the memory cell array 2610.

Note that this embodiment can be combined with any of the other embodiments in this specification as appropriate.

Embodiment 3

Described in this embodiment is a central processor unit (CPU) using the semiconductor device shown in the above embodiments.

Figure 10:
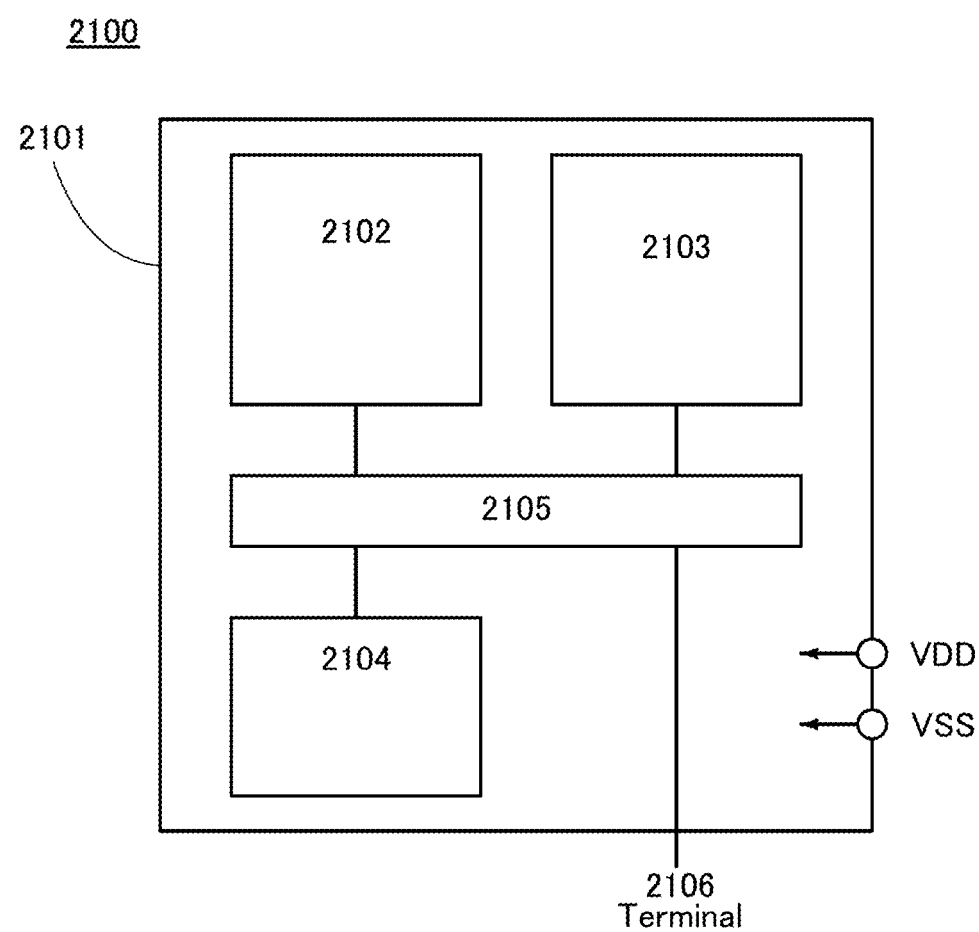
FIG. 10 is a block diagram showing an example of an electronic component.

FIG. 10 is a block diagram showing a configuration example of a CPU.

A CPU 2100 shown in FIG. 10 includes, over a substrate 2101, a processor core 2102, a memory device 2103, a power management unit (PMU) 2104, and a data bus 2105. As the substrate 2101, a semiconductor substrate, an SOI substrate, a glass substrate, or the like is used.

The processor core 2102 has a function of performing a variety of arithmetic operations such as four arithmetic operations and logic operations.

The memory device 2103 has a function of temporarily storing frequently used data, data used for arithmetic operations, data of arithmetic operation results, and the like during the operation of the CPU 2100. Thus, the memory device 2103 serves as a main memory or a cache memory of the CPU 2100.

The PMU 2104 receives external voltages VDD and VSS and controls power supply to the processor core 2102, the memory device 2103, the PMU 2104, and other circuits. Note that FIG. 10 does not show wirings through which power is supplied to each circuit from the PMU 2104. The external voltages VDD and VSS are not necessarily supplied to each circuit through the PMU 2104, and may be directly supplied to each circuit.

Data is communicated between the processor core 2102 and the memory device 2103 or the PMU 2104 through the data bus 2105. Note that when the CPU 2100 is started up, electric power is directly supplied to the processor core 2102 from the PMU 2104 in some cases.

The data bus 2105 is electrically connected to a terminal 2106 of the CPU 2100. When the CPU 2100 performs processing, a program code is input to the terminal 2106 and sent to the processor core 2102 through the data bus 2105; then, arithmetic operation is performed.

Alternatively, an internal circuit of the CPU 2100 may be electrically connected to the outside so that data is directly communicated without through the data bus 2105. For example, data may be directly transmitted to the PMU 2104 to control the processor core 2102.

The CPU 2100 is just an example with a simplified configuration, and an actual CPU may have various configurations depending on the application. For example, a CPU may have the following configuration: a plurality of cores, each of which includes the arithmetic circuit, operate in parallel. The number of bits that the CPU can process in an internal arithmetic circuit or a data bus can be, for example, 8, 16, 32, or 64.

As the memory device 2103, any of the semiconductor devices 100, 110, 120, 130, 131, 132, and 140 described in Embodiment 1 can be used. The use of the semiconductor devices 100, 110, 120, 130, 131, 132, and 140, which are multilevel memories, for the CPU 2100 contributes to a reduction in the size of the CPU.

Furthermore, by using OS transistors in the semiconductor devices 100, 110, 120, 130, 131, 132, and 140, the reading and writing operation speed can be increased, achieving a CPU with a high processing speed. In addition, the OS transistors have an extremely low off-state current and therefore consume less power, i.e., the power consumption of the CPU can be reduced.

Note that this embodiment can be combined with any of the other embodiments in this specification as appropriate.

Embodiment 4

Described in this embodiment are transistors of one embodiment of the disclosed invention.

Transistors according to one embodiment of the present invention each preferably include an nc-OS or a CAAC-OS, which are described in Embodiment 6.

<Structure Example 1 of Transistor>

Figure 11A:
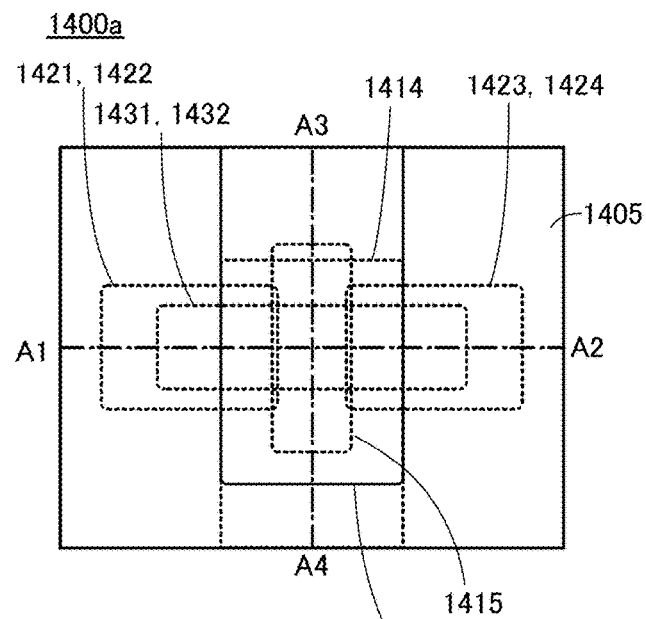
FIGS. 11A to 11C are a top view and cross-sectional views showing a structure example of a transistor.
Figure 11B:
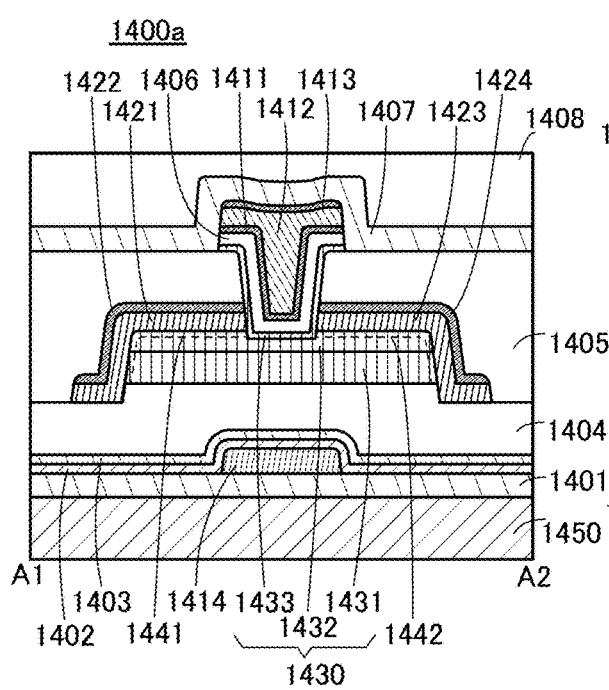
Figure 11C:
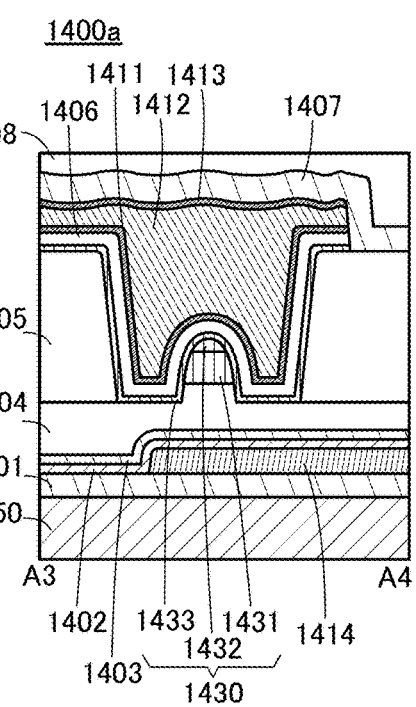

FIGS. 11A to 11C are a top view and cross-sectional views of a transistor 1400a. FIG. 11A is a top view, FIG. 11B is a cross-sectional view taken along dashed-dotted line A1-A2 in FIG. 11A, and FIG. 11C is a cross-sectional view taken along dashed-dotted line A3-A4 in FIG. 11A. Note that for simplification of the drawing, some components are not illustrated in the top view in FIG. 11A. Note that the dashed-dotted line A1-A2 and the dashed-dotted line A3-A4 are sometimes referred to as a channel length direction of the transistor 1400a and a channel width direction of the transistor 1400a, respectively.

The transistor 1400a includes a substrate 1450, an insulating film 1401 over the substrate 1450, a conductive film 1414 over the insulating film 1401, an insulating film 1402 covering the conductive film 1414, an insulating film 1403 over the insulating film 1402, an insulating film 1404 over the insulating film 1403, a metal oxide 1431 and a metal oxide 1432 which are stacked in this order over the insulating film 1404, a conductive film 1421 in contact with top and side surfaces of the metal oxide 1432, a conductive film 1423 also in contact with the top and side surfaces of the metal oxide 1432, a conductive film 1422 over the conductive film 1421, a conductive film 1424 over the conductive film 1423, an insulating film 1405 over the conductive films 1422 and 1424, a metal oxide 1433 in contact with the metal oxides 1431 and 1432, the conductive films 1421 to 1424, and the insulating film 1405, an insulating film 1406 over the metal oxide 1433, a conductive film 1411 over the insulating film 1406, a conductive film 1412 over the conductive film 1411, a conductive film 1413 over the conductive film 1412, an insulating film 1407 covering the conductive film 1413, and an insulating film 1408 over the insulating film 1407. Note that the metal oxides 1431 to 1433 are collectively referred to as a metal oxide 1430.

The metal oxide 1432 is a semiconductor and serves as a channel of the transistor 1400a.

Furthermore, the metal oxides 1431 and 1432 include a region 1441 and a region 1442. The region 1441 is formed in the vicinity of a region where the conductive film 1421 is in contact with the metal oxides 1431 and 1432. The region 1442 is formed in the vicinity of a region where the conductive film 1423 is in contact with the metal oxides 1431 and 1432.

The regions 1441 and 1442 serve as low-resistance regions. The region 1441 contributes to a decrease in the contact resistance between the conductive film 1421 and the metal oxides 1431 and 1432. The region 1442 also contributes to a decrease in the contact resistance between the conductive film 1423 and the metal oxides 1431 and 1432.

The conductive films 1421 and 1422 serve as one of source and drain electrodes of the transistor 1400a. The conductive films 1423 and 1424 serve as the other of the source and drain electrodes of the transistor 1400a.

The conductive film 1422 is configured to allow less oxygen to pass therethrough than the conductive film 1421. It is thus possible to prevent a decrease in the conductivity of the conductive film 1421 due to oxidation.

The conductive film 1424 is also configured to allow less oxygen to pass therethrough than the conductive film 1423. It is thus possible to prevent a decrease in the conductivity of the conductive film 1423 due to oxidation.

The conductive films 1411 to 1413 serve as a first gate electrode of the transistor 1400a.

The conductive films 1411 and 1413 are configured to allow less oxygen to pass therethrough than the conductive film 1412. It is thus possible to prevent a decrease in the conductivity of the conductive film 1412 due to oxidation.

The insulating film 1406 serves as a first gate insulating film of the transistor 1400a.

The conductive film 1414 serves as a second gate electrode of the transistor 1400a.

The potential applied to the conductive films 1411 to 1413 may be the same as or different from that applied to the conductive film 1414. The conductive film 1414 may be omitted in some cases.

The insulating films 1401 to 1404 serve as a base insulating film of the transistor 1400a. The insulating films 1402 to 1404 also serve as a second gate insulating film of the transistor 1400a.

The insulating films 1405 to 1408 serve as a protective insulating film or an interlayer insulating film of the transistor 1400a.

As shown in FIG. 11C, the side surface of the metal oxide 1432 is surrounded by the conductive film 1411. With this structure, the metal oxide 1432 can be electrically surrounded by an electric field of the conductive film 1411. Such a structure of a transistor in which a semiconductor is electrically surrounded by an electric field of a gate electrode is referred to as a surrounded channel (s-channel) structure. Since a channel is formed in the entire metal oxide 1432 (bulk) in the s-channel structure, a large amount of current can flow between a source and a drain of a transistor, increasing the on-state current of the transistor.

The s-channel structure, because of its high on-state current, is suitable for a semiconductor device such as large-scale integration (LSI) which requires a miniaturized transistor. A semiconductor device including the miniaturized transistor can have a high integration degree and high density.

In the transistor 1400a, a region serving as a gate electrode is formed so as to fill an opening 1415 formed in the insulating film 1405 or the like, that is, in a self-aligned manner.

As shown in FIG. 11B, the conductive films 1411 and 1422 have a region where they overlap with each other with the insulating film positioned therebetween. The conductive films 1411 and 1423 also have a region where they overlap with each other with the insulating film positioned therebetween. These regions serve as the parasitic capacitance caused between the gate electrode and the source or drain electrode and might decrease the operation speed of the transistor 1400a. This parasitic capacitance can be reduced by providing the insulating film 1405 in the transistor 1400a. The insulating film 1405 preferably contains a material with a low relative dielectric constant.

Figure 12A:
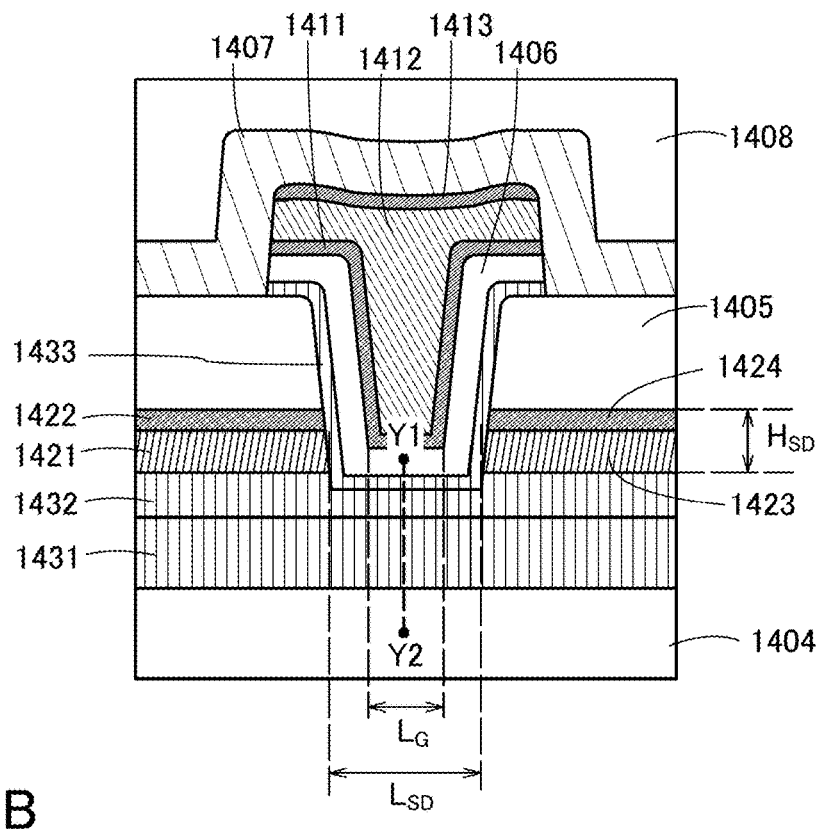
FIGS. 12A and 12B are a cross-sectional view and an energy band diagram showing a structure example of a transistor.

FIG. 12A is an enlarged view of the center of the transistor 1400a. In FIG. 12A, a width $L_G$ denotes the length of the bottom surface of the conductive film 1411, which faces parallel to the top surface of the metal oxide 1432 with the insulating film 1406 and the metal oxide 1433 positioned therebetween. The width $L_G$ is the line width of the gate electrode. In FIG. 12A, a width $L_{SD}$ denotes the length between the conductive films 1421 and 1423, i.e., the length between the source electrode and the drain electrode.

The width $L_{SD}$ is generally determined by the minimum feature size. As shown in FIG. 12A, the width $L_G$ is narrower than the width $L_{SD}$. This means that in the transistor 1400a, the line width of the gate electrode can be made narrower than the minimum feature size; specifically, the width $L_G$ can be greater than or equal to 5 nm and less than or equal to 60 nm, preferably greater than or equal to 5 nm and less than or equal to 30 nm.

In FIG. 12A, a height $H_{SD}$ denotes the total thickness of the conductive films 1421 and 1422, or the total thickness of the conductive films 1423 and 1424.

The thickness of the insulating film 1406 is preferably less than or equal to the height $H_{SD}$, in which case the electric field of the gate electrode can be applied to the entire channel formation region. The thickness of the insulating film 1406 is less than or equal to 30 nm, preferably less than or equal to 10 nm.

The parasitic capacitance between the conductive films 1422 and 1411 and the parasitic capacitance between the conductive films 1424 and 1411 are inversely proportional to the thickness of the insulating film 1405. For example, the thickness of the insulating film 1405 is preferably three times or more, and further preferably five times or more the thickness of the insulating film 1406, in which case the parasitic capacitance is negligibly small. As a result, the transistor 1400a can operate at high frequencies.

Components of the transistor 1400a will be described below.

<<Metal Oxide Layer>>

First, a metal oxide that can be used as the metal oxides 1431 to 1433 will be described.

The transistor 1400a preferably has a low current (off-state current) flowing between a source and a drain in the non-conduction state. Examples of the transistor with a low off-state current include a transistor including an oxide semiconductor in a channel formation region.

The metal oxide 1432 is an oxide semiconductor containing indium (In), for example. The metal oxide 1432 can have high carrier mobility (electron mobility) by containing indium, for example. The metal oxide 1432 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the metal oxide, for example. Furthermore, the metal oxide 1432 preferably contains zinc (Zn). When containing zinc, the metal oxide is easily crystallized in some cases.

Note that the metal oxide 1432 is not limited to the oxide semiconductor containing indium. The metal oxide 1432 may be an oxide semiconductor that does not contain indium and contains at least one of zinc, gallium, and tin (e.g., a zinc tin oxide or a gallium tin oxide).

For the metal oxide 1432, an oxide semiconductor with a wide energy gap is used, for example. The energy gap of the metal oxide 1432 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The metal oxide 1432 is preferably a CAAC-OS film which is described later.

The metal oxides 1431 and 1433 include, for example, one or more, or two or more elements other than oxygen included in the metal oxide 1432. Since the metal oxides 1431 and 1433 include one or more, or two or more elements other than oxygen included in the metal oxide 1432, an interface state is less likely to be formed at an interface between the metal oxides 1431 and 1432 and an interface between the metal oxides 1432 and 1433.

In the case of using an In-M-Zn oxide as the metal oxide 1431, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the metal oxide 1431 is formed by a sputtering method, a sputtering target with the above composition is preferably used. For example, In:M:Zn is preferably 1:3:2 or 1:3:4.

In the case of using an In-M-Zn oxide as the metal oxide 1432, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the metal oxide 1432 is formed by a sputtering method, a sputtering target with the above composition is preferably used. For example, In:M:Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the metal oxide 1432 may be 4:2:3 or in the neighborhood of 4:2:3.

In the case of using an In-M-Zn oxide as the metal oxide 1433, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. For example, In:M:Zn is preferably 1:3:2 or 1:3:4. The metal oxide 1433 may be a metal oxide that is the same type as that of the metal oxide 1431.

The metal oxide 1431 or the metal oxide 1433 does not necessarily contain indium in some cases. For example, the metal oxide 1431 or the metal oxide 1433 may be gallium oxide.

Figure 12B:
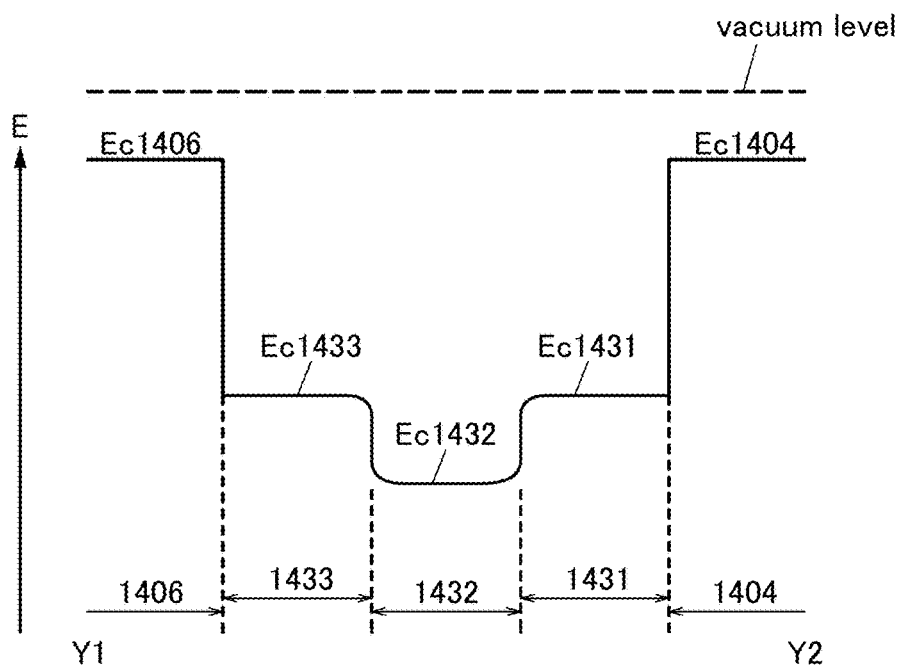

Next, the function and effect of the metal oxide 1430, which includes a stack of the metal oxides 1431 to 1433, are described with reference to the energy band diagram of FIG. 12B. FIG. 12B shows an energy band structure of a portion taken along dashed line Y1-Y2 in FIG. 12A, that is, the energy band structure of a channel formation region of the transistor 1400a and the vicinity thereof.

In FIG. 12B, Ec1404, Ec1431, Ec1432, Ec1433, and Ec1406 indicate the energy at the bottom of the conduction band of the insulating film 1404, the metal oxide 1431, the metal oxide 1432, the metal oxide 1433, and the insulating film 1406, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulating films 1404 and 1406 are insulators, Ec1406 and Ec1404 are closer to the vacuum level (i.e., have a lower electron affinity) than Ec1431, Ec1432, and Ec1433.

The metal oxide 1432 is a metal oxide having higher electron affinity than those of the metal oxides 1431 and 1433. For example, as the metal oxide 1432, a metal oxide having an electron affinity higher than those of the metal oxides 1431 and 1433 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity is an energy gap between the vacuum level and the bottom of the conduction band.

An indium gallium oxide has low electron affinity and a high oxygen-blocking property. Therefore, the metal oxide 1433 preferably includes an indium gallium oxide. The gallium atomic ratio [Ga/(In+Ga)] is, for example, higher than or equal to 70%, preferably higher than or equal to 80%, more preferably higher than or equal to 90%.

At this time, when gate voltage is applied, a channel is formed in the metal oxide 1432 having the highest electron affinity among the metal oxides 1431 to 1433.

At this time, electrons move mainly in the metal oxide 1432, not in the metal oxides 1431 and 1433. Hence, the on-state current hardly varies even when the interface state density, which inhibits electron movement, is high at the interface between the metal oxide 1431 and the insulating film 1404 or at the interface between the metal oxide 1433 and the insulating film 1406. The metal oxides 1431 and 1433 have a function as an insulating film.

In some cases, there is a mixed region of the metal oxides 1431 and 1432 between the metal oxides 1431 and 1432. Furthermore, in some cases, there is a mixed region of the metal oxides 1432 and 1433 between the metal oxides 1432 and 1433. Because the mixed region has a low interface state density, a stack of the metal oxides 1431 to 1433 has a band structure where energy at each interface and in the vicinity of the interface is changed continuously (continuous junction).

As described above, the interface between the metal oxides 1431 and 1432 or the interface between the metal oxides 1432 and 1433 has a low interface state density. Hence, electron movement in the metal oxide 1432 is less likely to be inhibited and the on-state current of the transistor can be increased.

Electron movement in the transistor is inhibited, for example, in the case where physical unevenness in a channel formation region is large. To increase the on-state current of the transistor, for example, root mean square (RMS) roughness with a measurement area of 1 μm×1 μm of a top surface or a bottom surface of the metal oxide 1432 (a formation surface; here, the top surface of the metal oxide 1431) is less than 1 nm, preferably less than 0.6 nm, more preferably less than 0.5 nm, still more preferably less than 0.4 nm. The average surface roughness (Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. The RMS roughness, Ra, and P–V can be measured with, for example, a scanning probe microscope SPA-500 manufactured by SII Nano Technology Inc.

The electron movement is also inhibited in the case where the density of defect states is high in the channel formation region. For example, in the case where the metal oxide 1432 contains oxygen vacancies ($V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the metal oxide 1432, the on-state current of the transistor can be increased in some cases.

For example, at a certain depth in the metal oxide 1432 or in a certain region of the metal oxide 1432, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the metal oxide 1432, for example, there is a method in which excess oxygen contained in the insulating film 1404 is moved to the metal oxide 1432 through the metal oxide 1431. In that case, the metal oxide 1431 is preferably a layer having an oxygen-transmitting property (a layer through which oxygen passes or is transmitted).

Note that in the case where the transistor has an s-channel structure, a channel is formed in the entire metal oxide 1432. Therefore, as the metal oxide 1432 has larger thickness, a channel region becomes larger. In other words, the thicker the metal oxide 1432 is, the larger the on-state current of the transistor is.

Moreover, the thickness of the metal oxide 1433 is preferably as small as possible to increase the on-state current of the transistor. For example, the metal oxide 1433 has a region with a thickness of less than 10 nm, preferably less than or equal to 5 nm, more preferably less than or equal to 3 nm. Meanwhile, the metal oxide 1433 has a function of blocking entry of elements other than oxygen (such as hydrogen and silicon) included in the adjacent insulator into the metal oxide 1432 where a channel is formed. Thus, the metal oxide 1433 preferably has a certain thickness. For example, the metal oxide 1433 may have a region with a thickness of greater than or equal to 0.3 nm, preferably greater than or equal to 1 nm, more preferably greater than or equal to 2 nm. The metal oxide 1433 preferably has an oxygen blocking property to inhibit outward diffusion of oxygen released from the insulating film 1404 and the like.

To improve reliability, preferably, the thickness of the metal oxide 1431 is large and the thickness of the metal oxide 1433 is small. For example, the metal oxide 1431 has a region with a thickness of greater than or equal to 10 nm, preferably greater than or equal to 20 nm, more preferably greater than or equal to 40 nm, still more preferably greater than or equal to 60 nm. An increase in the thickness of the metal oxide 1431 can increase the distance from the interface between the adjacent insulator and the metal oxide 1431 to the metal oxide 1432 where a channel is formed. Note that the metal oxide 1431 has a region with a thickness of, for example, less than or equal to 200 nm, preferably less than or equal to 120 nm, more preferably less than or equal to 80 nm, otherwise the productivity of the semiconductor device might be decreased.

For example, a region in which the concentration of silicon is higher than or equal to $1\times10^{16}$ atoms/cm$^3$ and lower than $1\times10^{19}$ atoms/cm$^3$ is provided between the metal oxides 1432 and 1431. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. A region in which the concentration of silicon is higher than or equal to $1\times10^{16}$ atoms/cm$^3$ and lower than $1\times10^{19}$ atoms/cm$^3$ is provided between the metal oxides 1432 and 1433. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. The concentration of silicon can be measured by SIMS.

It is preferable to reduce the concentration of hydrogen in the metal oxides 1431 and 1433 in order to reduce the concentration of hydrogen in the metal oxide 1432. The metal oxides 1431 and 1433 each have a region in which the concentration of hydrogen is higher than or equal to $1\times10^{16}$ atoms/cm$^3$ and lower than or equal to $2\times10^{20}$ atoms/cm$^3$. The concentration of hydrogen is preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. The concentration of hydrogen can be measured by SIMS. It is also preferable to reduce the concentration of nitrogen in the metal oxides 1431 and 1433 in order to reduce the concentration of nitrogen in the metal oxide 1432. The metal oxides 1431 and 1433 each have a region in which the concentration of nitrogen is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$. The concentration of nitrogen can be measured by SIMS.

The metal oxides 1431 to 1433 may be formed by a sputtering method, a chemical vapor deposition (CVD) method, a molecular beam epitaxy (MBE) method, a pulsed laser deposition (PLD) method, an atomic layer deposition (ALD) method, or the like.

After the metal oxides 1431 and 1432 are formed, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The crystallinity of the metal oxides 1431 and 1432 can be increased by the first heat treatment. Furthermore, impurities such as hydrogen and water can be removed by the first heat treatment.

The above three-layer structure is an example. For example, a two-layer structure without one of the metal oxides 1431 and 1433 may be employed. Alternatively, any one of the metal oxides 1431 to 1433 may be provided over or below the metal oxide 1431 or over or below the metal oxide 1433, i.e., a four-layer structure may be employed. Further alternatively, an n-layer structure (n is an integer of 5 or more) in which any one of the metal oxides 1431 to 1433 is provided at two or more of the following positions may be employed: over the metal oxide 1431, below the metal oxide 1431, over the metal oxide 1433, and below the metal oxide 1433.

<<Substrate>>

As the substrate 1450, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. The semiconductor substrate may be a silicon on insulator (SOI) substrate in which an insulating region is provided in the above semiconductor substrate. Examples of the conductor substrate include a graphite substrate, a metal substrate, an alloy substrate, and a conductive resin substrate. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. Examples of the element provided over the substrate include a capacitor, a resistor, a switching element, a light-emitting element, and a memory element.

A flexible substrate may be used as the substrate 1450. As a method for providing a transistor over a flexible substrate, there is a method in which a transistor is formed over a non-flexible substrate, and then the transistor is separated and transferred to the substrate 1450 which is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 1450 may have a property of not returning to its original shape. The thickness of the substrate 1450 is, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 1450 has a small thickness, the weight of the semiconductor device can be reduced. When the substrate 1450 has a small thickness, even in the case of using glass or the like, the substrate 1450 may have elasticity or a property of returning to its original shape when bending or pulling is stopped. Therefore, an impact applied to the semiconductor device over the substrate 1450, which is caused by dropping or the like, can be reduced. That is, a durable semiconductor device can be provided.

For the flexible substrate 1450, metal, an alloy, a resin, glass, or fiber thereof can be used, for example. The flexible substrate 1450 preferably has a lower coefficient of linear expansion because deformation due to an environment is suppressed. The flexible substrate 1450 is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

<<Base Insulating Film>>

The insulating film 1401 has a function of electrically isolating the substrate 1450 from the conductive film 1414.

The insulating film 1401 or 1402 is formed using an insulating film having a single-layer structure or a layered structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 1402 may be formed using silicon oxide with high step coverage which is formed by reacting tetraethyl orthosilicate (TEOS), silane, or the like with oxygen, nitrous oxide, or the like.

After the insulating film 1402 is formed, the insulating film 1402 may be subjected to planarization treatment using a CMP method or the like to improve the planarity of the top surface thereof.

The insulating film 1404 preferably contains an oxide. In particular, the insulating film 1404 preferably contains an oxide material from which part of oxygen is released by heating. The insulating film 1404 preferably contains an oxide containing oxygen more than that in the stoichiometric composition. Part of oxygen is released by heating from an oxide film containing oxygen more than that in the stoichiometric composition. Oxygen released from the insulating film 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating film 1404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 1404.

To make the insulating film 1404 contain excess oxygen, the insulating film 1404 is formed in an oxygen atmosphere, for example. Alternatively, a region containing excess oxygen may be formed by introducing oxygen into the insulating film 1404 that has been formed. Both the methods may be combined.

For example, oxygen (at least including any of oxygen radicals, oxygen atoms, and oxygen ions) may be introduced into the insulating film 1404 that has been formed, so that a region containing excess oxygen is formed. Oxygen can be introduced by, for example, an ion implantation method, an ion doping method, a plasma immersion ion implantation method, plasma treatment, or the like.

A gas containing oxygen can be used for oxygen introducing treatment. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulating film 1404 is formed, the insulating film 1404 may be subjected to planarization treatment using a CMP method or the like to improve the planarity of the top surface thereof.

The insulating film 1403 has a passivation function of preventing oxygen contained in the insulating film 1404 from decreasing by bonding to metal contained in the conductive film 1414.

The insulating film 1403 has a function of blocking oxygen, hydrogen, water, alkali metal, alkaline earth metal, and the like. Providing the insulating film 1403 can prevent outward diffusion of oxygen from the metal oxide 1430 and entry of hydrogen, water, or the like into the metal oxide 1430 from the outside.

The insulating film 1403 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

The threshold voltage of the transistor 1400a can be controlled by injecting electrons into a charge trap layer. The charge trap layer is preferably provided in the insulating film 1402 or the insulating film 1403. For example, when the insulating film 1403 is formed using hafnium oxide, aluminum oxide, tantalum oxide, aluminum silicate, or the like, the insulating film 1403 can function as a charge trap layer.

<<Gate Electrode>>

The conductive films 1411 to 1414 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

<<Source Electrode and Drain Electrode>>

The conductive films 1421 to 1424 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

The conductive films 1421 to 1424 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<<Low-Resistance Region>>

The regions 1441 and 1442 are formed when, for example, the conductive films 1421 and 1423 take oxygen from the metal oxides 1431 and 1432. Oxygen is more likely to be extracted at higher temperatures. Oxygen vacancies are formed in the regions 1441 and 1442 through several heating steps in the manufacturing process of the transistor. In addition, hydrogen enters sites of the oxygen vacancies by heating, increasing the carrier concentration in the regions 1441 and 1442. As a result, the resistance of the regions 1441 and 1442 is reduced.

<<Gate Insulating Film>>

The insulating film 1406 preferably contains an insulator with a high relative dielectric constant. For example, the insulating film 1406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulating film 1406 preferably has a layered structure containing silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the layered structure to be thermally stable and have a high relative dielectric constant. For example, when aluminum oxide, gallium oxide, or hafnium oxide is closer to the metal oxide 1433, entry of silicon from silicon oxide or silicon oxynitride into the metal oxide 1432 can be suppressed.

When silicon oxide or silicon oxynitride is closer to the metal oxide 1433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<<Interlayer Insulating Film and Protective Insulating Film>>

The insulating film 1405 preferably contains an insulator with a low relative dielectric constant. For example, the insulating film 1405 preferably contains silicon oxide, silicon oxynitride, silicon nitride oxide, silicon nitride, or a resin. Alternatively, the insulating film 1405 preferably has a layered structure containing silicon oxide or silicon oxynitride and a resin. Because silicon oxide and silicon oxynitride have thermal stability, combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

The insulating film 1407 has a function of blocking oxygen, hydrogen, water, alkali metal, alkaline earth metal, and the like. Providing the insulating film 1407 can prevent outward diffusion of oxygen from the metal oxide 1430 and entry of hydrogen, water, or the like into the metal oxide 1430 from the outside.

The insulating film 1407 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

An aluminum oxide film is preferably used as the insulating film 1407 because it is highly effective in preventing transmission of both oxygen and impurities such as hydrogen and moisture.

When the insulating film 1407 is formed by a method using plasma containing oxygen, e.g., by a sputtering method or a CVD method, oxygen can be added to side and top surfaces of the insulating films 1405 and 1406. It is preferable to perform second heat treatment at any time after the formation of the insulating film 1407. Through the second heat treatment, oxygen added to the insulating films 1405 and 1406 is diffused in the insulating films to reach the metal oxide 1430, whereby oxygen vacancies in the metal oxide 1430 can be reduced.

Figure 13A:
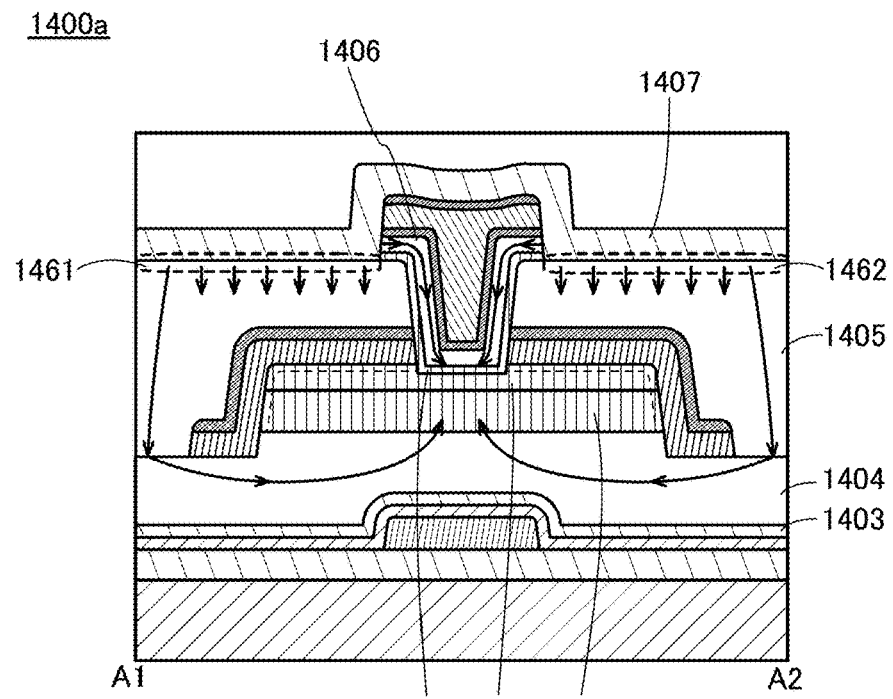
FIGS. 13A and 13B are cross-sectional views showing oxygen diffusion paths.
Figure 13B:
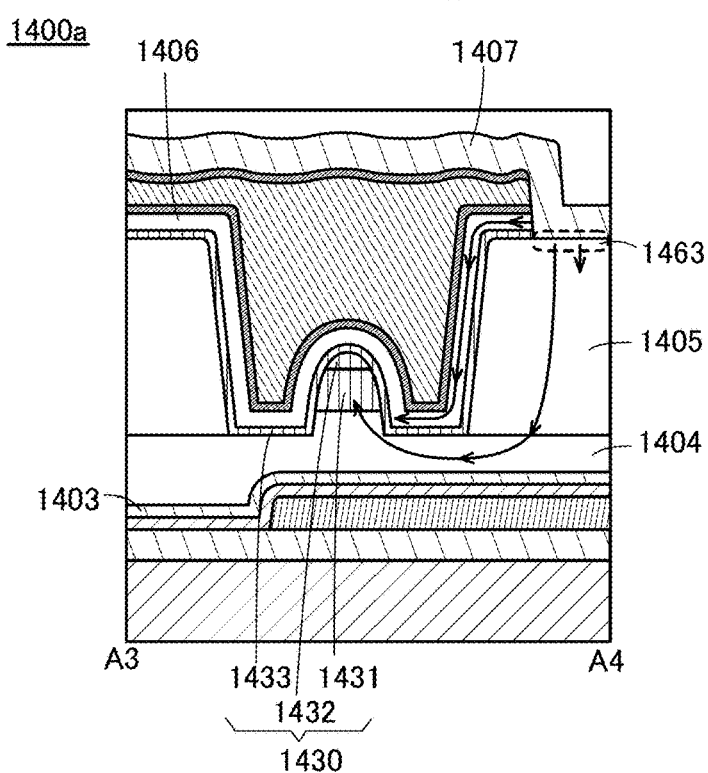

In schematic views of FIGS. 13A and 13B, oxygen added to the insulating films 1405 and 1406 in the formation of the insulating film 1407 is diffused in the insulating films through the second heat treatment and reaches the metal oxide 1430. In FIG. 13A, oxygen diffused in the cross-sectional view of FIG. 11B is indicated by arrows. In FIG. 13B, oxygen diffused in the cross-sectional view of FIG. 11C is indicated by arrows.

As shown in FIGS. 13A and 13B, oxygen added to the side surface of the insulating film 1406 is diffused in the insulating film 1406 and reaches the metal oxide 1430. In addition, a region 1461, a region 1462, and a region 1463 each containing excess oxygen are sometimes formed in the vicinity of the interface between the insulating films 1407 and 1405. Oxygen contained in the regions 1461 to 1463 reaches the metal oxide 1430 through the insulating films 1405 and 1404. In the case where the insulating film 1405 includes silicon oxide and the insulating film 1407 includes aluminum oxide, a mixed layer of silicon, aluminum, and oxygen is formed in the regions 1461 to 1463 in some cases.

The insulating film 1407 has a function of blocking oxygen and prevents oxygen from being diffused over the insulating film 1407. The insulating film 1403 also has a function of blocking oxygen and prevents oxygen from being diffused under the insulating film 1403.

Note that the second heat treatment may be performed at a temperature that allows oxygen added to the insulating films 1405 and 1406 to be diffused to the metal oxide 1430. For example, the description of the first heat treatment may be referred to for the second heat treatment. Alternatively, the temperature of the second heat treatment is preferably lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of oxygen from the insulating film 1404 can be inhibited. Note that the second heat treatment is not necessarily performed when heating during formation of the films can work as heat treatment comparable to the second heat treatment.

As described above, oxygen can be supplied to the metal oxide 1430 from above and below through the formation of the insulating film 1407 and the second heat treatment.

Alternatively, oxygen can be added to the insulating films 1405 and 1406 by forming a film containing indium oxide, e.g., an In-M-Zn oxide, as the insulating film 1407.

The insulating film 1408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, for the insulating film 1408, a resin such as a polyimide resin, a polyamide resin, an acrylic resin, a siloxane resin, an epoxy resin, or a phenol resin can be used. The insulating film 1408 may be a stack including any of the above materials.

<Structure Example 2 of Transistor>

The conductive film 1414 and the insulating films 1402 and 1403 can be omitted in the transistor 1400a shown in FIGS. 11A to 11C. An example of such a structure is shown in FIGS. 14A to 14C.

Figure 14A:
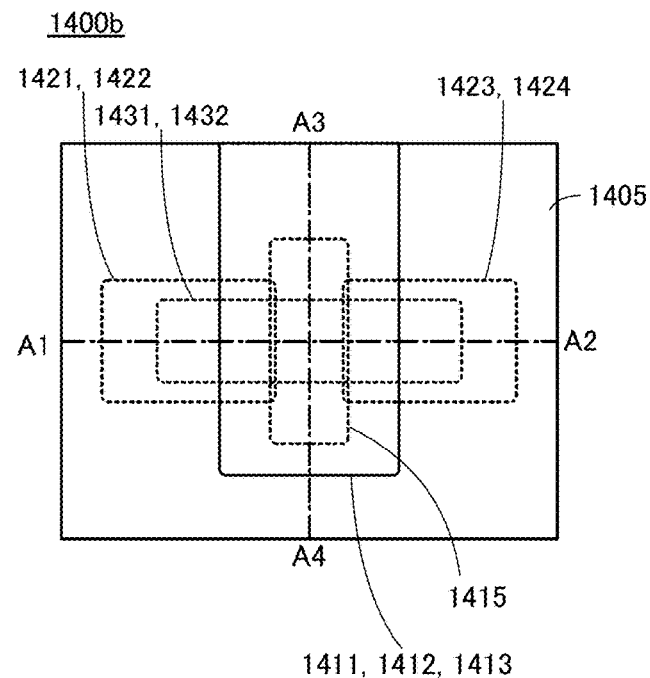
FIGS. 14A to 14C are a top view and cross-sectional views showing a structure example of a transistor.
Figure 14B:
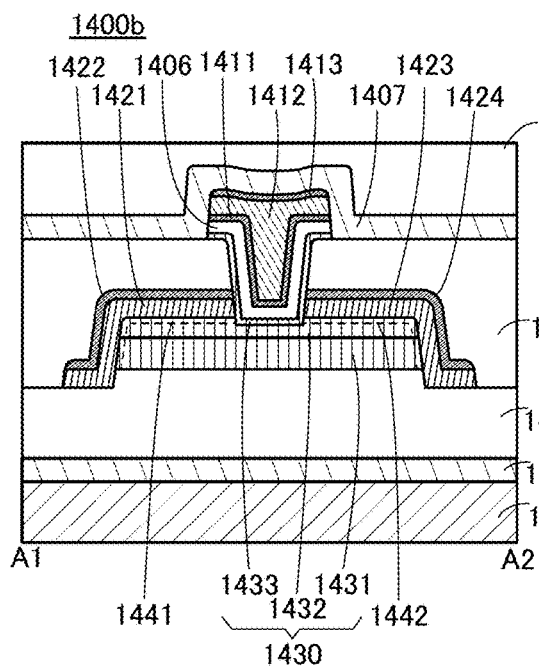
Figure 14C:
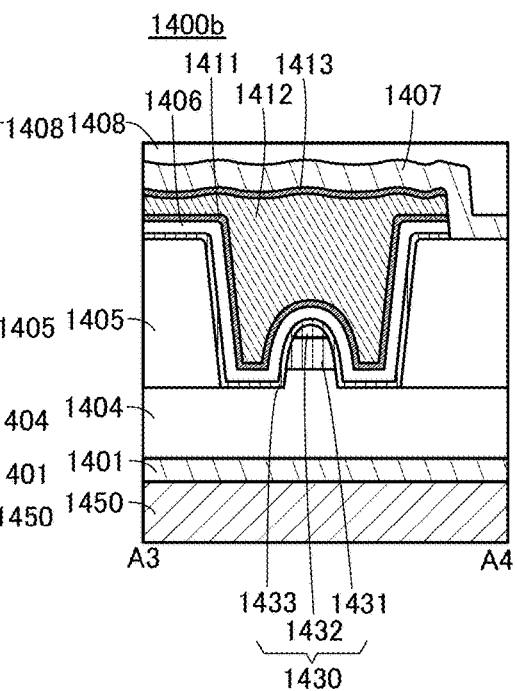

FIGS. 14A to 14C are a top view and cross-sectional views of a transistor 1400b. FIG. 14A is a top view. FIG. 14B is a cross-sectional view taken along dashed-dotted line A1-A2 in FIG. 14A and FIG. 14C is a cross-sectional view taken along dashed-dotted line A3-A4 in FIG. 14A. Note that for simplification of the drawing, some components are not illustrated in the top view in FIG. 14A. Note that the dashed-dotted line A1-A2 and the dashed-dotted line A3-A4 are sometimes referred to as a channel length direction of the transistor 1400b and a channel width direction of the transistor 1400b, respectively.

<Structure Example 3 of Transistor>

In the transistor 1400a shown in FIGS. 11A to 11C, parts of the conductive films 1421 and 1423 that overlap with the gate electrode (the conductive films 1411 to 1413) can be reduced in thickness. An example of such a structure is shown in FIGS. 15A to 15C.

Figure 15A:
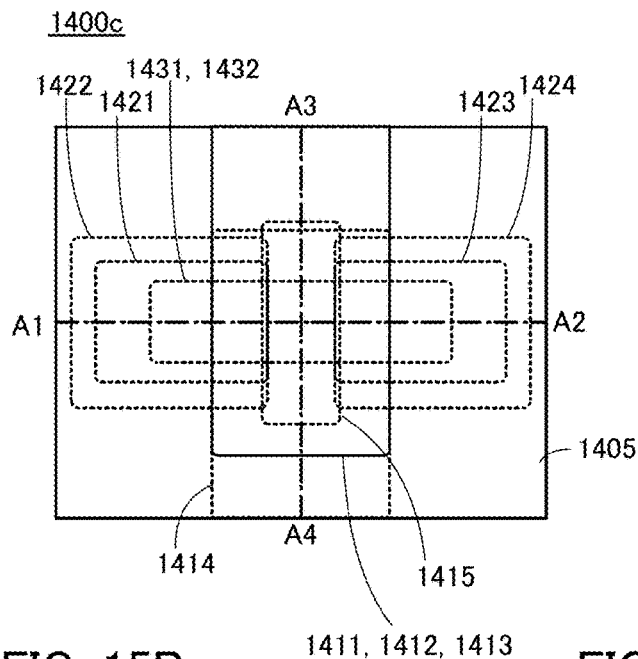
FIGS. 15A to 15C are a top view and cross-sectional views showing a structure example of a transistor.
Figure 15B:
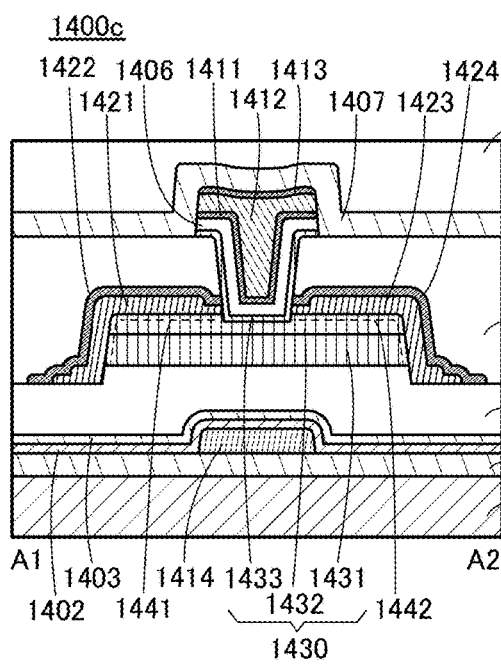
Figure 15C:
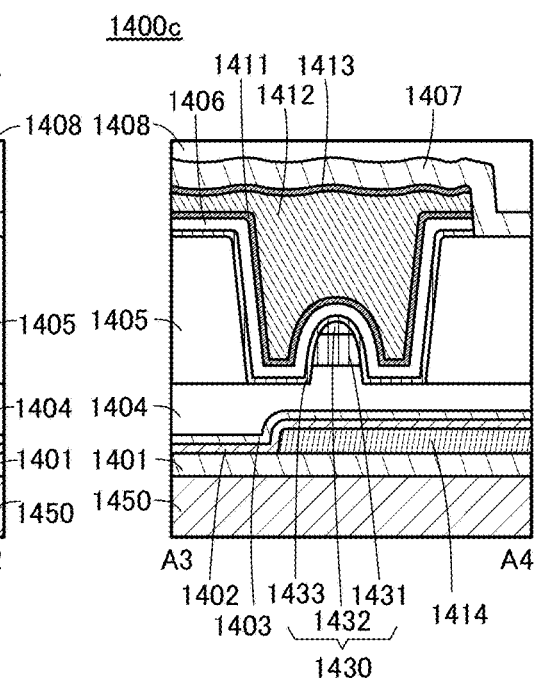

FIGS. 15A to 15C are a top view and cross-sectional views of a transistor 1400c. FIG. 15A is a top view. FIG. 15B is a cross-sectional view taken along dashed-dotted line A1-A2 in FIG. 15A and FIG. 15C is a cross-sectional view taken along dashed-dotted line A3-A4 in FIG. 15A. Note that for simplification of the drawing, some components are not illustrated in the top view in FIG. 15A. Note that the dashed-dotted line A1-A2 and the dashed-dotted line A3-A4 are sometimes referred to as a channel length direction of the transistor 1400c and a channel width direction of the transistor 1400c, respectively.

In the transistor 1400c shown in FIG. 15B, part of the conductive film 1421 that overlaps with the gate electrode is reduced in thickness, and the conductive film 1422 covers the conductive film 1421. Part of the conductive film 1423 that overlaps with the gate electrode is also reduced in thickness, and the conductive film 1424 covers the conductive film 1423.

The transistor 1400c, which has the structure shown in FIG. 15B, can have an increased distance between the gate and source electrodes or between the gate and drain electrodes. This results in a reduction in the parasitic capacitance formed between the gate electrode and the source and drain electrodes. As a result, a transistor capable of high-speed operation can be obtained.

<Structure Example 4 of Transistor>

In the transistor 1400c shown in FIGS. 15A to 15C, the width of the metal oxides 1431 and 1432 can be increased in the A3-A4 direction. An example of such a structure is shown in FIGS. 16A to 16C.

Figure 16A:
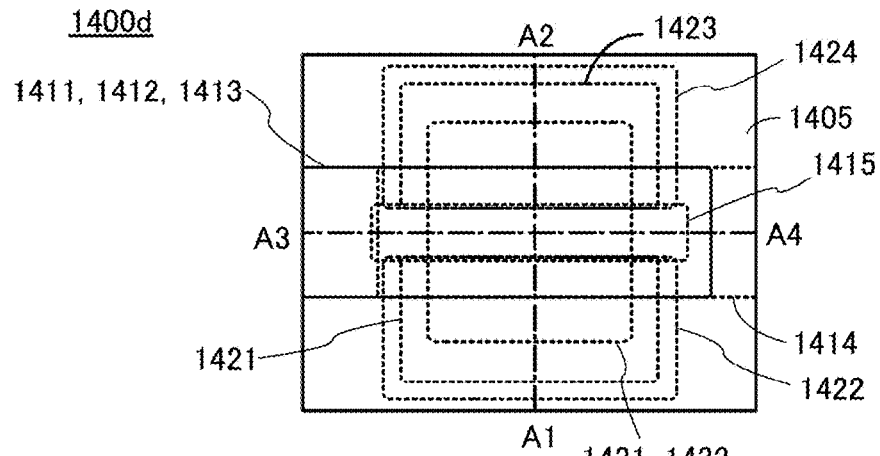
FIGS. 16A to 16C are a top view and cross-sectional views showing a structure example of a transistor.
Figure 16B:
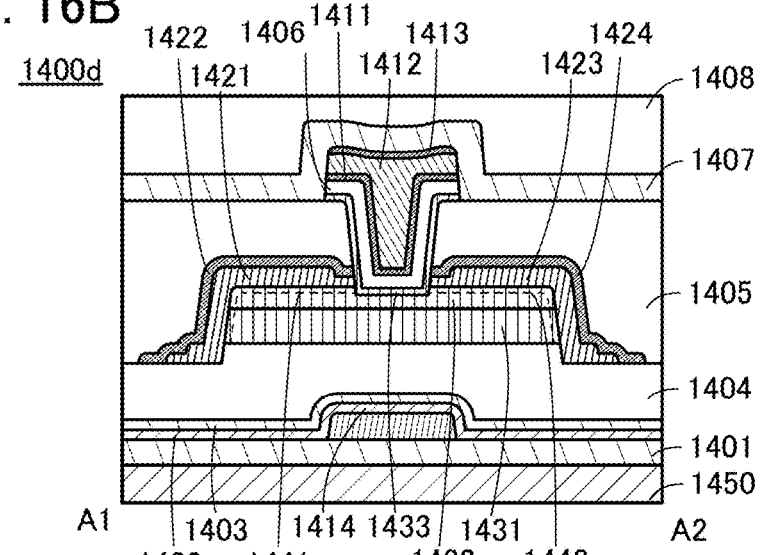
Figure 16C:
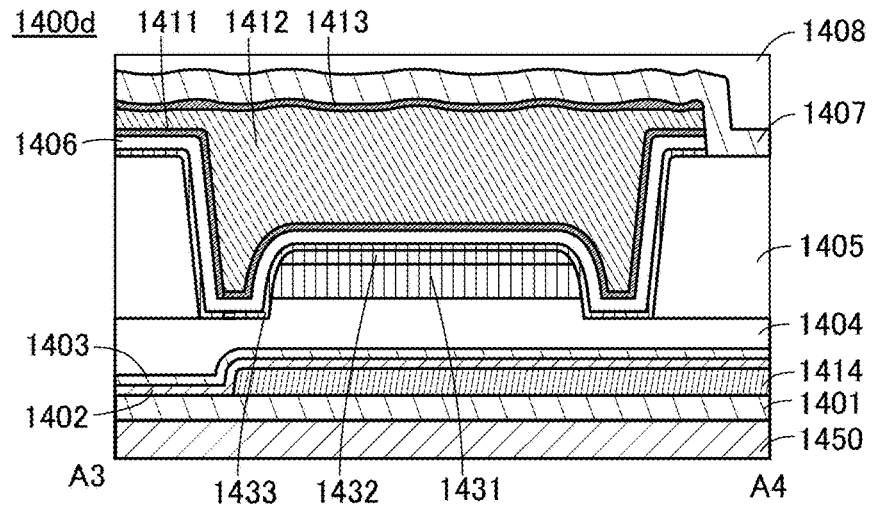

FIGS. 16A to 16C are a top view and cross-sectional views of a transistor 1400d. FIG. 16A is a top view. FIG. 16B is a cross-sectional view taken along dashed-dotted line A1-A2 in FIG. 16A and FIG. 16C is a cross-sectional view taken along dashed-dotted line A3-A4 in FIG. 16A. Note that for simplification of the drawing, some components are not illustrated in the top view in FIG. 16A. Note that the dashed-dotted line A1-A2 and the dashed-dotted line A3-A4 are sometimes referred to as a channel length direction of the transistor 1400d and a channel width direction of the transistor 1400d, respectively.

The transistor 1400d, which has the structure shown in FIGS. 16A to 16C, can have an increased on-state current.

<Structure Example 5 of Transistor>

In the transistor 1400c shown in FIGS. 15A to 15C, a plurality of regions (fins) consisting of the metal oxides 1431 and 1432 may be provided in the A3-A4 direction. An example of such a structure is shown in FIGS. 17A to 17C.

Figure 17A:
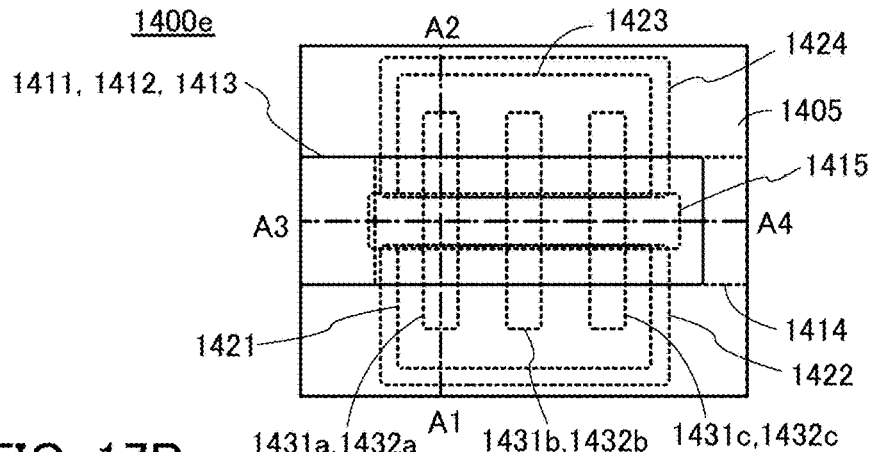
FIGS. 17A to 17C are a top view and cross-sectional views showing a structure example of a transistor.
Figure 17B:
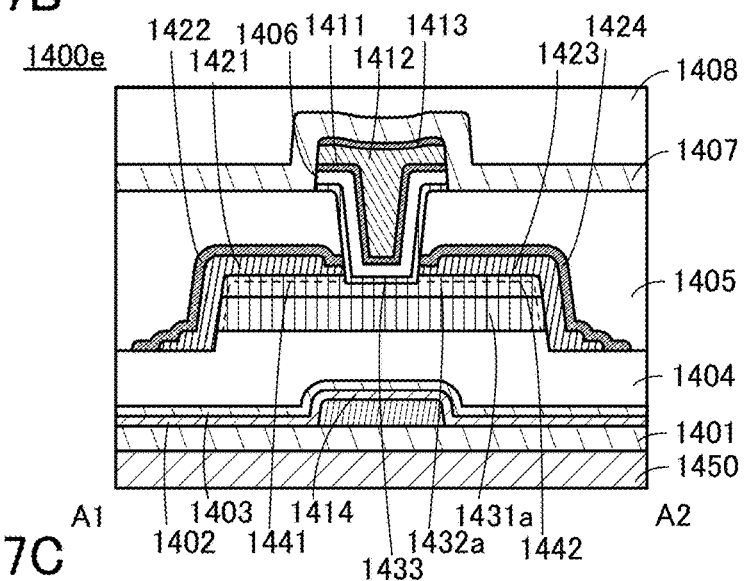
Figure 17C:
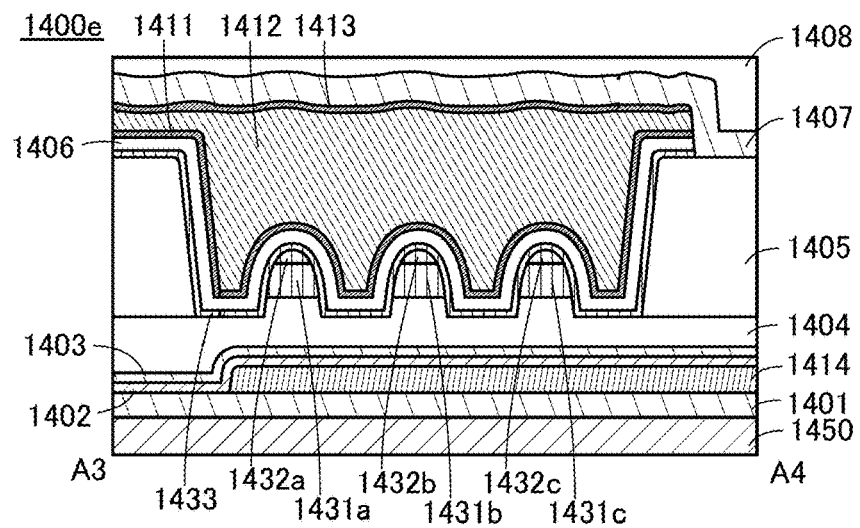

FIGS. 17A to 17C are a top view and cross-sectional views of a transistor 1400e. FIG. 17A is a top view. FIG. 17B is a cross-sectional view taken along dashed-dotted line A1-A2 in FIG. 17A and FIG. 17C is a cross-sectional view taken along dashed-dotted line A3-A4 in FIG. 17A. Note that for simplification of the drawing, some components are not illustrated in the top view in FIG. 17A. Note that the dashed-dotted line A1-A2 and the dashed-dotted line A3-A4 are sometimes referred to as a channel length direction of the transistor 1400e and a channel width direction of the transistor 1400e, respectively.

The transistor 1400e includes a first fin consisting of metal oxides 1431a and 1432a, a second fin consisting of metal oxides 1431b and 1432b, and a third fin consisting of metal oxides 1431c and 1432c.

In the transistor 1400e, the metal oxides 1432a to 1432c where a channel is formed are surrounded by the gate electrode. Hence, a gate electric field can be applied to the entire channel, so that a transistor with a high on-state current can be obtained.

<Structure Example 6 of Transistor>

FIGS. 18A to 18D are a top view and cross-sectional views of a transistor 1400f. FIG. 18A is a top view of the transistor 1400f. FIG. 18B is a cross-sectional view taken along dashed-dotted line A1-A2 in FIG. 18A and FIG. 18C is a cross-sectional view taken along dashed-dotted line A3-A4 in FIG. 18A. Note that the dashed-dotted line A1-A2 and the dashed-dotted line A3-A4 are sometimes referred to as a channel length direction and a channel width direction, respectively. The transistor 1400f has the s-channel structure like the transistor 1400a and the like. In the transistor 1400f, an insulating film 1409 is provided in contact with the side surface of the conductive film 1412 used as a gate electrode. The insulating film 1409 and the conductive film 1412 are covered with the insulating film 1407. The insulating film 1407 is covered with the insulating film 1408. The insulating film 1409 serves as a sidewall insulating film of the transistor 1400f. As in the transistor 1400a, the gate electrode may be a stack of the conductive films 1411 to 1413.

The insulating film 1406 and the conductive film 1412 overlap with the conductive film 1414 and the metal oxide 1432 at least partly. The side edge of the conductive film 1412 in the channel length direction is preferably approximately aligned with the side edge of the insulating film 1406 in the channel length direction. Here, the insulating film 1406 serves as a gate insulating film of the transistor 1400f, and the conductive film 1412 serves as a gate electrode of the transistor 1400f.

The metal oxide 1432 has a region that overlaps with the conductive film 1412 with the metal oxide 1433 and the insulating film 1406 positioned therebetween. Preferably, the outer edge of the metal oxide 1431 is approximately aligned with the outer edge of the metal oxide 1432, and the outer edge of the metal oxide 1433 is outside of the outer edges of the metal oxides 1431 and 1432. However, the shape of the transistor in this embodiment is not limited to that where the outer edge of the metal oxide 1433 is outside of the outer edge of the metal oxide 1431. For example, the outer edge of the metal oxide 1431 may be outside of the outer edge of the metal oxide 1433, or the side edge of the metal oxide 1431 may be approximately aligned with the side edge of the metal oxide 1433.

FIG. 18D is an enlarged view of part of FIG. 18B. As shown in FIG. 18D, regions 1461a to 1461e are formed in the metal oxide 1430. The regions 1461b to 1461e have a higher concentration of dopant and therefore have a lower resistance than the region 1461a. Furthermore, the regions 1461b and 1461c have a higher concentration of hydrogen and therefore have a much lower resistance than the regions 1461d and 1461e. The concentration of a dopant in the region 1461a is, for example, less than or equal to 5%, less than or equal to 2%, or less than or equal to 1% of the maximum concentration of a dopant in the region 1461b or 1461c. Note that the dopant may be rephrased as a donor, an acceptor, an impurity, or an element.

As shown in FIG. 18D, in the metal oxide 1430, the region 1461a substantially overlaps with the conductive film 1412, and the regions 1461b to 1461e are the regions other than the region 1461a. In the regions 1461b and 1461c, the top surface of the metal oxide 1433 is in contact with the insulating film 1407. In the regions 1461d and 1461e, the top surface of the metal oxide 1433 is in contact with the insulating film 1409 or 1406. That is, as shown in FIG. 18D, the border between the regions 1461b and 1461d overlaps with the border between the side edges of the insulating films 1407 and 1409. The same applies to the border between the regions 1461c and 1461e. Here, part of the regions 1461d and 1461e preferably overlaps with part of a region (a channel formation region) where the metal oxide 1432 and the conductive film 1412 overlap with each other. For example, preferably, the side edges of the regions 1461d and 1461e in the channel length direction are inside of the conductive film 1412 and the distance between the side edge of the conductive film 1412 and each of the side edges of the regions 1461d and 1461e is d. In that case, the thickness $t_{406}$ of the insulating film 1406 and the distance d preferably satisfy $0.25\ t_{406} < d < t_{406}$.

In the above manner, the regions 1461d and 1461e are formed in part of the region where the metal oxide 1430 and the conductive film 1412 overlap with each other. Accordingly, the channel formation region of the transistor 1400f is in contact with the low-resistance regions 1461d and 1461e and a high-resistance offset region is not formed between the region 1461a and each of the regions 1461d and 1461e, so that the on-state current of the transistor 1400*f* can be increased. Furthermore, since the side edges of the regions 1461*d* and 1461*e* in the channel length direction are formed so as to satisfy the above range, the regions 1461*d* and 1461*e* can be prevented from being formed too deeply in the channel formation region and always conducted.

The regions 1461*b* to 1461*e* are formed by ion doping treatment such as an ion implantation method. Therefore, as shown in FIG. 18D, the positions of the side edges of the regions 1461*d* and 1461*e* in the channel length direction are sometimes shifted to the side edge of the metal oxide 1430 in the channel length direction in a deeper area from the top surface of the metal oxide 1433. The distance d in that case is the distance between the side edge of the conductive film 1412 in the channel length direction and each of the side edges of the regions 1461*d* and 1461*e* that are closest to the inner part of the conductive film 1412.

In some cases, for example, the regions 1461*d* and 1461*e* in the metal oxide 1431 do not overlap with the conductive film 1412. In that case, at least part of the regions 1461*d* and 1461*e* in the metal oxide 1431 or 1432 is preferably formed in a region overlapping with the conductive film 1412.

In addition, low-resistance regions 1451 and 1452 are preferably formed in the metal oxide 1431, the metal oxide 1432, and the metal oxide 1433 in the vicinity of the interface with the insulating film 1407. The low-resistance regions 1451 and 1452 contain at least one of elements included in the insulating film 1407. Preferably, part of the low-resistance regions 1451 and 1452 is substantially in contact with or overlaps partly with the region (the channel formation region) where the metal oxide 1432 and the conductive film 1412 overlap with each other.

Since a large part of the metal oxide 1433 is in contact with the insulating film 1407, the low-resistance regions 1451 and 1452 are likely to be formed in the metal oxide 1433. The low-resistance regions 1451 and 1452 in the metal oxide 1433 contain a higher concentration of elements included in the insulating film 1407 than the other regions of the metal oxide 1433 (e.g., the region of the metal oxide 1433 that overlaps with the conductive film 1412).

The low-resistance regions 1451 and 1452 are formed in the regions 1461*b* and 1461*c*, respectively. Ideally, the metal oxide 1430 has a structure in which the concentration of added elements is the highest in the low-resistance regions 1451 and 1452, the second highest in the regions 1461*b* to 1461*e* other than the low-resistance regions 1451 and 1452, and the lowest in the region 1461*a*. The added elements refer to a dopant for forming the regions 1461*b* and 1461*c* and an element added from the insulating film 1407 to the low-resistance regions 1451 and 1452.

Although the low-resistance regions 1451 and 1452 are formed in the transistor 1400*f*, the semiconductor device shown in this embodiment is not limited to this structure. For example, the low-resistance regions 1451 and 1452 are not necessarily formed in the case where the regions 1461*b* and 1461*c* have a sufficiently low resistance.

<Structure Example 7 of Transistor>

Figure 19A:
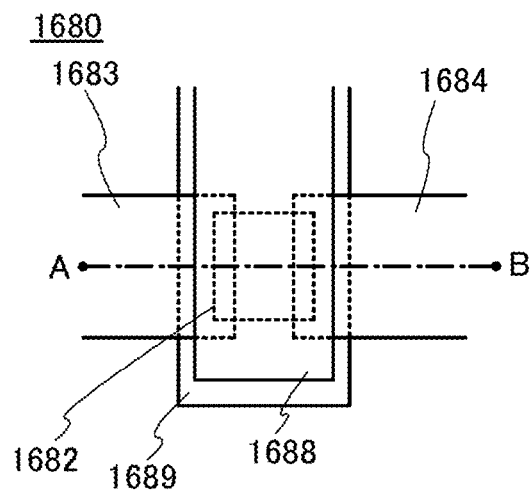
FIGS. 19A and 19B are a top view and a cross-sectional view showing a structure example of a transistor.
Figure 19B:
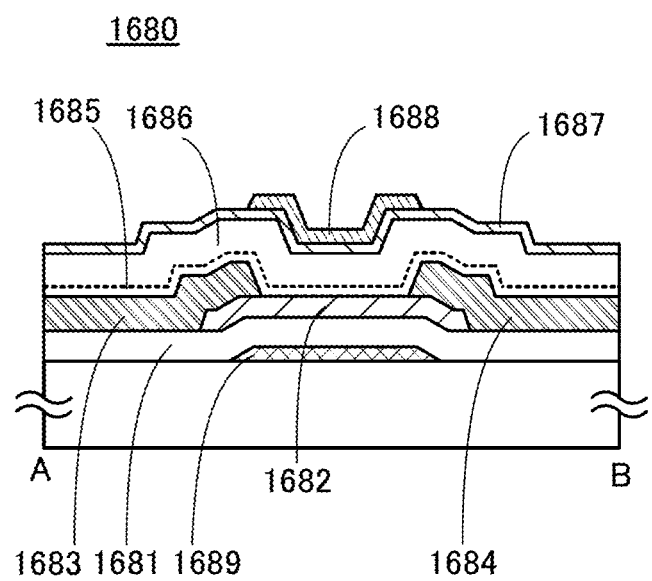

FIGS. 19A and 19B are a top view and a cross-sectional views of a transistor 1680. FIG. 19A is a top view, and FIG. 19B is a cross-sectional view taken along dashed-dotted line A-B in FIG. 19A. Note that for simplification of the drawing, some components are increased or reduced in size, or omitted in FIGS. 19A and 19B. Note that the dashed-dotted line A-B is sometimes referred to as a channel length direction.

The transistor 1680 shown in FIG. 19B includes a conductive film 1689 serving as a first gate, a conductive film 1688 serving as a second gate, a semiconductor 1682, a conductive film 1683 and a conductive film 1684 serving as a source and a drain, an insulating film 1681, an insulating film 1685, an insulating film 1686, and an insulating film 1687.

The conductive film 1689 is on an insulating surface. The conductive film 1689 overlaps with the semiconductor 1682 with the insulating film 1681 provided therebetween. The conductive film 1688 overlaps with the semiconductor 1682 with the insulating films 1685, 1686, and 1687 provided therebetween. The conductive films 1683 and 1684 are connected to the semiconductor 1682.

The description of the conductive films 1411 to 1414 in FIGS. 11A to 11C can be referred to for the details of the conductive films 1689 and 1688.

The conductive films 1689 and 1688 may be supplied with different potentials, or may be supplied with the same potential at the same time. The conductive film 1688 serving as a second gate electrode in the transistor 1680 leads to stabilization of threshold voltage. Note that the conductive film 1688 is not necessarily provided.

The description of the metal oxide 1432 in FIGS. 11A to 11C can be referred to for the details of the semiconductor 1682. The semiconductor 1682 may be a single layer or a stack including a plurality of semiconductor layers.

The description of the conductive films 1421 to 1424 in FIGS. 11A to 11C can be referred to for the details of the conductive films 1683 and 1684.

The description of the insulating film 1406 in FIGS. 11A to 11C can be referred to for the details of the insulating film 1681.

The insulating films 1685 to 1687 are sequentially stacked over the semiconductor 1682 and the conductive films 1683 and 1684 in FIG. 19B; however, an insulating film provided over the semiconductor 1682 and the conductive films 1683 and 1684 may be a single layer or a stack including a plurality of insulating films.

In the case of using an oxide semiconductor as the semiconductor 1682, the insulating film 1686 preferably contains oxygen at a proportion higher than or equal to that in the stoichiometric composition and has a function of supplying part of oxygen to the semiconductor 1682 by heating. Note that in the case where the provision of the insulating film 1686 directly on the semiconductor 1682 causes damage to the semiconductor 1682 at the time of formation of the insulating film 1686, the insulating film 1685 is preferably provided between the semiconductor 1682 and the insulating film 1686, as shown in FIG. 19B. The insulating film 1685 preferably allows oxygen to pass therethrough, and causes little damage to the semiconductor 1682 when the insulating film 1685 is formed compared with the case of the insulating film 1686. If the insulating film 1686 can be formed directly on the semiconductor 1682 while damage to the semiconductor 1682 is reduced, the insulating film 1685 is not necessarily provided.

For the insulating films 1685 and 1686, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 1687 preferably has an effect of blocking diffusion of oxygen, hydrogen, and water. Alternatively, the insulating film 1687 preferably has an effect of blocking diffusion of hydrogen and water.

As an insulating film has higher density and becomes denser or has a fewer dangling bonds and becomes more chemically stable, the insulating film has a more excellent blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 1687 has an effect of blocking diffusion of water, hydrogen, and the like, impurities such as water and hydrogen that exist in a resin in a panel or exist outside the panel can be prevented from entering the semiconductor 1682. In the case where an oxide semiconductor is used as the semiconductor 1682, part of water or hydrogen that enters the oxide semiconductor serves as an electron donor (donor). Thus, the use of the insulating film 1687 having the blocking effect can prevent a shift in the threshold voltage of the transistor 1680 due to generation of donors.

In addition, in the case where an oxide semiconductor is used as the semiconductor 1682, the insulating film 1687 has an effect of blocking diffusion of oxygen, so that diffusion of oxygen from the oxide semiconductor to the outside can be prevented. Accordingly, oxygen vacancies in the oxide semiconductor that serve as donors are reduced, so that a shift in the threshold voltage of the transistor 1680 due to generation of donors can be prevented.

Note that this embodiment can be combined with any of the other embodiments in this specification as appropriate.

Embodiment 5

In this embodiment, structure examples of a device that can be applied to the semiconductor devices 100, 110, 120, 130, and 140 (hereinafter, collectively referred to as a semiconductor device SCD) shown in the above embodiments will be described with reference to FIGS. 20A to 23B.

<Cross-Sectional View 1>

Figure 20A:
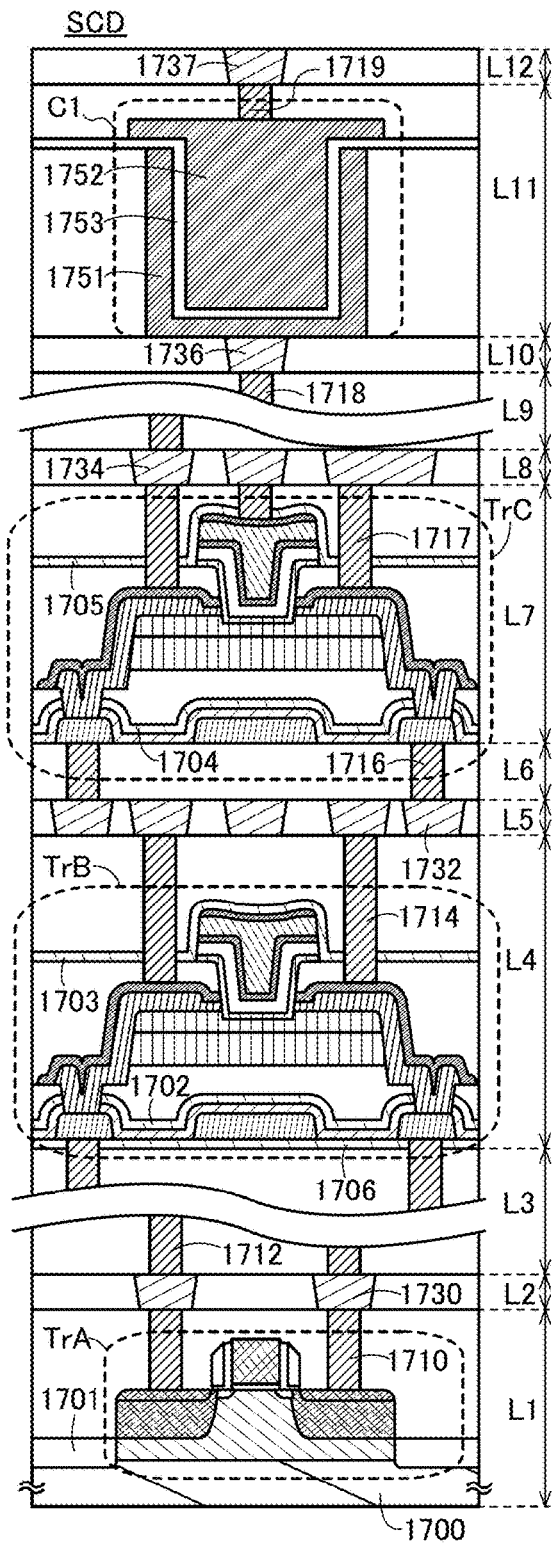
FIGS. 20A and 20B are cross-sectional views showing a structure example of a memory cell.
Figure 20B:
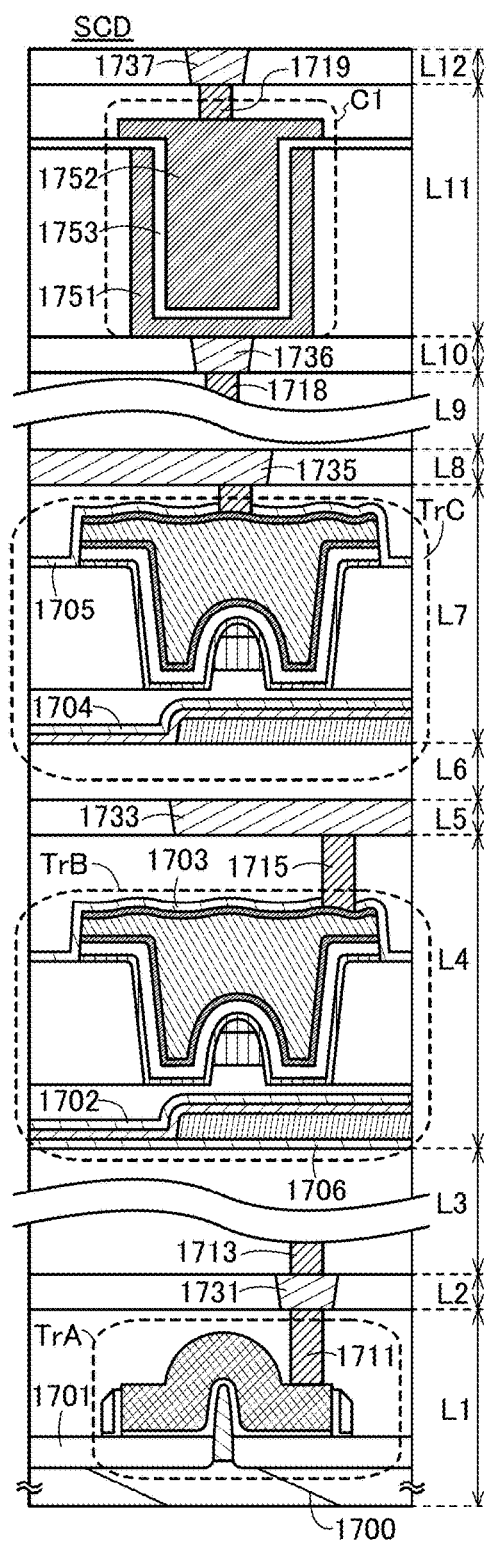

FIGS. 20A and 20B are cross-sectional views of part of the semiconductor device SCD. FIG. 20A shows a cross section in a channel length direction of transistors included in the memory cell array MCA and the read and write-back circuit RWC of the semiconductor device SCD, and FIG. 20B shows a cross section in a channel width direction of the transistors included in the memory cell array MCA and the read and write-back circuit RWC of the semiconductor device SCD.

The semiconductor device SCD shown in FIGS. 20A and 20B includes layers L1 to L12 in order from the bottom.

The layer L1 includes a substrate 1700, a transistor TrA formed using the substrate 1700, an element isolation layer 1701, and a plurality of conductors such as a conductor 1710 and a conductor 1711.

The layer L2 includes a plurality of wirings such as a wiring 1730 and a wiring 1731.

The layer L3 includes a plurality of conductors such as a conductor 1712 and a conductor 1713 and a plurality of wirings (not shown).

The layer L4 includes an insulator 1706, a transistor TrB, an insulator 1702, an insulator 1703, and a plurality of conductors such as a conductor 1714 and a conductor 1715.

The layer L5 includes a plurality of wirings such as a wiring 1732 and a wiring 1733.

The layer L6 includes a plurality of conductors such as a conductor 1716.

The layer L7 includes a transistor TrC, an insulator 1704, an insulator 1705, and a plurality of conductors such as a conductor 1717.

The layer L8 includes a plurality of wirings such as a wiring 1734 and a wiring 1735.

The layer L9 includes a plurality of conductors such as a conductor 1718 and a plurality of wirings (not shown).

The layer L10 includes a plurality of wirings such as a wiring 1736.

The layer L11 includes a capacitor C1 and a plurality of conductors such as a conductor 1719. The capacitor C1 includes a first electrode 1751, a second electrode 1752, and an insulator 1753.

The layer L12 includes a plurality of wirings such as a wiring 1737.

The OS transistor shown in Embodiment 4 is preferably used as the transistors TrB and TrC. In FIGS. 20A and 20B, the transistor 1400c shown in FIGS. 15A and 15B is used as the transistors TrB and TrC.

The transistor TrA is preferably formed using a semiconductor material different from that for the transistors TrB and TrC. In FIGS. 20A and 20B, a Si transistor is used as the transistor TrA.

That is, the read and write-back circuit RWC is preferably the layers L1 and L2. The memory cell array MCA is preferably the layers L4 to L11. The capacitors CR[1,1] to CR[p,n] in the read and write-back circuit RWC are not necessarily provided in the layers L1 and L2, but may be provided in the layer L11. In the case where OS transistors are used in the switch circuits SWC[1,1] to SWC[p,n] in the read and write-back circuit RWC, they may be provided in the layers L4 to L7.

As the substrate 1700, a single crystal semiconductor substrate or a polycrystalline semiconductor substrate of silicon or silicon carbide, a compound semiconductor substrate of silicon germanium, an SOI substrate, or the like can be used.

For example, a glass substrate, a quartz substrate, a plastic substrate, a metal substrate, a flexible substrate, an attachment film, paper including a fibrous material, or a base film may be used as the substrate 1700. Alternatively, a semiconductor element may be formed using one substrate, and then transferred to another substrate. In FIGS. 20A and 20B, as an example, a single crystal silicon wafer is used as the substrate 1700.

Figure 22A:
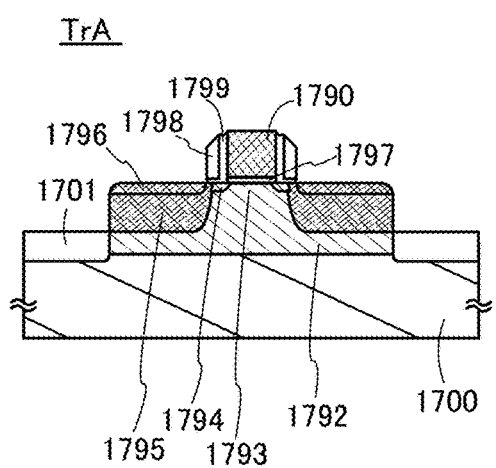
FIGS. 22A and 22B are cross-sectional views showing a structure example of a transistor.
Figure 22B:
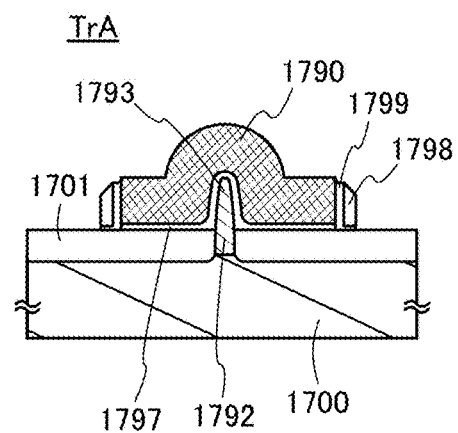

The transistor TrA is described in detail with reference to FIGS. 22A and 22B. FIG. 22A is a cross-sectional view of the transistor TrA in the channel length direction and FIG. 22B is a cross-sectional view of the transistor TrA in the channel width direction. The transistor TrA includes a channel formation region 1793 formed in a well 1792, low concentration impurity regions 1794 and high concentration impurity regions 1795 (also collectively referred to as an impurity region simply), conductive regions 1796 provided in contact with the impurity region, a gate insulating film 1797 provided over the channel formation region 1793, a gate electrode 1790 provided over the gate insulating film 1797, and sidewall insulating layers 1798 and 1799 provided on side surfaces of the gate electrode 1790. Note that the conductive regions 1796 can be formed using metal silicide or the like.

In the transistor TrA in FIG. 22B, the channel formation region 1793 has a projecting portion, and the gate insulating film 1797 and the gate electrode 1790 are provided along side and top surfaces of the channel formation region 1793. The transistor with such a shape is referred to as a FIN-type transistor. Although the projecting portion is formed by processing part of the semiconductor substrate in this embodiment, a semiconductor layer with a projecting portion may be formed by processing an SOI substrate.

Figure 23A:
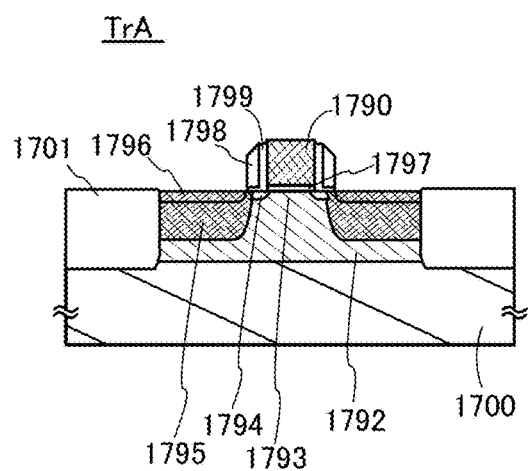
FIGS. 23A and 23B are cross-sectional views showing a structure example of a transistor.
Figure 23B:
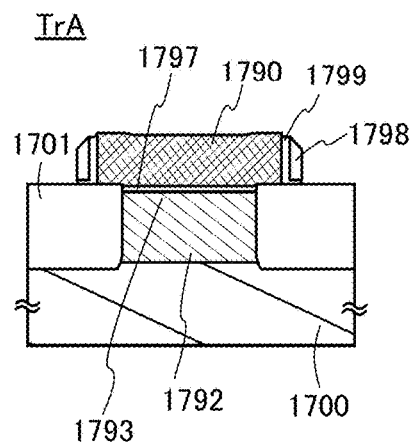

Note that the transistor TrA is not limited to the FIN-type transistor, and may be a planar-type transistor shown in FIGS. 23A and 23B. FIG. 23A is a cross-sectional view of the transistor TrA in the channel length direction and FIG. 23B is a cross-sectional view of the transistor TrA in the channel width direction. The reference numerals in FIGS. 23A and 23B are the same as those shown in FIGS. 22A and 22B.

In FIGS. 20A and 20B, the insulators 1702 to 1706 preferably have a blocking effect against hydrogen, water, and the like. Water, hydrogen, and the like are factors that generate carriers in an oxide semiconductor; thus, providing such a blocking layer against hydrogen, water, and the like can improve the reliability of the transistors TrB and TrC. Examples of the insulator having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

The wirings 1730 to 1737 and the conductors 1710 to 1719 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. It is also preferable to use a low-resistance conductive material such as aluminum or copper. The use of a Cu—Mn alloy is further preferable, in which case manganese oxide formed at the interface with an insulator containing oxygen has a function of preventing Cu diffusion.

In FIGS. 20A and 20B, regions without reference numerals and hatch patterns represent regions formed of an insulator. As the insulator, an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in the regions, an organic resin such as a polyimide resin, a polyamide resin, an acrylic resin, a siloxane resin, an epoxy resin, or a phenol resin can be used. Note that in this specification, an oxynitride refers to a compound that contains more oxygen than nitrogen, and a nitride oxide refers to a compound that contains more nitrogen than oxygen.

In the case where OS transistors are used as the transistors Tr[1,1] to Tr[m,n] shown in Embodiment 1, the transistors Tr[1,1] to Tr[m,n] are preferably formed in the layer L4 or L7.

In the case where Si transistors are used as the switches SW[1] to SW[n], the switches SWa[1,1] to SWa[p,n], and the switches SWb[1,1] to SWb[p,n] shown in Embodiment 1, the transistors are preferably formed in the layer L1.

In the case where OS transistors are used as the switches SW[1] to SW[n], the switches SWa[1,1] to SWa[p,n], and the switches SWb[1,1] to SWb[p,n] shown in Embodiment 1, the transistors are preferably formed in the layer L4 or L7.

The capacitors CS[1,1] to CS[m,n] shown in Embodiment 1 are preferably formed in the layer L11.

The capacitors CR[1,1] to CR[p,n] shown in Embodiment 1 are preferably formed in the layer L11.

The capacitors CSH[1] to CSH[n] shown in Embodiment 1 are preferably formed in the layer L11.

In the case where a driver circuit around the semiconductor device SCD is formed using an OS transistor, the OS transistor may be formed in the layer L4 or L7.

In the case where a driver circuit around the semiconductor device SCD is formed using a Si transistor, the Si transistor may be formed in the layer L1.

With the structure shown in FIGS. 20A and 20B, the area occupied by the semiconductor device SCD can be reduced, leading to higher integration of the memory cell.

Note that in the case where the semiconductor device SCD shown in Embodiment 1 has the structure of FIGS. 20A and 20B, the numbers of the transistors (TrA, TrB, and TrC) and the capacitors (C1) are sometimes different from those shown in FIGS. 20A and 20B. In that case, the structure of FIGS. 20A and 20B can be changed as appropriate; for example, the numbers of the layers L4, L7, and L11 are increased or decreased, or an element is additionally provided in a layer.

<Cross-Sectional View 2>

All the OS transistors in the semiconductor device SCD may be formed in the same layer. An example of such a case is shown in FIGS. 21A and 21B. Similarly to FIGS. 20A and 20B, FIG. 21A shows a cross section in a channel length direction of transistors included in the memory cell array MCA and the read and write-back circuit RWC of the semiconductor device SCD, and FIG. 21B shows a cross section in a channel width direction of the transistors included in the memory cell array MCA and the read and write-back circuit RWC of the semiconductor device SCD.

The cross-sectional views of FIGS. 21A and 21B are different from those of FIGS. 20A and 20B in that the layers L6 to L8 are omitted and the layer L9 is formed on the layer L5. For the other details in FIGS. 21A and 21B, the description of FIGS. 20A and 20B is referred to.

In the case where OS transistors are used as the transistors Tr[1,1] to Tr[m,n] shown in Embodiment 1, the transistors Tr[1,1] to Tr[m,n] are preferably formed in the layer L4.

In the case where Si transistors are used as the switches SW[1] to SW[n], the switches SWa[1,1] to SWa[p,n], and the switches SWb[1,1] to SWb[p,n] shown in Embodiment 1, the transistors are preferably formed in the layer L1.

In the case where OS transistors are used as the switches SW[1] to SW[n], the switches SWa[1,1] to SWa[p,n], and the switches SWb[1,1] to SWb[p,n] shown in Embodiment 1, the transistors are preferably formed in the layer L4.

The capacitors CS[1,1] to CS[m,n] shown in Embodiment 1 are preferably formed in the layer L11.

The capacitors CR[1,1] to CR[p,n] shown in Embodiment 1 are preferably formed in the layer L11.

The capacitors CSH[1] to CSH[n] shown in Embodiment 1 are preferably formed in the layer L11.

In the case where a driver circuit around the semiconductor device SCD is formed using an OS transistor, the OS transistor may be formed in the layer L4.

In the case where a driver circuit around the semiconductor device SCD is formed using a Si transistor, the Si transistor may be formed in the layer L1.

With the structure shown in FIGS. 21A and 21B, the production process of the semiconductor device SCD can be simplified.

Note that in the case where the semiconductor device SCD shown in Embodiment 1 has the structure of FIGS. 21A and 21B, the numbers of the transistors (TrA, TrB, and TrC) and the capacitors (C1) are sometimes different from those shown in FIGS. 21A and 21B. In that case, the structure of FIGS. 21A and 21B may be changed as appropriate; for example, the numbers of the layers L4 and L11 are increased or decreased, and an element is additionally provided in a layer.

Note that this embodiment can be combined with any of the other embodiments in this specification as appropriate.

Embodiment 6

Described in this embodiment are structures of an oxide semiconductor film capable of being used for the OS transistors described in the above embodiments.

<Structure of Oxide Semiconductor>

Structures of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 24A:
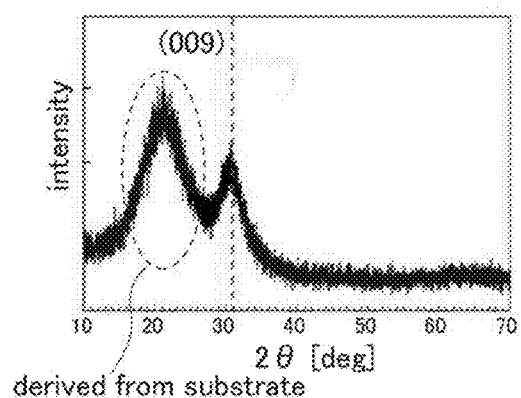
FIGS. 24A to 24E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 24A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 24B:
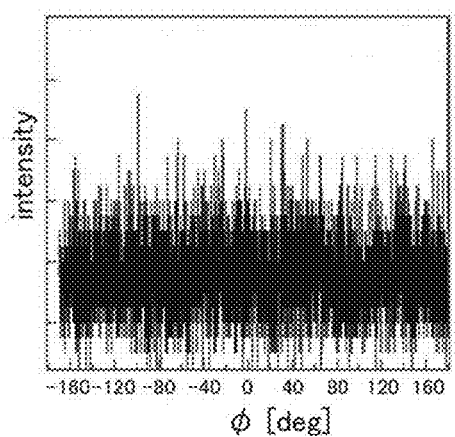
Figure 24C:
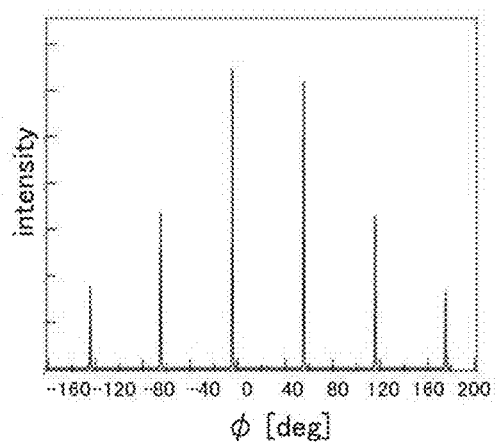

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 24B, a peak is not clearly observed. In contrast, in the case where single crystal InGaZnO$_4$ is subjected to φ scan with 2θ fixed at around 56°, as shown in FIG. 24C, six peaks which are derived from crystal planes equivalent to the (110) plane are observed. Accordingly, the structural analysis using XRD shows that the directions of a-axes and b-axes are irregularly oriented in the CAAC-OS.

Figure 24D:
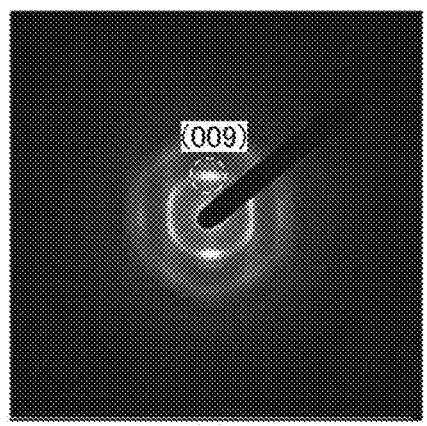
Figure 24E:
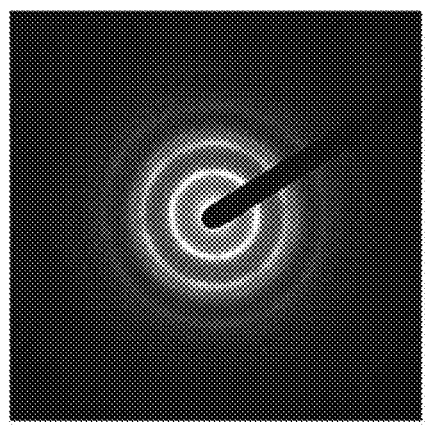

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 24D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 24E shows a diffraction pattern obtained in such a manner that an electron beam with a probe diameter of 300 nm is incident on the same sample in a direction perpendicular to the sample surface. As shown in FIG. 24E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 24E is considered to be derived from the (010) plane, the (100) plane, and the like of the InGaZnO$_4$ crystal. The second ring in FIG. 24E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 25A:
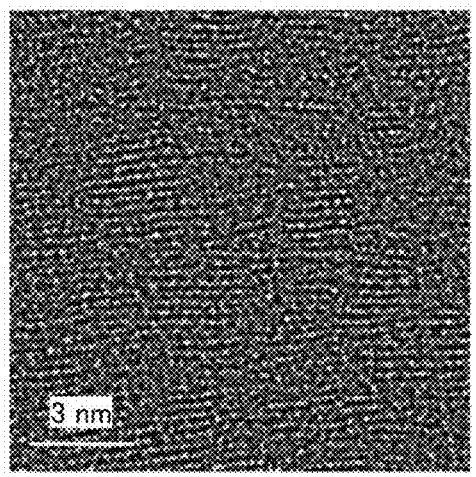
FIGS. 25A to 25E show a cross-sectional TEM image and plan-view TEM images of a CAAC-OS and images obtained through analysis thereof.

FIG. 25A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 25A shows pellets in which metal atoms are arranged in a layered manner. FIG. 25A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 25B:
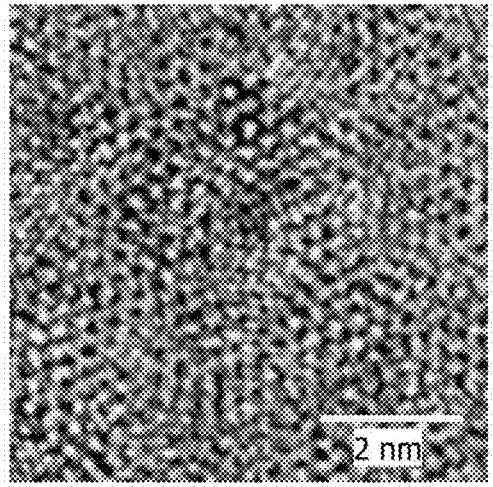
Figure 25C:
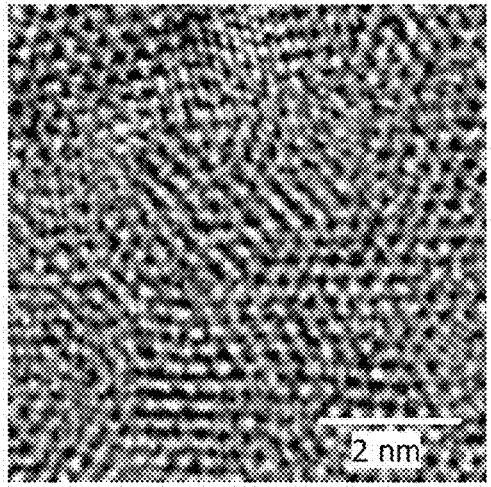
Figure 25D:
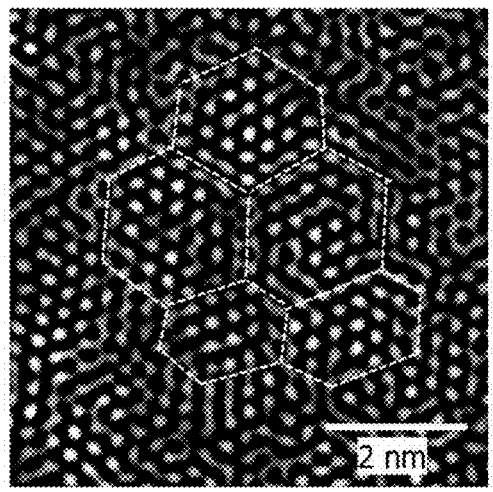
Figure 25E:
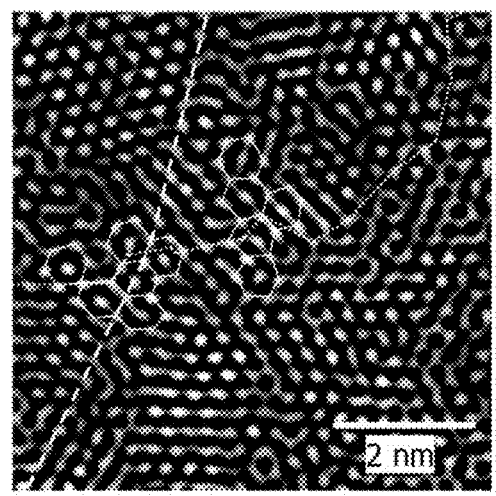

FIGS. 25B and 25C show Cs-corrected high-resolution TEM images of a plane of the CAAC-OS observed from a direction substantially perpendicular to the sample surface. FIGS. 25D and 25E are images obtained through image processing of FIGS. 25B and 25C. The method of image processing is as follows. The image in FIG. 25B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 25D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 25E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC-OS can tolerate distortion owing to a low density of interatomic distance in an a-b plane direction, an interatomic distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 26A:
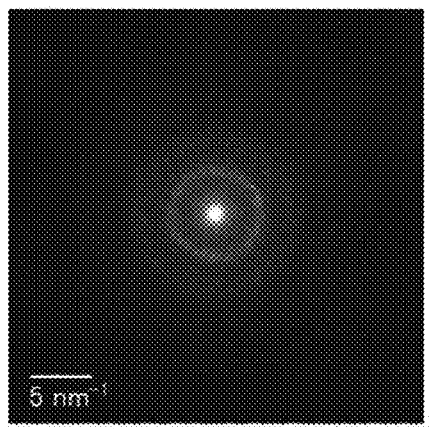
FIGS. 26A to 26D show electron diffraction patterns and a cross-sectional TEM image of an nc-OS.
Figure 26B:
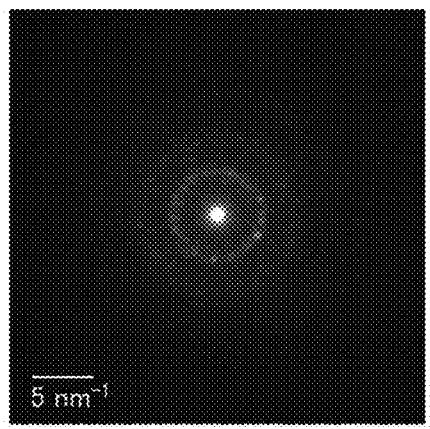

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 26A is observed. FIG. 26B shows a diffraction pattern obtained when an electron beam with a probe diameter of 1 nm is incident on the same sample. As shown in FIG. 26B, a plurality of spots are observed in a ring-like region. In other words, ordering in an nc-OS is not observed with an electron beam with a probe diameter of 50 nm but is observed with an electron beam with a probe diameter of 1 nm.

Figure 26C:
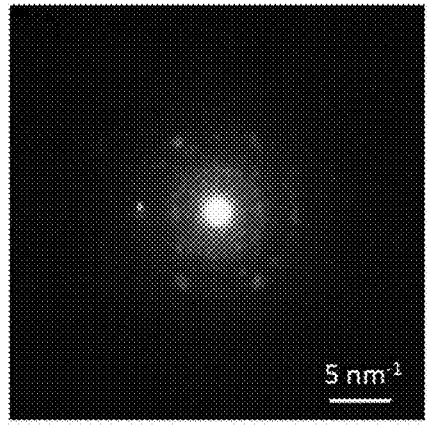

Furthermore, an electron diffraction pattern in which spots are arranged in an approximately hexagonal shape is observed in some cases as shown in FIG. 26C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 26D:
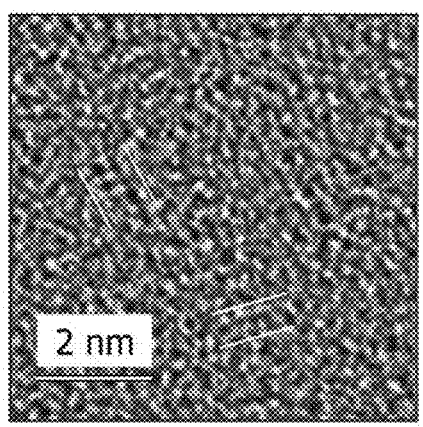

FIG. 26D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 26D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

Figure 27A:
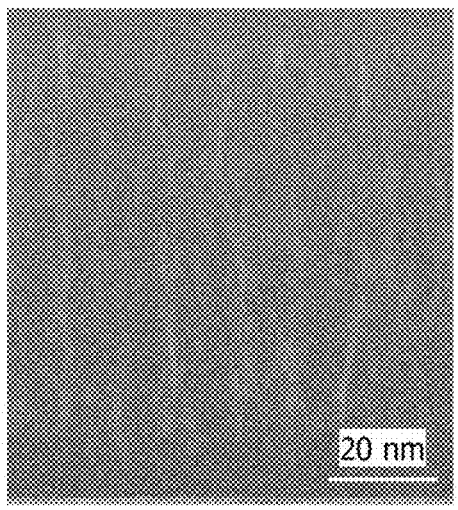
FIGS. 27A and 27B show cross-sectional TEM images of an a-like OS.
Figure 27B:
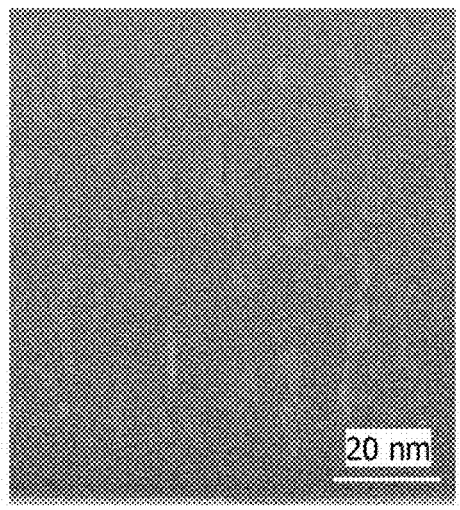

FIGS. 27A and 27B are high-resolution cross-sectional TEM images of an a-like OS. FIG. 27A is the high-resolution cross-sectional TEM image of the a-like OS at the start of the electron irradiation. FIG. 27B is the high-resolution cross-sectional TEM image of a-like OS after the electron ($e^-$) irradiation at $4.3 \times 10^8$ $e^-/nm^2$. FIGS. 27A and 27B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 28:
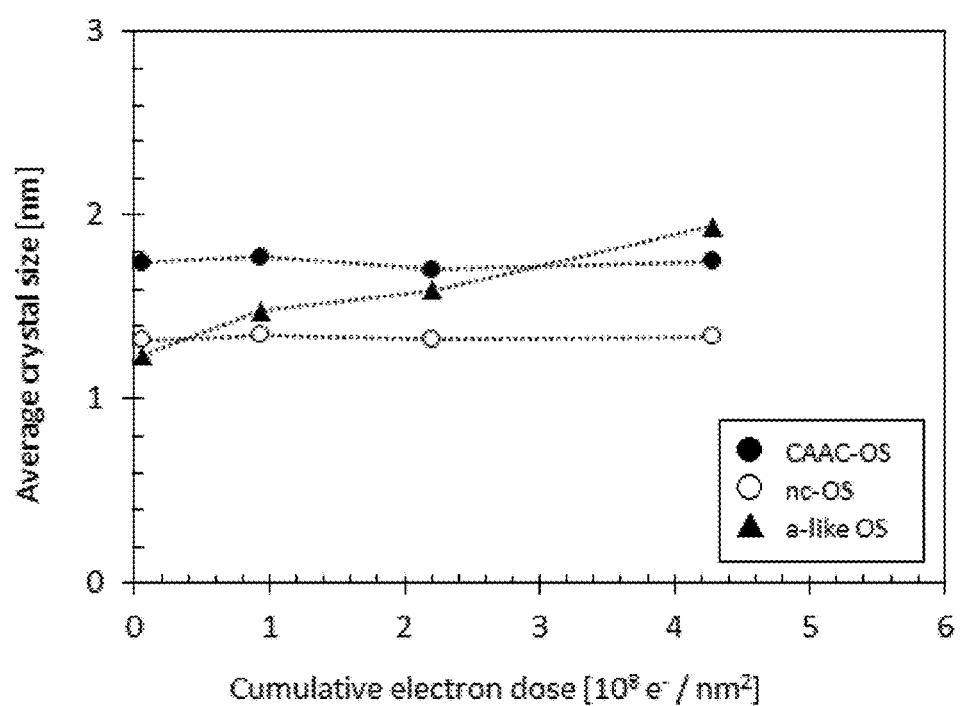
FIG. 28 shows a change in crystal part of an In—Ga—Zn oxide induced by electron irradiation.

FIG. 28 shows change in the average size of crystal parts (at 22 points to 30 points) in each sample. Note that the crystal part size corresponds to the length of a lattice fringe. FIG. 28 indicates that the crystal part size in the a-like OS increases with an increase in the cumulative electron dose in obtaining TEM images, for example. As shown in FIG. 28, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 28, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Note that this embodiment can be combined with any of the other embodiments in this specification as appropriate.

<Carrier Density of Oxide Semiconductor>

Next, the carrier density of an oxide semiconductor will be described below.

Examples of a factor affecting the carrier density of an oxide semiconductor include oxygen vacancy ($V_O$) and impurities in the oxide semiconductor.

When the amount of oxygen vacancy in the oxide semiconductor increases, hydrogen is bonded to the oxygen vacancy (this state is also referred to as $V_OH$), increasing the density of defect states. The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the concentration of impurity in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified oxide semiconductor is lower than $8\times10^{15}$ cm$^{-3}$, preferably lower than $1\times10^{11}$ cm$^{-3}$, and further preferably lower than $1\times10^{10}$ cm$^{-3}$ and higher than or equal to $1\times10^{-9}$ cm$^{-3}$.

In contrast, the carrier density of the oxide semiconductor is preferably increased in order to increase the on-state current of the transistor or increase the field-effect mobility of the transistor. In order to increase the carrier density of the oxide semiconductor, the concentration of impurity or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where the on/off ratio is obtained in the Id-Vg characteristics of the transistor can be regarded as a substantially intrinsic semiconductor. Further, an oxide semiconductor that has a high electron affinity and thus has a narrow bandgap so as to increase the density of thermally excited electrons (carriers) can be regarded as a substantially intrinsic semiconductor. Note that a transistor using an oxide semiconductor with higher electron affinity has lower threshold voltage.

The aforementioned oxide semiconductor with an increased carrier density has somewhat n-type conductivity; thus, it can be referred to as a "Slightly-n" oxide semiconductor.

The carrier density of a substantially intrinsic oxide semiconductor is preferably higher than or equal to $1\times10^{5}$ cm$^{-3}$ and lower than $1\times10^{18}$ cm$^{-3}$, further preferably higher than or equal to $1\times10^{7}$ cm$^{-3}$ and lower than or equal to $1\times10^{17}$ cm$^{-3}$, still further preferably higher than or equal to $1\times10^{9}$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

Embodiment 7

In this embodiment, application examples of the semiconductor device described in the above embodiments to an electronic component and to an electronic device including the electronic component will be described with reference to FIGS. 29A to 30F.

<Electronic Component>

Figure 29A:
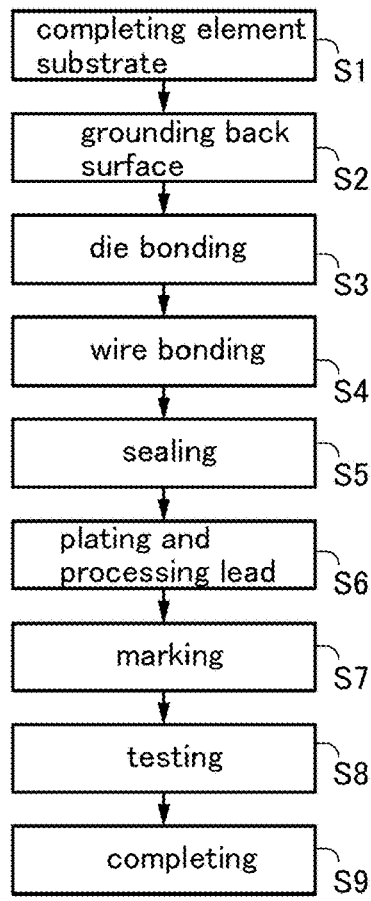
FIGS. 29A and 29B are a flowchart and a perspective view showing an example of a method for manufacturing a semiconductor device.

FIG. 29A shows an example in which the semiconductor device described in the above embodiments is used to manufacture an electronic component. Note that the electronic component is also referred to as a semiconductor package or an IC package. This electronic component has various standards and names depending on the direction and the shape of terminals. Therefore, an example of the electronic component will be described in this embodiment.

A semiconductor device including the transistors shown in Embodiment 1 is completed through an assembly process (post-process) of integrating detachable components on a printed board.

The post-process can be completed through the steps in FIG. 29A. Specifically, after an element substrate obtained in the preceding process is completed (Step S1), a back surface of the substrate is ground (Step S2). The substrate is thinned in this step to reduce substrate warpage or the like caused in the preceding process and to reduce the size of the component.

After the back surface of the substrate is ground, a dicing step is performed to divide the substrate into a plurality of chips. Then, the divided chips are separately picked up, placed on a lead frame, and bonded thereto in a die bonding step (Step S3). In the die bonding step, the chip is bonded to the lead frame by an appropriate method depending on products, for example, bonding with a resin or a tape. Note that in the die bonding step, a chip may be placed on and bonded to an interposer.

Note that in this embodiment, when an element is formed on a surface of a substrate, the other surface is referred to as a back surface (a surface on which the element is not formed).

Next, wire bonding for electrically connecting a lead of the lead frame and an electrode on the chip through a metal wire is performed (Step S4). As the metal wire, a silver wire or a gold wire can be used. Ball bonding or wedge bonding can be used as the wire bonding.

The wire-bonded chip is subjected to a molding step of sealing the chip with an epoxy resin or the like (Step S5). Through the molding step, the inside of the electronic component is filled with a resin, whereby damage to a mounted circuit portion and wire caused by external mechanical force as well as deterioration of characteristics due to moisture or dust can be reduced.

Subsequently, the lead of the lead frame is plated. Then, the lead is cut and processed (Step S6). This plating process prevents rust of the lead and facilitates soldering at the time of mounting the chip on a printed board in a later step.

Next, printing (marking) is performed on a surface of the package (Step S7). After a final testing step (Step S8), the electronic component is completed (Step S9).

The above-described electronic component includes the semiconductor device described in the above embodiments. Thus, a highly reliable electronic component can be obtained.

Figure 29B:
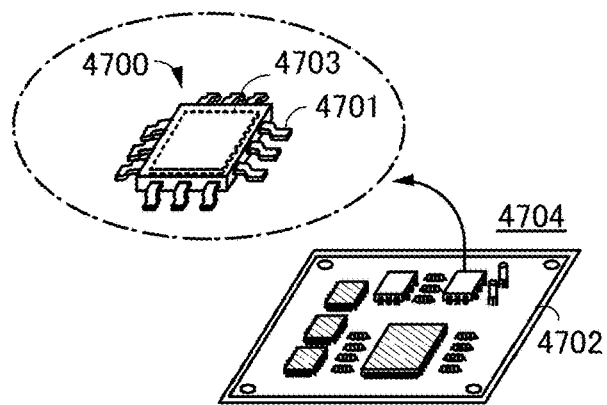

FIG. 29B is a perspective schematic diagram illustrating a quad flat package (QFP) as an example of the completed electronic component. An electronic component 4700 in FIG. 29B includes a lead 4701 and a circuit portion 4703. The electronic component 4700 in FIG. 29B is mounted on a printed board 4702, for example. A plurality of electronic components 4700 which are combined and electrically connected to each other over the printed board 4702 can be mounted on an electronic device. A completed circuit board 4704 is provided in an electronic device or the like.

<Electronic Device>

Next, electronic devices including the aforementioned electronic component will be described.

The semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head-mounted displays), navigation systems, audio reproducing devices (e.g., car audio systems and digital audio players), copiers, facsimiles, printers, multifunction printers, automated teller machines (ATM), vending machines, and medical devices. FIGS. 30A to 30F illustrate specific examples of these electronic devices.

Figure 30A:
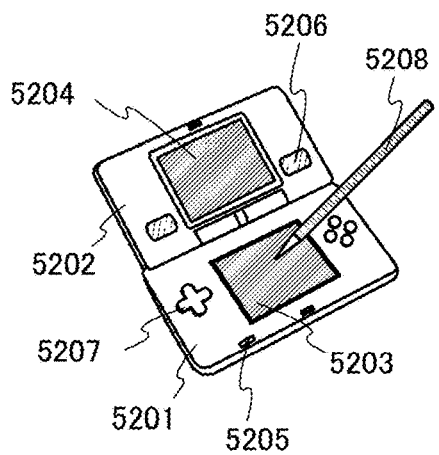
FIGS. 30A to 30F show electronic devices.

FIG. 30A illustrates a portable game machine which includes a housing 5201, a housing 5202, a display portion 5203, a display portion 5204, a microphone 5205, a speaker 5206, an operation key 5207, a stylus 5208, and the like. The semiconductor device of one embodiment of the present invention can be used for a variety of integrated circuits included in portable game machines. Although the portable game machine in FIG. 30A has the two display portions 5203 and 5204, the number of display portions included in a portable game machine is not limited to two.

Figure 30B:
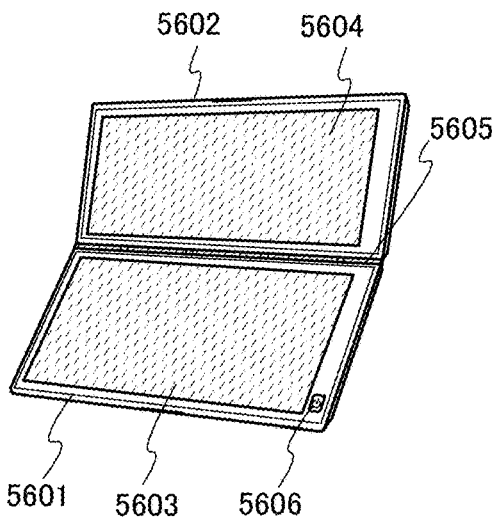

FIG. 30B illustrates a portable information terminal which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as the first display portion 5603 and/or the second display portion 5604. Note that the position input function can be added by providing a touch panel in a display device. Alternatively, the position input function can be added by providing a photoelectric conversion element called a photosensor in a pixel portion of a display device.

Figure 30C:
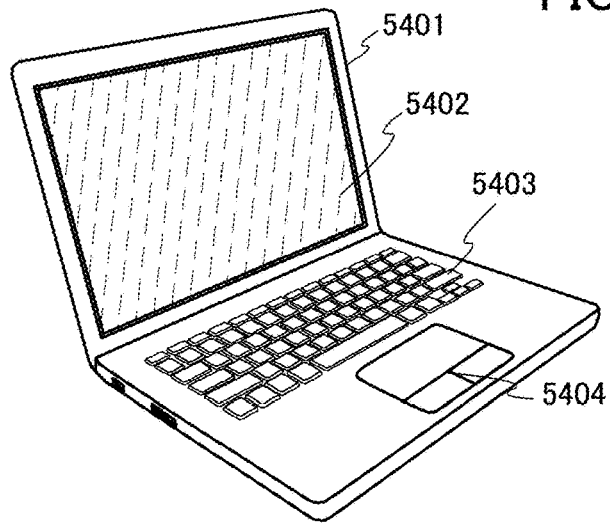

FIG. 30C illustrates a laptop personal computer which includes a housing 5401, a display portion 5402, a keyboard 5403, a pointing device 5404, and the like. The semiconductor device of one embodiment of the present invention can be used for a variety of integrated circuits included in laptop personal computers.

Figure 30D:
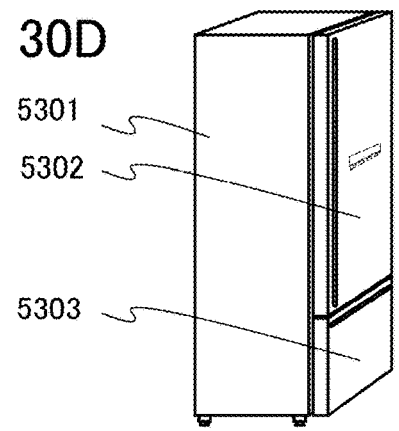

FIG. 30D illustrates an electric refrigerator-freezer which includes a housing 5301, a refrigerator door 5302, a freezer door 5303, and the like. The semiconductor device of one embodiment of the present invention can be used for a variety of integrated circuits included in electric refrigerator-freezers.

Figure 30E:
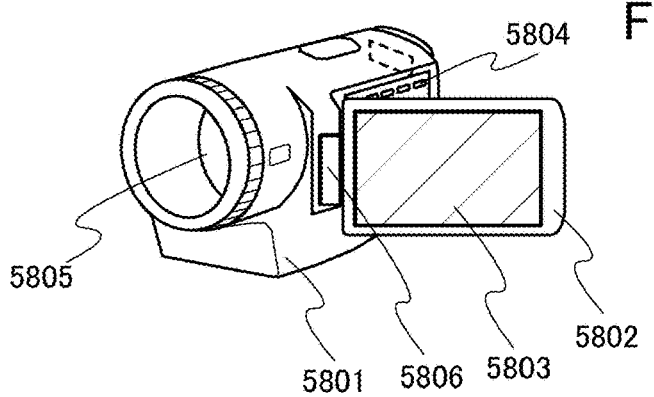

FIG. 30E illustrates a video camera which includes a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 30F:
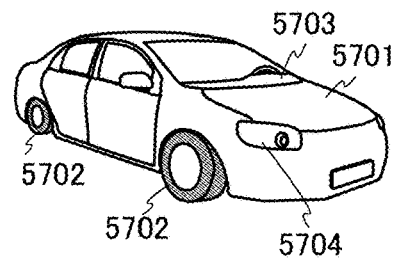
Figure 31A:
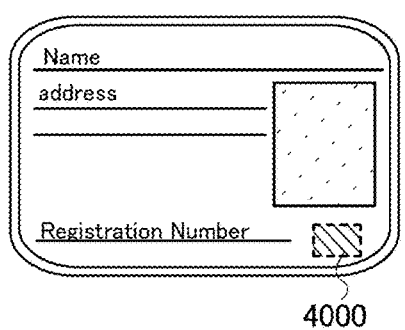
FIGS. 31A to 31F are perspective views showing application examples of an RF tag.
Figure 31B:
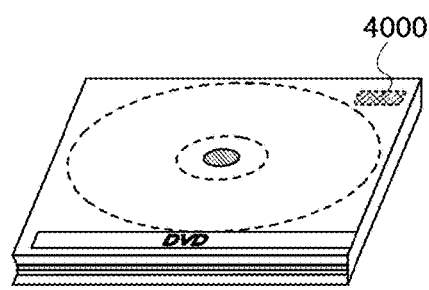
Figure 31C:
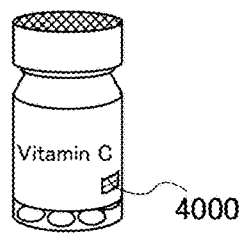
Figure 31D:
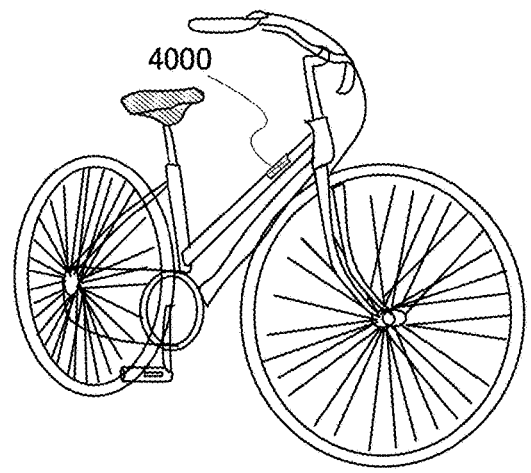
Figure 31E:
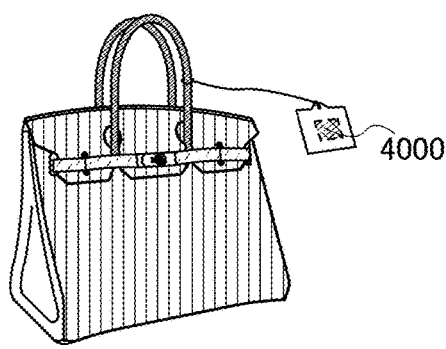
Figure 31F:
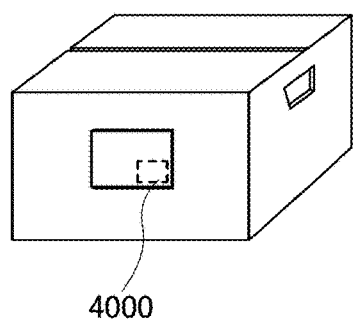

FIG. 30F illustrates a car which includes a car body 5701, wheels 5702, a dashboard 5703, lights 5704, and the like. The semiconductor device of one embodiment of the present invention can be used for a variety of integrated circuits included in cars.

Next, an application example of a display device that can include the semiconductor device or memory device of one embodiment of the present invention is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be used, for example.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescent (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on a current), a plasma display panel (PDP), an electron emitter, a display element using a carbon nanotube, a liquid crystal element, electronic ink, an electrowetting element, an electrophoretic element, a display element using microelectromechanical systems (MEMS), (e.g., a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, or a piezoelectric ceramic display), quantum dots, and the like. Other than the above, a display medium whose contrast, luminance, reflectance, transmittance, or the like is changed by an electric or magnetic effect may be included. Examples of a display device using an EL element include an EL display. Examples of a display device using electron emitters include a field emission display (FED), and an SED-type flat panel display (SED: surface-conduction electron-emitter display). Examples of a display device using a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device using electronic ink, Electronic Liquid Powder (registered trademark), or electrophoretic elements include electronic paper. Examples of a display device using a quantum dot in each pixel include a quantum dot display. Note that the quantum dots may be provided in part of a backlight, instead of being used as a display element. With the use of the quantum dots, an image with high color purity can be displayed. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED chip, graphene or graphite may be provided under an electrode or a nitride semiconductor of the LED chip. Graphene or graphite may be a multilayer film in which a plurality of layers are stacked. The provision of graphene or graphite enables a nitride semiconductor such as an n-type GaN semiconductor layer including crystals to be easily formed thereover. Furthermore, a p-type GaN semiconductor layer including crystals, or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In a display device using MEMS, a dry agent may be provided in a space where a display element is sealed (or between an element substrate over which the display element is placed and a counter substrate opposed to the element substrate, for example). With the dry agent, malfunction or degradation of the MEMS or the like due to moisture can be prevented.

Note that this embodiment can be combined with any of the other embodiments in this specification as appropriate.

Embodiment 8

In this embodiment, application examples of an RF tag that can include the memory device of one embodiment of the present invention will be described with reference to FIGS. 31A to 31F. The RF tag is widely used and can be provided for, for example, products such as bills, coins, securities, bearer bonds, documents (e.g., driver's licenses or resident's cards, see FIG. 31A), recording media (e.g., DVD or video tapes, see FIG. 31B), packaging containers (e.g., wrapping paper or bottles, see FIG. 31C), vehicles (e.g., bicycles, see FIG. 31D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 31E and 31F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Note that this embodiment can be combined with any of the other embodiments in this specification as appropriate.
(Notes on the Description in this Specification and the Like)

The following are notes on the description of the above embodiments and structures in the embodiments.
<Notes on one Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, any of the structure examples can be combined as appropriate.

Note that what is described (or part thereof) in an embodiment can be applied to, combined with, or replaced with another content (or part thereof) in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.
<Notes on Ordinal Numbers>

In this specification and the like, ordinal numbers such as "first", "second", and "third" are used in order to avoid confusion among components. Thus, the terms do not limit the number or order of components. In the present specification and the like, a "first" component in one embodiment can be referred to as a "second" component in other embodiments or claims. Alternatively, in the present specification and the like, a "first" component in one embodiment can be omitted in other embodiments or claims.
<Notes on the Description for Drawings>

Embodiments are described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the description of the embodiments. Note that in the structures of the invention described above, the same portions or portions having similar functions are denoted by the same reference numerals in different drawings, and the description of such portions is not repeated.

In this specification and the like, the terms for explaining arrangement, such as "over" and "under", are used for convenience to describe the positional relation between components with reference to drawings. The positional relation between components is changed as appropriate in accordance with a direction in which each component is described. Therefore, the terms for explaining arrangement are not limited to those used in this specification and may be changed to other terms as appropriate depending on the situation.

The term "over" or "under" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is associated with a plurality of functions or a case in which a plurality of circuits are associated with one function. Therefore, the segmentation of blocks in a block diagram is not limited by any of the components described in the specification and can be differently determined as appropriate depending on situations.

In the drawings, the size, the layer thickness, or the region is exaggerated for description convenience in some cases; therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In drawings such as a top view (also referred to as a plan view or a layout view) and a perspective view, some of components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of "electrodes" or "wirings" formed in an integrated manner.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases, or can be replaced with a word not including the term "film" or "layer" depending on the case or circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", and "power source line" can be interchanged with each other depending on the case or circumstances. For example, the term "wiring" can be changed into the term such as "signal line" or "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases.

<Notes on Definitions of Terms>

The following are definitions of the terms mentioned in the above embodiments.

<<Semiconductor>>

In this specification, a "semiconductor" includes characteristics of an "insulator" in some cases when the conductivity is sufficiently low, for example. Furthermore, it is difficult to strictly distinguish a "semiconductor" and an "insulator" from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor" includes characteristics of a "conductor" in some cases when the conductivity is sufficiently high, for example. Furthermore, it is difficult to strictly distinguish a "semiconductor" and a "conductor" from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components; specific examples are hydrogen (also included in water), lithium, sodium, silicon, boron, phosphorus, carbon, and nitrogen. In the case of an oxide semiconductor, oxygen vacancy may be formed by entry of impurities such as hydrogen. Further, in the case where the semiconductor is a silicon layer, examples of an impurity which changes the characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor has a channel formation region between a drain (a drain terminal, a drain region, or a drain electrode) and a source (a source terminal, a source region, or a source electrode), and current can flow through the drain, the channel formation region, and the source. Note that in this specification and the like, a channel formation region refers to a region through which current mainly flows.

Furthermore, the functions of a source and a drain might be switched when transistors having different polarities are employed or a direction of current flow is changed in circuit operation, for example. Therefore, the terms "source" and "drain" can be switched in this specification and the like.

<<Switch>>

In this specification and the like, a switch is in a conductive state (on state) or in a non-conductive state (off state) to determine whether current flows therethrough or not. Alternatively, a switch has a function of selecting and changing a current path.

Examples of the switch include an electrical switch and a mechanical switch. That is, the switch is not limited to a certain element and any element can be used as long as it can control current.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically disconnected. In the case where a transistor operates just as a switch, the polarity (conductivity type) of the transistor is not particularly limited to a certain type.

An example of the mechanical switch is a switch formed using a microelectromechanical systems (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, the distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor.

Note that in one transistor, channel lengths in all regions do not necessarily have the same value. In other words, the channel length of one transistor is not fixed to one value in some cases. Therefore, in this specification, the channel length is any one of values, the maximum value, the minimum value, or the average value, in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

Note that in one transistor, channel widths in all regions do not necessarily have the same value. In other words, the channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, estimation of the effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where the field-effect mobility, a current value per channel width, and the like of a transistor are obtained by calculation, a surrounded channel width may be used for the calculation. In that case, a value different from the one obtained by calculation using an effective channel width is obtained in some cases.

<<Connection>>

In this specification and the like, when it is described that X and Y are connected, the case where X and Y are electrically connected, the case where X and Y are functionally connected, and the case where X and Y are directly connected are included therein. Accordingly, without being limited to a predetermined connection relation, for example, a connection relation other than that shown in a drawing or text is possible.

Here, X, Y, and the like each denote an object (e.g., a device, an element, a circuit, a wiring, an electrode, a terminal, a conductive film, or a layer).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit;

and/or a control circuit) can be connected between X and Y. Note that for example, even when another circuit is interposed between X and Y, X and Y are functionally connected if a signal output from X is transmitted to Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that X and Y are electrically connected, the description is the same as the case where it is explicitly only described that X and Y are connected.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

<<Trigonal and Rhombohedral>>

In this specification, trigonal and rhombohedral crystal systems are included in a hexagonal crystal system.

This application is based on Japanese Patent Application serial No. 2015-094637 filed with Japan Patent Office on May 7, 2015, the entire contents of which are hereby incorporated by reference.

What is claimed is:

1. A semiconductor device comprising:
   a memory cell;
   a circuit; and
   a first wiring,
   wherein the circuit comprises a buffer circuit, a first switch, first to p-th switch circuits, and first to p-th capacitors (p is an integer of 2 or more),
   wherein the first to p-th switch circuits each comprise a first terminal, a second terminal, a third terminal, a second switch, and a third switch,
   wherein in each of the first to p-th switch circuits, the first terminal is electrically connected to the second terminal through the second switch,
   wherein in each of the first to p-th switch circuits, the first terminal is electrically connected to the third terminal through the third switch,
   wherein a first electrode of the first capacitor is electrically connected to the memory cell,
   wherein an input terminal of the buffer circuit is electrically connected to the memory cell through the first switch,
   wherein a second electrode of an i-th capacitor is electrically connected to the first terminal of an i-th switch circuit and a first electrode of an (i+1)th capacitor (i is an integer of 1 to (p−1)),
   wherein a second electrode of the p-th capacitor is electrically connected to the first terminal of the p-th switch circuit,
   wherein an output terminal of the buffer circuit is electrically connected to the second terminal of each of the first to p-th switch circuits, and
   wherein the third terminal of each of the first to p-th switch circuits is electrically connected to the first wiring supplying a low-level potential.

2. The semiconductor device according to claim 1, wherein the memory cell is above the buffer circuit, the first switch, the second switch, and the third switch.

3. The semiconductor device according to claim 1, wherein the memory cell includes a first transistor, and wherein a channel formation region of the first transistor includes an oxide semiconductor.

4. The semiconductor device according to claim 1, wherein each of the first switch, the second switch, and the third switch includes a second transistor, and wherein a channel formation region of the second transistor includes silicon.

5. The semiconductor device according to claim 1,
wherein each of the first switch, the second switch, and the third switch includes a second transistor, and
wherein a channel formation region of the second transistor includes an oxide semiconductor.

6. The semiconductor device according to claim 1,
wherein the memory cell includes a first transistor,
wherein each of the first switch, the second switch, and the third switch includes a second transistor, and
wherein a channel formation region of each of the first transistor and the second transistor includes silicon.

7. The semiconductor device according to claim 1,
wherein the circuit comprises a (p+1)th capacitor, and
wherein the input terminal of the buffer circuit is electrically connected to a first electrode of the (p+1)th capacitor.

8. The semiconductor device according to claim 7,
wherein the (p+1)th capacitor is above the first switch, the second switch, and the third switch.

9. The semiconductor device according to claim 1,
wherein the memory cell includes a storage capacitor, and
wherein the first to p-th capacitors and the storage capacitor are above the first switch, the second switch, and the third switch.

10. An electronic component comprising:
the semiconductor device according to claim 1, and
a processor core.

11. A semiconductor device comprising:
a memory cell;
a circuit; and
a first wiring,
wherein the circuit comprises a buffer circuit, a first switch, a second switch, a third switch, a fourth switch, a fifth switch, a first capacitor, and a second capacitor,
wherein a first terminal is electrically connected to a second terminal through the second switch,
wherein the first terminal is electrically connected to a third terminal through the third switch,
wherein a fourth terminal is electrically connected to a fifth terminal through the fourth switch,
wherein the fourth terminal is electrically connected to a sixth terminal through the fifth switch,
wherein a first electrode of the first capacitor is electrically connected to the memory cell,
wherein an input terminal of the buffer circuit is electrically connected to the memory cell through the first switch,
wherein a second electrode of the first capacitor is electrically connected to the first terminal and a first electrode of the second capacitor,
wherein a second electrode of the second capacitor is electrically connected to the fourth terminal,
wherein an output terminal of the buffer circuit is electrically connected to the second terminal and the fifth terminal, and
wherein each of the third terminal and the sixth terminal is electrically connected to the first wiring supplying a low-level potential.

12. The semiconductor device according to claim 11,
wherein the memory cell is above the buffer circuit, the first switch, the second switch, and the third switch.

13. The semiconductor device according to claim 11,
wherein the memory cell includes a first transistor, and
wherein a channel formation region of the first transistor includes an oxide semiconductor.

14. The semiconductor device according to claim 11,
wherein each of the first switch, the second switch, the third switch, the fourth switch, and the fifth switch includes a second transistor, and
wherein a channel formation region of the second transistor includes silicon.

15. The semiconductor device according to claim 11,
wherein each of the first switch, the second switch, the third switch, the fourth switch, and the fifth switch includes a second transistor, and
wherein a channel formation region of the second transistor includes an oxide semiconductor.

16. The semiconductor device according to claim 11,
wherein the memory cell includes a first transistor,
wherein each of the first switch, the second switch, the third switch, the fourth switch, and the fifth switch includes a second transistor, and
wherein a channel formation region of each of the first transistor and the second transistor includes silicon.

17. The semiconductor device according to claim 11,
wherein the circuit comprises a third capacitor, and
wherein the input terminal of the buffer circuit is electrically connected to a first electrode of the third capacitor.

18. The semiconductor device according to claim 17,
wherein the third capacitor is above the first switch, the second switch, and the third switch.

19. The semiconductor device according to claim 11,
wherein the memory cell includes a storage capacitor, and
wherein the first capacitor, the second capacitor, and the storage capacitor are above the first switch, the second switch, and the third switch.

20. An electronic component comprising:
the semiconductor device according to claim 11, and
a processor core.

* * * * *